(12) United States Patent
Totzeck et al.

(10) Patent No.: US 7,321,465 B2
(45) Date of Patent: Jan. 22, 2008

(54) METHOD OF OPTIMIZING AN OBJECTIVE WITH FLUORIDE CRYSTAL LENSES, AND OBJECTIVE WITH FLUORIDE CRYSTAL LENSES

(75) Inventors: Michael Totzeck, Schwaebisch Gmuend (DE); Vladimir Kamenov, Essingen (DE); Toralf Gruner, Aalen-Hofen (DE)

(73) Assignee: Carl Zeiss SMT AG, Oberkochen (DE)

( * ) Notice: Subject to any disclaimer, the term of this patent is extended or adjusted under 35 U.S.C. 154(b) by 231 days.

(21) Appl. No.: 11/071,699

(22) Filed: Mar. 2, 2005

(65) Prior Publication Data

US 2005/0180023 A1    Aug. 18, 2005

Related U.S. Application Data

(63) Continuation of application No. PCT/EP2003/009167, filed on Aug. 19, 2003.

(30) Foreign Application Priority Data

Sep. 3, 2002 (DE) ............... 102 41 102
Sep. 16, 2002 (DE) ............... 102 43 080
Nov. 14, 2002 (DE) ............... 102 53 355
Jan. 31, 2003 (DE) ............... 103 04 116

(51) Int. Cl.
 *G02B 27/28* (2006.01)
(52) U.S. Cl. ............... 359/499; 359/900; 359/352
(58) Field of Classification Search ............... None
 See application file for complete search history.

(56) References Cited

U.S. PATENT DOCUMENTS 6,788,389 B2 * 9/2004 Fujishima et al. ............ 355/67

(Continued)

FOREIGN PATENT DOCUMENTS

DE    101 23 725    11/2002

(Continued)

OTHER PUBLICATIONS

Burnett et al., "Intrinsic birefringence in calcium fluoride and barium fluoride," Physical Review B—The American Physical Society, vol. 64, 241102(R), Nov. 29, 2001.

(Continued)

*Primary Examiner*—Arnel Lavarias
(74) *Attorney, Agent, or Firm*—Fish & Richardson P.C.

(57) ABSTRACT

A numerical optimizing method serves to reduce harmful effects caused by intrinsic birefringence in lenses of a fluoride crystal material of cubic crystal structure in an objective, particularly a projection objective for a microlithography system. Under the optimizing method, an optimizing function which takes at least one birefringence-related image aberration into account is minimized. The birefringence-related image aberration is determined from a calculation for a light ray passing through the fluoride crystal lenses. To the extent that the birefringence-related image aberration is a function of parameters of the light ray, it depends only on geometric parameters of the light ray. The numerical optimizing method is used to produce objectives in which an optical retardation as well as an asymmetry of the optical retardation are corrected. The lenses are arranged in homogeneous groups, where each homogeneous group is corrected for the optical retardation asymmetry.

19 Claims, 15 Drawing Sheets

U.S. PATENT DOCUMENTS

| | | | |
|---|---|---|---|
| 7,126,765 B2 * | 10/2006 | Krahmer et al. | 359/726 |
| 7,145,720 B2 * | 12/2006 | Krahmer et al. | 359/499 |
| 2004/0070744 A1 * | 4/2004 | Ozawa | 355/71 |
| 2005/0018277 A1 * | 1/2005 | Ozawa | 359/352 |
| 2005/0018278 A1 * | 1/2005 | Ozawa | 359/352 |
| 2005/0200966 A1 * | 9/2005 | Totzeck et al. | 359/649 |
| 2006/0171020 A1 * | 8/2006 | Krahmer et al. | 359/355 |

FOREIGN PATENT DOCUMENTS

| | | |
|---|---|---|
| DE | 101 33 841 | 2/2003 |
| EP | 1 0006 373 | 6/2000 |
| EP | 1 063 684 | 12/2000 |
| WO | 01 50171 | 7/2001 |
| WO | WO 200231570 A1 * | 4/2002 |
| WO | 02 093209 | 11/2002 |
| WO | 03 077007 | 9/2003 |

OTHER PUBLICATIONS

Burnett et al., "The trouble with calcium Fluoride," Spie's OE Magazine—Special focus section, pp. 23-25, Mar. 2002.

* cited by examiner

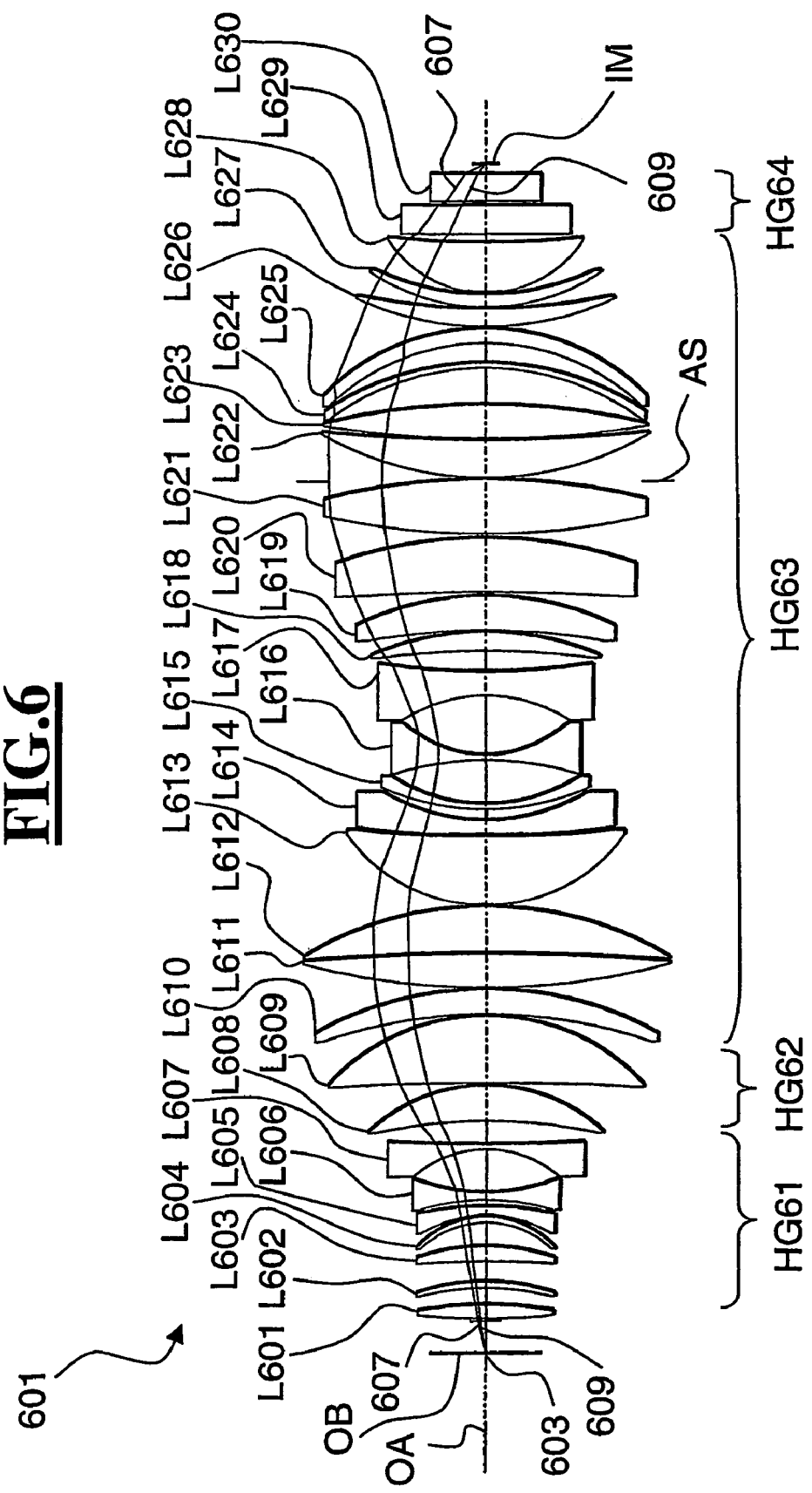

US 7,321,465 B2

METHOD OF OPTIMIZING AN OBJECTIVE WITH FLUORIDE CRYSTAL LENSES, AND OBJECTIVE WITH FLUORIDE CRYSTAL LENSES

CROSS-REFERENCE TO RELATED APPLICATION

This application is a continuation of International Patent Application Serial No. PCT/EP 2003/009167 filed Aug. 19, 2003, in the German language and published as WO 2004/023172 A1 on Mar. 18, 2004, which, in turn, claims the priority of the German patent applications 102 41 102.6, filed Sep. 3, 2002,
102 43 080.2, filed Sep. 16, 2002,
102 53 355.5, filed Nov. 14, 2002,
103 04 116.8, filed Jan. 31, 2003, all of which are hereby incorporated herein by reference in their entirety.

BACKGROUND OF THE INVENTION

The present invention relates to a numerical optimizing method for the determination of the optical data of an objective, and it further relates to an objective that is made in accordance with the method.

Numerical optimizing methods of this kind have long been known. The textbook "Synthese optischer Systeme" (Synthesis of Optical Systems) by H. Haferkorn and W. Richter (1984; VEB Deutscher Verlag der Wissenschaften: DDR-1080 Berlin) discusses the correction of optical systems in chapter 4. The first step is to find an optimizing function which takes a multitude of image aberrations into account such as, e.g., Seidel's aberrations, transverse aberrations, or wave aberrations. The individual image aberrations can be entered into the optimizing function with individual weight factors. In addition, boundary constraints such as focal lengths, or design constraints, can also be taken into account. The optimizing function depends on the degrees of freedom of the optical system, such as for example lens radii, asphericity parameters, lens thicknesses, distances between lenses, or indices of refraction. The purpose of the numerical optimizing method is to minimize the optimizing function and to thereby determine the optical data of the optical system. A variety of methods are used for the automatic correction, such as for example the correction methods with a linear approximation of the optimizing function, or the correction methods with a quadratic approximation of the optimizing function.

The aforementioned textbook is mentioned only as an example. The fundamentals of numerical optimizing methods are also described in the English-language literature related to the field of optical design.

A widely used computer program to run numerical optimizing processes is available under the trade name "Code V®" by Optical Research Associates (ORA®), Pasadena, Calif. (USA). With the Code V® program, an optimizing function can be defined which takes a variety of image aberrations into account. With a start-up system as a point of departure, the optical data of an objective can subsequently be determined with local and global optimizing procedures.

The computer program ZEMAX® of Focus Software, Inc., Tucson, Ariz., likewise provides the capability to determine the optical data of an objective through a numerical optimizing process.

It became known in May 2001, based on measurements that had been made, that calcium fluoride, in spite of having a cubic crystal structure, exhibits the characteristics of intrinsic birefringence. The measurement results supporting this discovery have been published in November 2001 in the article "Intrinsic birefringence in calcium fluoride and barium fluoride" by J. Burnett et al. (Physical Review B, Volume 64 (2001), pages 241102-1 to 241102-4).

To discuss the subject of intrinsic birefringence, it is essential to use an unambiguous notation of the crystallographic directions. Therefore, a system of notations is introduced below to identify crystallographic directions, crystallographic planes, and lenses whose lens axes are oriented in certain crystallographic directions.

The indices for the crystallographic directions will hereinafter be bracketed between the symbols "<" and ">", and the indices for the crystallographic planes will be bracketed between the symbols "{" and "}". The crystallographic directions are perpendicular to the correspondingly indexed crystallographic planes. For example, the crystallographic direction <100> is perpendicular to the crystallographic plane {100}. Crystals with a cubic lattice structure, which includes the fluoride crystals that are of interest in the present context, have the principal crystallographic directions <110>, <$\bar{1}$10>, <1$\bar{1}$0>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, <0$\bar{1}\bar{1}$>, <111>, <$\bar{1}\bar{1}\bar{1}$>, <$\bar{1}\bar{1}$1>, <$\bar{1}$1$\bar{1}$>, <$\bar{1}$11>, <1$\bar{1}\bar{1}$>, <1$\bar{1}$1>, <11$\bar{1}$>, <100>, <010>, <001>, <$\bar{1}$00>, <0$\bar{1}$0>, and <00$\bar{1}$>.

Because of the symmetries of cubic crystals, the principal crystallographic directions <100>, <010>, <001>, <$\bar{1}$00>, <0$\bar{1}$0>, and <00$\bar{1}$> are equivalent to each other. Therefore, those crystallographic directions that are oriented along one of the principal directions <100>, <010>, <001>, <$\bar{1}$00>, <0$\bar{1}$0>, and <00$\bar{1}$> will hereinafter be identified by the prefix "(100)-", and crystallographic planes that are perpendicular to these directions will also be identified by the same prefix "(100)-". Lenses whose lens axes are parallel to one of these principal crystallographic directions are likewise given the prefix "(100)-".

Furthermore, the principal directions <110>, <$\bar{1}$10>, <1$\bar{1}$0>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, and <0$\bar{1}\bar{1}$> are likewise equivalent to each other. Therefore, those crystallographic directions that are oriented along one of the latter group of principal directions will hereinafter be identified by the prefix "(110)-", and crystallographic planes that are perpendicular to these directions will also be identified by the same prefix "(110)-". Lenses whose lens axes are parallel to one of these principal crystallographic directions are likewise given the prefix "(110)-".

Finally, the principal directions <111>, <$\bar{1}\bar{1}\bar{1}$>, <$\bar{1}\bar{1}$1>, <$\bar{1}$1$\bar{1}$>, <$\bar{1}$11>, <1$\bar{1}\bar{1}$>, <1$\bar{1}$1>, and <11$\bar{1}$> are also equivalent to each other. Therefore, those crystallographic directions that are oriented along one of the latter group of principal directions will hereinafter be identified by the prefix "(111)-", and crystallographic planes that are perpendicular to these directions will also be identified by the same prefix "(111)-". Lenses whose lens axes are parallel to one of these principal crystallographic directions are likewise given the prefix "(111)-".

Any statements made hereinafter in regard to one of the aforementioned principal crystallographic directions should be understood to be equally applicable to the equivalent principal crystallographic directions.

Consistent with the above, the crystallographic (111)-directions are not equivalent to the crystallographic (100)-directions or the crystallographic (110)-directions. Likewise, the crystallographic (100)-directions are not equivalent to the crystallographic (110)-directions.

According to the article in Physical Review B which was mentioned above, the intrinsic birefringence is strongly dependent on the material orientation of the fluoride crystal lens and on the direction of the light ray. It reaches its maximum in a light ray traveling through a lens in the crystallographic <110>-direction. The measurements presented in the article show that rays propagating in the (110)-direction of a calcium fluoride crystal are subject to a birefringence of (−11.8±0.4) nm/cm at a wavelength of $\lambda$=156.1 nm, of (−3.6±0.2) nm/cm at a wavelength of $\lambda$=193.09 nm, and of (−0.55±0.07) nm/cm at a wavelength of $\lambda$=253.65 nm. On the other hand, if the light propagation is oriented in the <100> direction or in the <111> direction of the crystal, no intrinsic birefringence occurs in calcium fluoride, as is also predicted by theory. Thus, the intrinsic birefringence has a strong directional dependence and increases significantly for shorter wavelengths.

The directional dependence of the intrinsic birefringence in a fluoride crystal with a cubic crystal structure is shown in the published article. "The trouble with calcium fluoride" by J. Burnett et al. (spie's oemagazine, March 2002, pp. 23-25 and FIG. 4). The intrinsic birefringence of a light ray depends in this case on the aperture angle as well as on the azimuth angle of a light ray. As is made evident in FIG. 4, the intrinsic birefringence has a fourfold azimuthal symmetry if the lens axis is oriented in the crystallographic (100)-direction, a threefold azimuthal symmetry if the lens axis is oriented in the crystallographic (111)-direction, and a twofold azimuthal symmetry if the lens axis is oriented in the crystallographic (110)-direction. By rotating two fluoride crystal lenses relative to each other about their lens axes, it is possible to reduce the detrimental influence of the intrinsic birefringence. An angle of rotation of 45° is proposed for two lenses whose lens axes are oriented in the crystallographic (100)-direction, an angle of rotation of 60° for two lenses whose lens axes are oriented in the crystallographic (111)-direction, and an angle of rotation of 90° for two lenses whose lens axes are oriented in the crystallographic (110)-direction. By simultaneously using pairs of (100)-lenses, (111)-lenses, and (110)-lenses with these respective angles of rotation, it is possible to reduce the optical path difference between two mutually orthogonal states of polarization. Furthermore, using calcium fluoride lenses and barium fluoride lenses in combination likewise results in a compensation of the detrimental influence of the intrinsic birefringence because, according to FIG. 2 of the same article, the respective birefringence effects for comparable crystallographic directions in barium fluoride and calcium fluoride have opposite signs.

As described in the articles by John Burnett et al., the detrimental influence of intrinsic birefringence manifests itself most of all in objectives that are used in the deep ultraviolet range ($\lambda$<200 nm), such as for example lithography projection objectives for applications in 157 nm-lithography.

Projection objectives and microlithography projections systems of this type have been disclosed, e.g., in the Patent Application Publication WO 01/50171 A1 (U.S. Ser. No. 10/177,580), which has the same assignee as the present application, and the references cited therein. The examples of embodiments presented in that patent application are purely refractive as well as catadioptric projection objectives with numerical aperture values of 0.8 and 0.9 at working wavelengths of 193 nm as well as 157 nm. The material used for the lenses is calcium fluoride.

The not pre-published patent application PCT/EP 02/05050, which has the same assignee as the present application, gives a description of different compensation methods to reduce the detrimental influence of the intrinsic birefringence, e.g., in the objectives that are presented as examples in WO 01/50171 A1 (U.S. Ser. No. 10/177,580). Among others, the solutions disclosed therein include the parallel use of (100)-lenses with (111)-lenses or (110)-lenses of the same fluoride crystal material as well as the use of compensation coatings. The disclosure of WO 01/50171 A1 (U.S. Ser. No. 10/177,580) is hereby incorporated in its entirety in the present application.

The not pre-published patent application DE 101 33 841.4 (U.S. Ser. No. 10/199,503), which has the same assignee as the present application, proposes the concept of using lenses of two different crystalline materials in parallel in order to reduce the harmful influence of intrinsic birefringence. Calcium fluoride and barium fluoride are suggested as a suitable pair of materials. The disclosure of DE 101 33 841.4 (U.S. Ser. No. 10/199,503) is hereby incorporated in its entirety in the present application.

The concept of rotating the orientation of lens elements in order to compensate for the effects of birefringence is also described in the not pre-published patent application DE 101 23 725.1, (PCT/EP 02/04900), whose content is hereby incorporated by reference in the present application.

However, the proposed methods are limited in their capability, or work only for a small number of suitable lenses, to provide a complete compensation of the aberrations caused by intrinsic birefringence. While it is known in theory, that two (100)-lenses rotated by 45° or two (111)-lenses rotated by 60°, relative to each other will reduce the harmful effects of intrinsic birefringence, this prediction is met in the ideal sense only if the lenses are adjoining planar-parallel plates. Transferring this concept to objectives with a multitude of individual lenses with different lens thickness and different surface parameters of the lens surfaces presents itself as a serious problem to the optical designer. For one, as the number of fluoride crystal lenses gets larger, the lens materials, the orientations of the lens axes and the angles of rotation have to be determined for a larger number of lenses. As a further problem, it is normally necessary to go through a comprehensive calculation of the polarization along specific light rays in order to determine the result of the compensation. However, calculating the polarization optics along the entire paths of representative rays is a complex undertaking.

OBJECT OF THE INVENTION

The task set for the present invention is therefore to propose a simple, effective, and also time-saving method for reducing the harmful influence of intrinsic birefringence in objectives with fluoride crystal lenses.

A further task set for the invention is to specify objectives that are distinguished by an excellent degree of correction in regard to the harmful influence of birefringence.

Finally, notwithstanding their superior birefringence correction, the objectives with fluoride crystal lenses need to lend themselves to a simple manufacturing process.

SUMMARY OF THE INVENTION

The foregoing objective is met by a numerical optimizing method, by an objective produced according to the method, an objective distinguished by an excellent degree of correction in regard to the harmful influence of birefringence, and an objective which combines a superior birefringence correction with a design that lends itself to a simple manufacturing process, and further by a microlithography projection system as well as a method for producing semiconductor elements by means of the microlithography projection system.

According to the invention, the harmful influence of intrinsic birefringence is reduced already in the phase of determining the optical data of an objective with fluoride crystal lenses, i.e., in the numerical optimizing process. The optical data of an objective that are considered in this process include the arrangement and dimensions of the optical elements as well as information regarding the lens materials being used and their orientation. As long as the arrangement and the dimensions of the optical elements, i.e., quantities such as the surface parameters of the lens surfaces, lens thicknesses and distances between the lenses of the objective, have not yet been selected and, consequently, remain available as degrees of freedom for the optimization, a significantly better range of possibilities remains open for correcting the aberrations caused by intrinsic birefringence. While it is possible to perform the optimization after the optical design of the objective has been decided upon, the only degrees of freedom remaining available at that point are the orientations of the lens axes and the angles of rotation. According to the invention, at least one birefringence-related image aberration is taken into account in an optimizing function that is to be minimized in accordance with the numerical optimizing method. This birefringence-related image aberration is determined from a calculation for a light ray passing through the fluoride crystal lenses. As the birefringence-related image aberration should serve to describe the reduction of the harmful influence of intrinsic birefringence, one would expect the birefringence-related image aberration to depend on polarization-optics parameters of the ray, such as for example the state of polarization or the optical path difference between two mutually orthogonal states of polarization which occurs in a ray passing through the fluoride crystal lenses. According to the invention, the birefringence-related image aberration, insofar as it depends on the parameters of the ray, is a function of only the geometric parameters of the light ray. The term "geometric parameters" refers for example to ray angles and ray path lengths, i.e., quantities that can be determined through geometric means. In comparison to the polarization-optics parameters, the determination of the geometric parameters is less complicated and can be accomplished at a lower cost. The geometric parameters are obtained almost immediately in the course of the calculation for a light ray. It is therefore surprising that a reduction of the harmful influence of intrinsic birefringence can be achieved by optimizing the birefringence-related image aberration which, insofar as is depends on parameters of the ray, is a function of only the geometric parameters of the ray.

It is advantageous to use an outer aperture ray to determine the birefringence-related image aberration. The term "outer aperture ray" in this context refers to a ray whose relative ray aperture lies between 0.5 and 1.0. The relative ray aperture is defined as the ratio between a ray aperture and the numeric aperture in the image plane of the objective, with the ray aperture in the image plane being defined as the sine of the angle between the outer aperture ray and the principal ray, where the principal ray and the outer aperture ray originate from the same object point in an object plane. If the object point lies on the optical axis, the principal ray runs along the optical axis. In this case, a relative ray aperture of, e.g., 1.0 means that the outer aperture ray is represented by the marginal ray of the light bundle originating from this object point. As geometric parameters for an outer aperture ray, at least one ray path $OP_L$ and an aperture angle $\theta_L$ are determined in each fluoride crystal lens. As a favorable circumstance, the birefringence-related image aberration in this case depends only on the ray path lengths $OP_L$ and the aperture angles $\theta_L$ in the fluoride crystal lenses. The term "ray path length $OP_L$" means the geometric path length that a ray travels inside a lens. The aperture angle $\theta_L$ indicates the angle between a ray and the lens axis of the respective lens.

The reason why an outer aperture ray is used to determine the harmful influence of intrinsic birefringence is that an outer aperture ray normally has large aperture angles inside the lenses. The outer aperture rays are affected by the birefringent lenses especially in a case where the intrinsic birefringence—either in the individual fluoride crystal lenses or in a combination of lenses that are rotated relative to each other about the lens axis—causes an optical path difference between two mutually orthogonal states of polarization that increases with larger aperture angles.

In the calculation of the birefringence-related image aberrations, it is advantageous to determine the relative ray aperture of the outer aperture ray in such a way that the optical path difference for two mutually orthogonal states of polarization reaches its maximum when the fluoride crystal lenses are not rotated relative to each other. In determining the relative ray aperture, one begins by calculating the optical path differences for two mutually orthogonal states of polarization for relative ray apertures between 0.5 and 1.0. The relative ray aperture value for which the optical path difference of the outer aperture ray reaches its maximum is subsequently used for the further calculation of the birefringence-related image aberrations.

If the lens axis of a fluoride crystal lens is oriented in the crystallographic (111)-direction, it is advantageous if the birefringence-related image aberration also depends on the azimuth angle $\alpha_L$ of the outer aperture ray. Due to the threefold azimuthal symmetry of the birefringence distribution $\Delta n(\theta_L, \alpha_L)$ of (111)-lenses, the harmful influence of intrinsic birefringence on a ray passing through two (111)-lenses of equal lens-axis orientation can already be reduced if the azimuth angle $\alpha_L$ of the ray in one of the (111)-lenses differs by 180° from the other (111)-lens. This applies for example to a ray which runs in the meridian plane and which diverges from the lens axis in one of the (111)-lenses and converges with the lens axis in the other (111)-lens.

In the present context, the azimuth angle outside of a lens is defined as the angle between the projection of the ray into a plane that extends perpendicular to the optical axis of the objective and a fixed reference direction that is tied to the objective and runs perpendicular to the optical axis of the objective. The reference direction can, for example, coincide with the y-direction in the object plane or the image plane, if the z-direction coincides with the direction of the optical axis. The azimuth angle inside of a lens is defined as the angle $\alpha_L$ between the projection of the ray into a plane that extends perpendicular to the lens axis and a reference direction that is tied to the lens and runs perpendicular to the lens axis. The reference direction of a lens is, for example, parallel to a direction that is obtained by projecting the crystallographic (110)-direction into a plane whose normal vector points in the crystallographic (100)- or (111)-direction, i.e., in that crystallographic direction which is aligned with the lens axis. The reference directions of the fluoride crystal lenses whose lens axes are oriented in the same principal crystallographic direction are thus tied in a consistent manner to the crystallographic structure.

The lens axis is defined, e.g., by the symmetry axis of a rotationally symmetric lens. If the lens does not have a symmetry axis, the lens axis may be defined as the centerline of an incident bundle of light rays, or as a line that runs in the median ray direction of all light rays in the lens. The lens axis of a planar-parallel plate is perpendicular to the surface planes of the lens. The lens axis is considered as aligned with a given crystallographic direction, if the angular deviation between the lens axis and the crystallographic direction is smaller than ±10°. The angular deviation should preferably be less than ±5°.

The lenses may be, e.g., refractive or diffractive lenses as well as correction plates with free-form corrective surfaces. Planar-parallel plates are likewise considered as lenses if they are arranged in the light path of the objective. However, elements with an explicit retarding function such as quarter-lambda plates or half-lambda plates are not considered to be lenses. They influence the state of polarization of all rays in approximately the same way and are therefore not taken into account in the calculation of the birefringence-related image aberrations.

Particularly in cases where different fluoride crystals of cubic structure, for example calcium fluoride and barium fluoride, are used as lens materials in an objective, it is of advantage if the birefringence-related image aberration depends on material factors that are characteristic for the lens materials being used. If, on the other hand, only one fluoride crystal material is used, the material factor has the same value in all of the fluoride crystal lenses and can therefore be considered to be a constant.

The optical path difference for two mutually orthogonal states of polarization is likewise influenced by the orientation of the lens axis of a fluoride crystal lens, i.e., the direction of the lens axis within the crystal. It is therefore advantageous if the birefringence-related image aberration is a function of orientation factors of the fluoride crystal lenses. If, on the other hand, the lens axes of the lenses in an objective or a lens group that is to be optimized are oriented in the same crystallographic direction, the orientation factor can be considered as a constant. In the process of reducing the harmful influence of intrinsic birefringence, it is advantageous if the birefringence-related image aberration is a function of ray factors $SP_L$ which are specific to each lens and are defined as $$SP_L = OP_L \cdot \sin^2 \theta_L \cdot (7 \cdot \cos^2 \theta_L - 1) \quad (1)$$

For aperture angles up to 40°, the following represents a good approximation of the ray factor:

$$SP_L = (\theta_L, OP_L) \approx OP_L \cdot (9/7) \cdot \sin^2(2.17 \cdot \theta_L) \quad (2)$$

Besides the functional relationships expressed in the equations (1) and (2) between the ray factor $SP_L$ and the quantities $\theta_L$ and $OP_L$, one could also use a polynomial series or other representation of the functional relationship as a best approximation.

In addition to its dependence on the aperture angle $\theta_L$, the intrinsic birefringence of fluoride crystals with a cubic crystal structure also depends on the azimuth angle $\alpha_L$ of a light ray. Through an appropriately selected rotation of lenses whose lens axes run in the same principal crystallographic direction, one can achieve that the optical path difference for two mutually orthogonal states of polarization in light rays passing through these lenses will be nearly independent of the azimuth angle $\alpha_L$ at least for one aperture angle $\theta_L$. According to the invention, these lenses are assigned an effective amount of birefringence which depends only on the aperture angle $\theta_L$ of a light ray. The effective birefringence distribution is in this case proportionate to $\sin^2 \theta_L \cdot (7 \cdot \cos^2 \theta_L - 1)$. For a ray passing through a lens with this effective birefringence distribution, the optical path difference for two mutually orthogonal states of polarization is proportionate to the value for the ray factor $SP_L$ which is obtained from equation (1) or (2). Consequently, it is advantageous if the birefringence-related image aberration is a function of the ray factors $SP_L$ of the fluoride crystal lenses.

In order to be able on the basis of the ray factors $SP_L$ to systematically minimize the optical path difference for two mutually orthogonal states of polarization occurring in an outer aperture ray in a fluoride crystal lens, it is advantageous if the birefringence-related image aberration is a function of birefringence factors $BF_L$ of the fluoride crystal lenses, where the individual birefringence factor $$BF_L = MA_L \cdot DI_L \cdot SP_L \quad (1)$$

is defined as the product of a material factor $MA_L$, an orientation factor $DI_L$ and the ray factor $SP_L$ which is determined by equations (1) and (2).

The material factor $MA_L$ for a fluoride crystal lens indicates the intrinsic birefringence for a ray that runs in the crystallographic (110)-direction. Consequently, the material factor depends on the wavelength. The material factor $MA_L$ for a working wavelength of 157 nm in calcium fluoride is $(-11.8 \pm 0.4)$ nm/cm, and for barium fluoride it is $(+33 \pm 3)$ nm/cm.

The orientation factor $DI_L$ for a fluoride crystal lens depends on the crystallographic direction in which the lens axis of the respective fluoride crystal lens is oriented. For a fluoride crystal lens whose lens axis is oriented in the crystallographic (100)-direction, $DI_L$ equals $-\frac{1}{2}$, and for a fluoride crystal lens whose lens axis runs in the crystallographic (111)-direction, $DI_L$ equals $+\frac{1}{3}$. Finally, for a fluoride crystal lens whose lens axis is oriented in the crystallographic (110)-direction, $DI_L$ equals $+\frac{1}{8}$.

The birefringence factor $BF_L$ can in effect be interpreted as an optical path difference that occurs in the outer aperture ray in the fluoride crystal lens.

Depending on the boundary conditions, the material factor or the orientation factor can also be set as constants.

The harmful influence of intrinsic birefringence caused by a group of fluoride crystal lenses can be substantially reduced if the birefringence-related image aberration for the group of lenses is defined as an optical retardation $OR_{LG}$ and the amount of the optical retardation $OR_{LG}$ is minimized by the optimizing method. The optical retardation $$OR_{LG} = \sum_{L \text{ in } LG} BF_L \quad (4)$$

is defined as the sum of the birefringence factors $BF_L$ of the fluoride crystal lenses of the group.

Since the ray factor $SP_L$ by definition can take on only positive values, a reduction can be achieved for example if the fluoride crystal lenses of the group consist of different fluoride crystals whose material factors $MA_L$ have different signs, or if the lens axes of the fluoride crystal lenses of the group run in different crystallographic directions, so that the associated orientation factors $DI_L$ have different signs. While the degrees of freedom represented by the material factor $MA_L$ and the orientation factor $DI_L$ can take on only discrete values in the optimization process, the ray-specific factor $SP_L$ can be used for a fine correction by influencing the lens data. As the ray factor $SP_L$ has a linear dependency on the ray path length $OP_L$, the magnitude of the ray factor $SP_L$ of a lens can be influenced directly through a change in the lens thickness. This is a favorable circumstance for the reason that the classic image aberration such as for example the distortion and the spherical image aberrations depend primarily on the surface parameters of the lens surfaces and only secondarily on the lens thicknesses. Thus, a sufficient number of degrees of freedom remain available in the simultaneous correction of birefringence-related image aberrations and classic image aberrations.

The optical retardation $$OR_{LG} = \sum_{L \text{ in } LG} BF_L$$

can in effect be interpreted as an optical path difference that occurs in the outer aperture ray in the group of fluoride crystal lenses. Minimizing this image aberration creates the requisite conditions for reducing the harmful influence of intrinsic birefringence by rotating the fluoride crystal lenses in relation to each other.

If an arbitrary constant is applied as a scale factor to the optical retardation $OR_{LG}$, the foregoing interpretation of the optical retardation $OR_{LG}$ is equivalent to the definition expressed through equation (4).

In the practice of the numerical optimizing method for reducing the harmful influence of intrinsic birefringence in a group of fluoride crystal lenses, an advantageous approach is to start from an objective with known optical data and, as a first step, to assign to each of the fluoride crystal lenses a material factor $MA_L$ and a refractive index $n_L$ associated with the respective material. Next, an orientation factor $DI_L$ is assigned to the fluoride crystal lenses of the group. As a next step, the optimizing function is minimized with regard to the optical retardation $OR_{LG}$ of the group of fluoride crystal lenses.

If the optical retardation $OR_{LG}$ of the group of fluoride crystal lenses is larger than a given threshold, the foregoing steps are repeated, assigning different material factors $MA_L$ and/or orientation factors $DI_L$ to the fluoride crystal lenses.

Since under this approach, the material factors $MA_L$ and/or the orientation factors $DI_L$ are assigned to the fluoride crystal lenses, the quantities that remain available as degrees of freedom are the surface parameters of the lens surfaces, the lens thicknesses and the distances between the lenses.

It is advantageous to define an optical retardation asymmetry $ORAS_{LG}$ as a further birefringence-related image aberration for a group of fluoride crystal lenses, as follows:

$$ORAS_{LG} = \left| \sum_{L \text{ in } G} (DS_L \cdot AP_L \cdot BF_L) \right| \quad (5)$$

The optical retardation asymmetry $ORAS_{LG}$ is defined as the absolute amount of the sum of the respective products of a complex rotary position factor $DS_L$ with an azimuth factor $AP_L$ and the birefringence factor $BF_L$ as defined in equation (3) for each of the fluoride crystal lenses of the group.

The angular position factor $DS_L = \exp(i \cdot SF_{DI\_L} \cdot \gamma_L)$ is defined as a phase factor which depends on a symmetry factor $SF_{DI\_L}$ and on an angle of rotation $\gamma_L$.

The symmetry factor $SF_{DI\_L}$ equals 4 for (100)-lenses, 3 for (111)-lenses, and 2 for (110)-lenses. The symmetry factor indicates the angular periodicity which occurs in the azimuthal symmetry of the birefringence distribution $\Delta n(\theta_L, \alpha_L)$ and which is dependent on the orientation of the lens axis.

The angle of rotation $\gamma_L$ indicates the angle between the reference direction of the fluoride crystal lens which has been rotated about the lens axis and a reference direction of the group. The reference direction of the group is the same for all lenses to the group. It coincides for example with the direction of the x-axis if the optical axis of the objective coincides with the z-axis.

For (100)-lenses, the azimuth factor $AP_L$ equals +1, independent of the azimuth angle $\alpha_L$. In (111)-lenses, the azimuth factor $AP_L$ depends on the azimuth angle $\alpha_L$ of the outer aperture ray. The azimuth factor $AP_L$ equals +1 for $0° \leq \alpha_L < 180°$, and it equals −1 for $180° \leq \alpha_L < 360°$. This takes into account the threefold azimuthal symmetry of the birefringence distribution $\Delta n(\theta_L, \alpha_L)$ of (111)-lenses which has been discussed above, so that the respective optical path differences for two mutually orthogonal states of polarization that occur in two rays whose azimuth angles differ by 180° have opposite signs and different amounts.

For (110)-lenses, the azimuth factor $AP_L$ equals +1, independent of the azimuth angle $\alpha_L$.

If a group of fluoride crystal lenses has only a small asymmetry $ORAS_{LG}$ of the optical retardation, the optical path difference between two mutually orthogonal states of polarization in an outer aperture ray depends almost exclusively on the aperture angle $\theta_L$ of the outer aperture ray.

The available degrees of freedom include primarily the angles of rotation $\gamma_L$ as well as the ray factors $SP_L$ which can be influenced by way of the lens data.

If all or some of the angles of rotation $\gamma_L$ of the fluoride crystal lenses are prescribed quantities, the number of degrees of freedom available for the optimization is reduced accordingly.

If one limits the choice of angles of rotation $\gamma_L$ for a group of (100)-lenses to 0° and 45° or for a group of (111)-lenses to 0° and 60°, the angular position factor $DS_L$ can take on the values of ±1.

If one limits the choice of angles of rotation $\gamma_L$ for a group of (110)-lenses to 0°, 45°, 90° and 135°, the angular position factor $DS_L$ can take on the values of ±1 or ±i.

A group of fluoride crystal lenses whose lens axes are all oriented in the same crystallographic direction and for which the asymmetry $ORAS_{HG}$ of the optical retardation is minimized with the numerical optimizing method will hereinafter also be referred to as a homogeneous group. Image aberrations that relate to a special, i.e., homogenous, lens group, will hereinafter be identified by the subscript index "HG" instead of "LG". Thus, there are homogeneous groups with (100)-lenses, with (111)-lenses, or with (110)-lenses. It is advantageous if the fluoride crystal lenses of a homogeneous group also consist of the same lens material.

It is further advantageous if the homogeneous groups have lenses in adjacent positions.

Following is a description of an advantageous procedure for determining the optical data of the fluoride crystal lenses of a homogeneous group in which the optical path difference in an outer aperture ray for two mutually orthogonal states of polarization depends almost exclusively on the aperture angle of the ray. The fluoride crystal lenses of the homogeneous group have the same orientation factors $DI_L$.

Under the procedure, a respective material factor $MA_L$ and angle of rotation $\gamma_L$ are assigned to each of the fluoride crystal lenses, and the optimizing function is minimized by taking into account the asymmetry $ORAS_{HG}$ of the optical retardation in the homogeneous group of fluoride crystal lenses. If the asymmetry $ORAS_{HG}$ of the optical retardation in the homogeneous group of fluoride crystal lenses exceeds a given threshold, a different set of material factors $MA_L$ and angles of rotation $\gamma_L$ are assigned to the fluoride crystal lenses of the homogeneous group. The degrees of freedom which are available for the minimizing procedure are the surface parameters of the lens surfaces, the lens thicknesses and the distances between the lenses.

If the fluoride crystal lenses of the homogeneous group consist of the same lens material and thus have the same material factor $MA_L$, there remains only a respective angle of rotation $\gamma_L$ to be assigned to each of the fluoride crystal lenses.

Under a particularly preferred embodiment of the inventive method, the angles of rotation $\gamma_L$ are used as additional degrees of freedom in the optimization, i.e., they are not assigned to the fluoride crystal lenses. This has the advantage that only small modifications of the surface parameters of the lens surfaces, the lens thicknesses and the lens distances are required so that the classical image aberrations such as the Seidel aberrations, which are independent of the angles of rotation $\gamma_L$ of the fluoride crystal lenses, will be less affected by the optimization.

The best situation is achieved if the optimization can be performed by varying only the angles of rotation $\gamma_L$.

In an advantageous embodiment of the inventive method, the two birefringence-related imaging aberrations described above, i.e., the optical retardation $OR_{LG}$ and the asymmetry $ORAS_{HG}$ of the optical retardation are minimized simultaneously for a group of fluoride crystal lenses that includes at least two homogeneous groups of fluoride crystal lenses. In this simultaneous minimization, the optical retardation $OR_{LG}$ is minimized for the overall group, and the asymmetry $ORAS_{HG}$ is minimized for each homogeneous group.

Following are the steps of an advantageous procedure which can be applied when using the numerical optimizing method to reduce the optical retardation $OR_{LG}$ for a group of fluoride crystal lenses that includes at least two homogeneous groups of fluoride crystal lenses and to simultaneously reduce the asymmetry $ORAS_{HG}$ of each of the homogeneous groups in an objective with known optical data:

Assigning material factors $MA_L$ and refractive indices $n_L$ (if the lenses have different refractive indices $n_L$) to the fluoride crystal lenses of the group.

Assigning orientation factors $DI_L$ to the fluoride crystal lenses of the group.

Allocating lenses of the same orientation factor $DI_L$ to one or more homogeneous groups.

Assigning an angle of rotation $\gamma_L$ to the fluoride crystal lenses of the individual homogeneous groups.

Minimizing the optimizing function with regard to the optical retardation $OR_{LG}$ of the group and the respective asymmetry $ORAS_{HG}$ of the optical retardation of each of the homogeneous groups.

Repeating the foregoing steps, if the optical retardation $OR_{LG}$ of the group of fluoride crystal lenses exceeds a given threshold and if the respective asymmetries $ORAS_{HG}$ of the optical retardation of the homogeneous groups exceed a further given threshold.

The surface parameters of the lens surfaces, the lens thicknesses, and the distances between the lenses are available as degrees of freedom in the minimization.

In a preferred version of the foregoing method, the step of assigning angles of rotation $\gamma_L$ can be omitted, and the angles of rotation can be used as degrees of freedom.

The method can be used to particular advantage for lens groups that contain only fluoride crystal lenses of one and the same fluoride crystal, such as for example calcium fluoride, in which case the harmful effects of intrinsic birefringence can be reduced to a significant extent already by determining the orientation factors $DI_L$ and the angles of rotation $\gamma_L$. Under the optimizing procedure described above, significantly more degrees of freedom are available for the optimization, because at the outset the full range of angles of rotation $\gamma_L$ are available rather than only those angles that are associated with the lens symmetries, i.e., 45° for (100)-lenses, 60° for (111)-lenses, and 90° for (110)-lenses.

Thus, the optimizing method of the foregoing description offers a way to design objectives where the classical image aberrations as well as the birefringence-related image aberrations are optimized already in the phase of determining of the optical data.

The objectives are distinguished by the fact that they produce a distortion of less than 5 nm within an image field of more than 15 mm diameter. The term "distortion" in this case encompasses the geometric distortion of the principal rays as well as the coma-induced distortion.

The mean deviation of the wave front from a perfect sphere can be optimized simultaneously for each image point, so that it is smaller than 10 m$\lambda$ (thousandths of a wavelength) in terms of the working wavelength.

The objectives designed according to the numerical optimizing method are distinguished by the fact that the optical retardation $OR_{LG}$ for all fluoride crystal lenses that are arranged between an object plane and an image plane is smaller that 5%, in particular smaller than 2%, and preferably smaller than 1% of a working wavelength $\lambda_0$.

If the objective includes polarization-selective elements which lead to an uncoupling between the individual partial systems of the objective with regard to their polarization characteristics, it is advantageous if the optical retardation $OR_{LG}$ of all fluoride crystal lenses in the partial system arranged in the light path directly ahead of the image plane is smaller that 25%, in particular smaller than 10%, and preferably smaller than 5% of a working wavelength $\lambda_0$. Polarization-selective elements are, e.g., polarization filters, but they also include polarization-optics elements such as beam-splitting layers, which are used for example between the beam-splitter prisms of a beam-splitter cube in catadioptric projection objectives. In objectives with polarization-selective elements, the correction of the optical retardation for the partial system arranged ahead of the image plane is more difficult than for example in a refractive projection objective, because the partial system has fewer lenses than the refractive projection objective.

It is advantageous, if the optimization is directed not only to an outer aperture ray, but to a plurality of aperture rays with different relative ray apertures. For example, the optical retardation $OR_{LG}$ should be minimized for an outer aperture ray with a relative ray aperture between 0.75 and 1.0 and for an outer aperture ray with a relative ray aperture between 0.5 and 0.75. As a result, the distribution function of the optical path differences for two mutually orthogonal states of polarization in a ray bundle that originates from an object point shows reduced values for different rays independent of their relative ray apertures.

If the optimization is performed with regard to a plurality of outer aperture rays with different relative ray apertures, it is further of advantage if the calculation of the birefringence-related image aberrations is performed for an outer aperture ray whose relative ray aperture is determined so that the optical path difference for two mutually orthogonal states of polarization in this outer aperture ray takes on a maximum when the fluoride crystal lenses are not rotated relative to each other. In addition to an outer aperture ray defined by this condition, it is further an advantageous practice to also apply the optimization to an outer aperture ray with a relative ray aperture between 0.9 and 1.0. In order to keep the computing effort within limits, it is advantageous to perform the calculation especially for these two particular outer aperture rays.

If the values for the optical retardation of an objective or of a partial system are below the aforementioned threshold, a nearly complete reduction of the harmful effects of intrinsic birefringence can be achieved by further measures such a rotating the lenses relative to each other.

The proof for a successful compensation by rotating the fluoride crystal lenses relative to each other lies in a low value for the asymmetry $ORAS_{LG}$ of the optical retardation, which is calculated for all fluoride crystal lenses of an objective or for the partial system arranged ahead of the image plane. A favorable value for the asymmetry $ORAS_{LG}$ of the optical retardation is less than 10%, in particular less than 5%, and with special preference less than 2% of a working wavelength $\lambda_0$.

When evaluating the asymmetry $ORAS_{LG}$ of the optical retardation, it is likewise advisable to consider a plurality of different outer aperture rays with different relative ray aperture values.

It is advantageous to correct the asymmetry $ORAS_{HG}$ of the optical retardation not only for all fluoride crystal lenses of an objective or a partial system, but also for individual homogeneous groups with small numbers of lenses.

Following is a discussion of the advantages of homogeneous groups with at least three fluoride crystal lenses. The asymmetry $ORAS_{HG}$ of the optical retardation for all fluoride crystal lenses of this homogeneous group should be smaller than 5%, in particular smaller than 2% of a working wavelength $\lambda_0$.

While an effective birefringence distribution $\Delta_{eff}(\theta_L)$ that is independent of the azimuth angle can be achieved in two (111)-lenses or two (100)-lenses only if the lenses are rotated relative to each other by 60° or 45°, respectively, and if the two lenses have the same birefringence factors $BF_L$, an arrangement of three lenses offers significantly more possibilities, since the angles of rotation $\gamma_L$ are available as additional degrees of freedom for the optimization. This has particular bearing on the case where the inequality $$\left| \sum_{L \text{ in } HG} (c_L \cdot BF_L) \right| > 0.0 \tag{6}$$

and in particular $$\left| \sum_{L \text{ in } HG} (c_L \cdot BF_L) \right| > 2\% \text{ of a working wavelength } \lambda_0 \tag{7}$$

is met for any arbitrary set of coefficients $c_L = \pm 1$. Especially in this case, the asymmetry $ORAS_{HG}$ of the optical retardation can only be minimized it the angular position factor $DS_L = \exp(i \cdot S_{FDI\_L} \cdot \gamma_L)$ assumes complex values. The optimizing method of the foregoing description allows angles of rotation $\gamma_L$ to be calculated for the fluoride crystal lenses of the homogeneous group.

If the homogeneous group has exactly three lenses, the angles of rotation can be calculated directly from the ray factors $SP_L$, the material factors $MA_L$, the symmetry factors $S_{FDI\_L}$, and the azimuth factors $AP_L$ of the three lenses, in accordance with the following equations:

$$\gamma_1 = 0° \pm 5°, \tag{8}$$

$$\gamma_2 = \frac{1}{SF_{DI\_2}} \arccos\left( \frac{(AP_3 \cdot SP_3 \cdot MA_3)^2 - (AP_2 \cdot SP_2 \cdot MA_2)^2 - (AP_1 \cdot SP_1 \cdot MA_1)^2}{2 \cdot (AP_1 \cdot SP_1 \cdot MA_1) \cdot (AP_2 \cdot SP_2 \cdot MA_2)} \right) \pm 5° \tag{9}$$

$$\gamma_3 = \frac{1}{SF_{DI\_3}} \left( \arctan\left( \frac{(AP_2 \cdot SP_2 \cdot MA_2) \cdot \sin(SF_{DI\_2} \cdot \gamma_2)}{(AP_1 \cdot SP_1 \cdot MA_1) + (AP_2 \cdot SP_2 \cdot MA_2) \cdot \cos(SF_{DI\_2} \cdot \gamma_2)} \right) + 180° \right) \pm 5° \tag{10}$$

It is advantageous if the fluoride crystal lenses of a homogeneous group are of the same fluoride crystal material, i.e. for example calcium fluoride or barium fluoride or another optically transparent fluoride crystal with a cubic crystal structure.

It is further advantageous if the fluoride crystal lenses of a homogeneous group are arranged in adjacent positions. This is a favorable arrangement because if there are other optical elements arranged between the fluoride crystal lenses of the homogeneous group, these other elements can change the state of polarization of a ray in such a manner that a ray passing through the homogeneous group can still be subject to an azimuth-angle-dependent path difference for two mutually orthogonal states of polarization, even if the asymmetry $ORAS_{HG}$ of the optical retardation for all fluoride crystal lenses of this homogeneous group equals zero.

The concept of forming a homogeneous group with at least three fluoride crystal lenses is particularly advantageous in the case where at least one fluoride crystal lens of the homogeneous group has a birefringence factor $BF_L$ of more than 3% of a working wavelength $\lambda_0$. If in this case one were to form a homogeneous group of two fluoride crystal lenses, the second of the fluoride crystal lenses would have to have the same birefringence factor $BF_L$. If one allowed for example only the angles of rotation 0° and 60° for (111)-lenses, or 0° and 45° for (100)-lenses, the number of fluoride crystals in the homogeneous group would have be increased until $$\left| \sum_{L \text{ in } HG} (c_L \cdot BF_L) \right| = 0$$

for an arbitrary combination of coefficients $c_L = \pm 1$. Thus for example in a homogeneous group of three lenses, the sum of the birefringence factor $BF_L$ for two lenses would have to equal the birefringence factor $BF_L$ for the fluoride crystal lens with the largest birefringence factor $BF_L$.

It is advantageous if, besides the homogeneous group with at least three lenses, the objective has at least one further homogeneous group with at least two fluoride crystal lenses with an asymmetry $ORAS_{HG}$ of the optical retardation of less than 10%, preferably less than 5%, and with particular preference less than 2% of a working wavelength $\lambda_0$.

In order to allow a simultaneous minimization of the optical retardation $OR_{LG}$, it is advantageous if the products $MA_L \cdot DI_L$ for the fluoride crystal lenses of at least two different homogeneous groups have different signs.

The larger the number of homogeneous groups in an objective or in a partial system, the more degrees of freedom remain available to perform an adjustment, because after the asymmetry $ORAS_{HG}$ of the optical retardation has been corrected, the homogeneous groups can be positioned at arbitrary angles relative to each other. It is advantageous to form at least four homogeneous groups.

With particular preference, all fluoride crystal lenses of an objective, or of a partial system that is arranged between a polarization-selective optical element and an image plane, are assigned to one of the homogeneous groups. It is advantageous if the optical retardation $OR_{LG}$ of the fluoride crystal lenses of the objective or of the partial system is smaller than 25%, in particular smaller than 10%, and with special preference smaller than 5% of a working wavelength $\lambda_0$.

The harmful influence of birefringence, in particular of the intrinsic birefringence of (100)- or (111)-lenses, becomes most noticeable if the light rays have large aperture angles inside the lenses. This is the case for objectives with an image-side numerical aperture of more than 0.7, in particular more than 0.8.

The magnitude of the intrinsic birefringence increases noticeably with a smaller working wavelength. For example in comparison to a wavelength of 248 nm, the intrinsic birefringence increases more than sixfold at a wavelength of 193 nm, and more than twentyfold at a wavelength of 157 nm. The invention can therefore be used to particular advantage if the working wavelength $\lambda_0$ is smaller than 200 nm, and in particular if it is smaller than 160 nm.

Objectives designed according to the inventive method can be used advantageously in microlithography projection systems which include a light source, an illumination system, a mask-positioning system, a mask with a structure, a projection objective, an object-positioning system, and a light-sensitive substrate.

A microlithography projection system of this type serves to manufacture micro-structured semiconductor components.

BRIEF DESCRIPTION OF THE DRAWINGS

The invention will be explained in more detail hereinafter with reference to the drawings, wherein

FIG. 6 represents the lens section of a refractive projection objective according to the second embodiment;

DETAILED DESCRIPTION OF PREFERRED EMBODIMENTS

Figure 1:
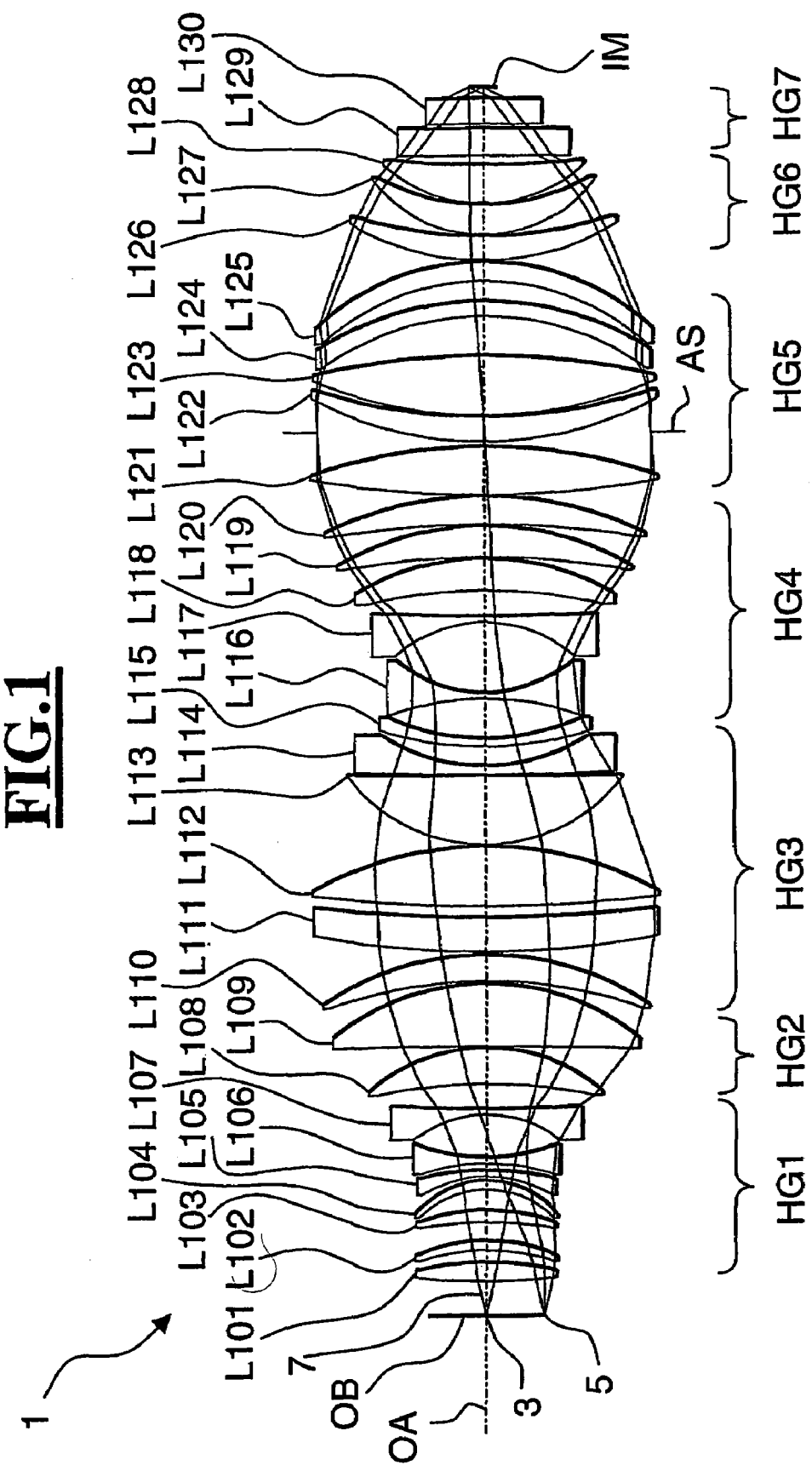
FIG. 1 represents the lens section of a refractive projection objective according to the first embodiment.

FIG. 1 represents in the form of a lens section a first embodiment of an objective 1 whose optical data were determined by the numerical optimizing method in accordance with the invention. The objective 1 is a refractive projection objective for a microlithography projection system designed for the working wavelength of 157 nm. The optical data for this objective are listed in Table 1. The lenses L101 to L130 of this objective consist of calcium fluoride crystal. The image-side numerical aperture of the objective is 0.9. The object field, which is centered on the optical axis OA has a diameter of 92.4 mm. Located on the optical axis OA is the central object point 3, while the object point 5 is located at the border of the object field. The imaging scale factor of the objective 1 between the object plane OB and the image plane IM is 0.25. The imaging performance of the objective 1 is corrected to such a high degree that for all image points of the object field the mean deviation of the wave front from an ideal spherical wave is smaller than 6 m$\lambda$ in relation to a working wavelength of 157 nm, if only those aberrations are taken into account that are caused by the lens geometry. The principal-ray-induced and coma-induced distortion is smaller than 3 nm for all image points.

Figure 7:
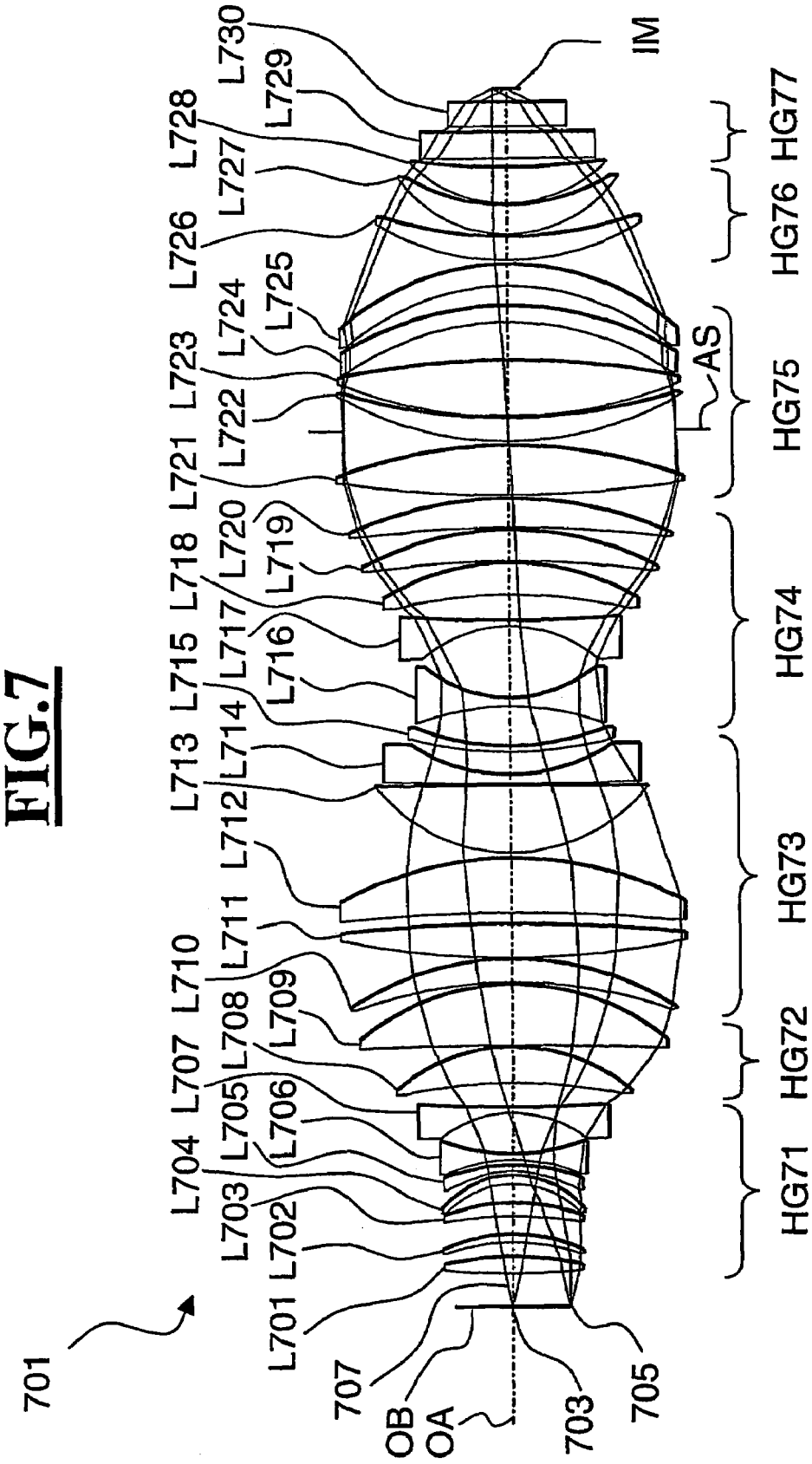
FIG. 7 represents the lens section of a refractive projection objective according to the third embodiment.

A practical example from the patent application WO 01/50171 (U.S. Ser. No. 10/177,580), owned by the same assignee as the present application, was chosen as the starting system for the optimization of the objective 1. The starting system is shown in FIG. 7 of WO 01/50171. The optical data for the starting system are listed in Table 6 of WO 01/50171. A more detailed description of the design and function of the starting system, i.e., of the objective to be optimized, may be found in the patent application WO 01/50171. The working wavelength, imaging scale ratio, size of the image field and numerical aperture of the starting system all have the same values as in the objective 1. All lenses of the objective to be optimized consist of calcium fluoride crystal material. Particularly in high-performance objectives of this kind, it is a requirement that the harmful effects of intrinsic birefringence be reduced as much as possible.

The invention specifies that in the optimizing function a plurality of birefringence-related image aberrations be taken into account, in addition to the image aberrations such as for example the geometric distortion, also referred to as principal-ray-induced distortion, the coma-induced distortion, wave-front aberrations, telecentrism, and boundary conditions such as image field size and imaging scale ratio.

In practice, the birefringence-related image aberrations are determined by running the complete calculations for individual rays.

In the first embodiment, the outer aperture ray 7 was chosen for the mathematical analysis. The outer aperture ray 7 originates from an object point 3 and its ray height in the aperture stop plane is equal to the radius of the aperture stop AS. The relative ray aperture in the image plane IM equals 1.0.

The birefringence-related image aberrations, to the extent that they depend on parameters of the aperture ray 7, are only a function of geometric parameters, i.e., of optical path lengths $OP_L$, aperture angles $\theta_L$ and azimuth angles $\alpha_L$ of the outer aperture ray 7 in the lenses L101 to L130.

Figure 2:
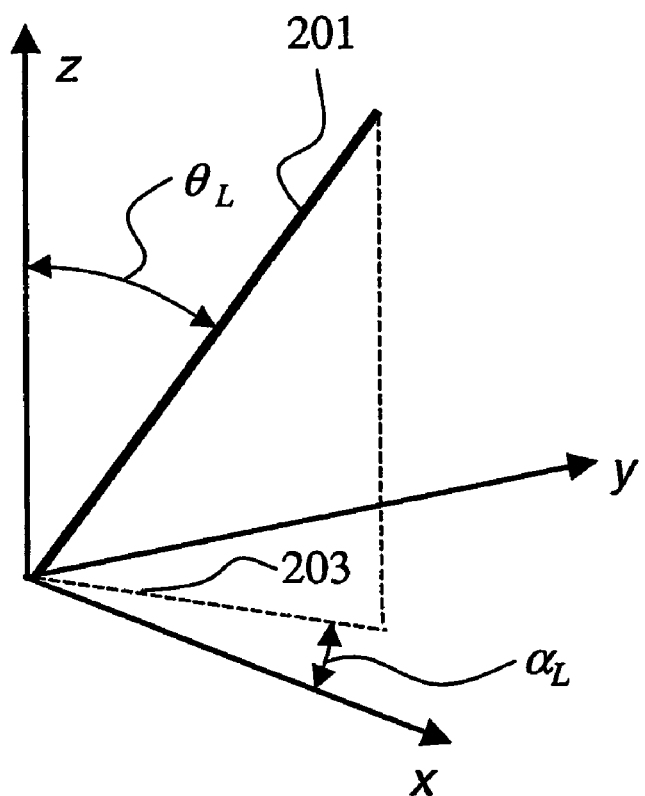
FIG. 2 represents a coordinate system to illustrate the definition of the aperture angle and the azimuth angle.

FIG. 2 serves to visualize the definition of the aperture angle $\theta_L$ and azimuth angle $\alpha_L$ of a ray 201 in a lens. The drawing shows the local x-y-z-coordinate system of a lens, where the z-axis is parallel to the direction of the lens axis. The ray 201 is directed at an aperture angle $\theta_L$ to the lens axis. The azimuth angle $\alpha_L$ of the ray 201 is obtained by projecting the ray direction into a plane whose normal vector points in the direction of the lens axis and by measuring the angle of the projected ray direction 203 relative to a reference direction of the lens, in this case represented by the x-axis. The reference direction is fixed in the lens, and when the lens is rotated about the lens axis, the reference direction rotates along with the lens. In lenses whose lens axes are oriented in the crystallographic (100)- or (111)-direction, the reference direction in the present examples is oriented in the same direction as the projection of the crystallographic (110)-direction into the aforementioned plane whose normal vector points in the direction of the lens axis. The local x-axis does not need to have the same direction as the projection of the crystallographic (110)-direction. The essential point is that the local x-axis has a defined orientation in relation to the crystallographic orientation and that the relationship between the local x-axis and the crystal orientation is the same for all lenses with an equivalent crystal structure.

The birefringence-related image aberrations that are taken into account in the optimizing function are in all cases dependent on the ray factor $SP_L$ according to equation (1).

The functional dependency of the ray factor $SP_L$ on the aperture angle $\theta_L$, i.e., the proportionality $SP_L \propto \sin^2 \theta_L \cdot (7 \cdot \cos^2 \theta_L - 1)$, is the same as the functional dependency of the effective birefringence distribution $\Delta n(\theta_L)$ on the aperture angle $\theta_L$ of a ray in a fluoride crystal lens. FIGS. 3 to 5 support the discussion which follows below of the effective birefringence distribution $\Delta n_{eff}(\theta_L)$ of a calcium fluoride lens that is used according to the invention and whose lens axis is oriented, respectively, in the crystallographic (100)-, (111)-, or (110)-direction.

Figure 3A:
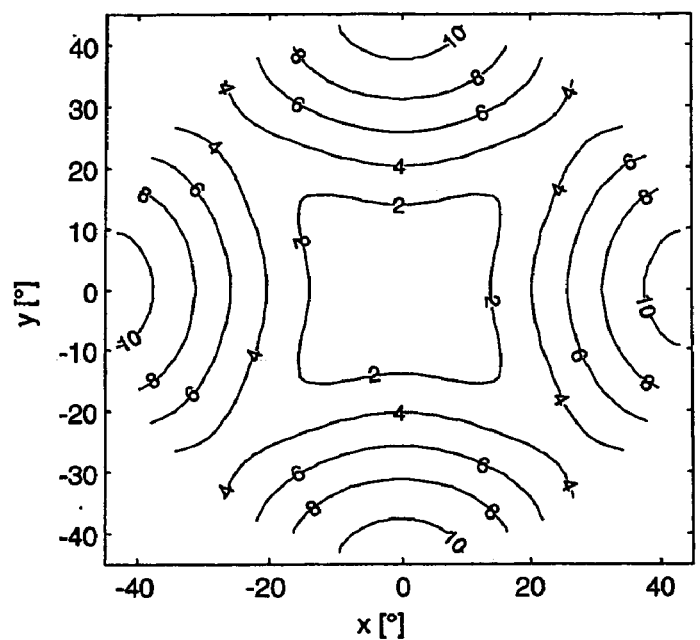
FIGS. 3A-E illustrate the birefringence distribution for (100)-lenses in different representations, as well as the effective birefringence distribution for a homogeneous group of (100)-lenses.
Figure 3B:
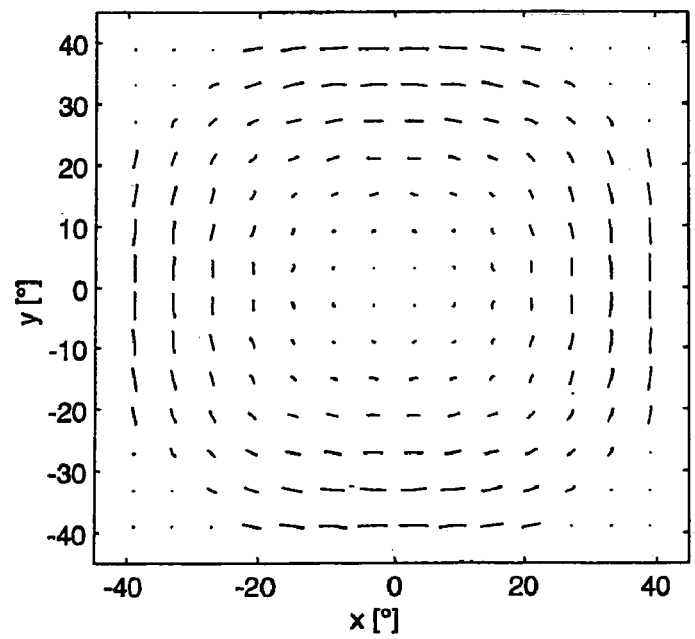

FIGS. 3A and 3B illustrate the birefringence distribution $\Delta n(\alpha_L, \theta_L)$ for (100)-lenses of calcium fluoride.

The contour lines in FIG. 3A indicate the amount of the intrinsic birefringence in nm/cm as a function of the aperture angle $\theta_L$ and the azimuth angle $\alpha_L$. The representations of the angles in FIGS. 3A to 3D are correlated to the local pupil coordinate system through the equations $\theta_L^2 = x^2 + y^2$ and $\alpha_L = \arctan(y/x)$.

Each line in FIG. 3B represents the amount and direction of the birefringence for a ray direction that is defined by the aperture angle $\theta_L$ and the azimuth angle $\alpha_L$. The length of each line is in proportion to the amount of the birefringence as represented by the difference between the principal axes of the elliptical section, while the direction of each line indicates the orientation of the longer of the two principal axes of the elliptical section. The elliptical section is obtained as the intersection between the index ellipsoid for a light ray in the direction $(\theta_L, \alpha_L)$ and a plane that contains the center point of the ellipsoid and is orthogonal to the light ray direction.

The four-fold azimuthal symmetry of the birefringence distribution of (100)-lenses is made evident by FIGS. 3A and 3B. The intrinsic birefringence has its maxima at the azimuth angles 0°, 90°, 180°, and 270°.

If the (100)-lenses that are combined into a homogeneous group are set at appropriately rotated position relative to each other, one can achieve a condition where the optical path difference for two mutually orthogonal states of polarization which occurs in a light ray is almost exclusively a function of the aperture angle $\theta_L$ of the light ray in relation to the optical axis. As an approximation, the lenses of this homogeneous group can be assigned an effective birefringence distribution $\Delta n_{eff}(\theta_L)$ which is a function of the aperture angle $\theta_L$ alone. This approximation becomes an exact representation in the case where the (100)-lenses are planar-parallel plates. With real lenses, the approximation can be achieved to a satisfactory degree at least for certain aperture angles $\theta_L$.

Figure 3C:
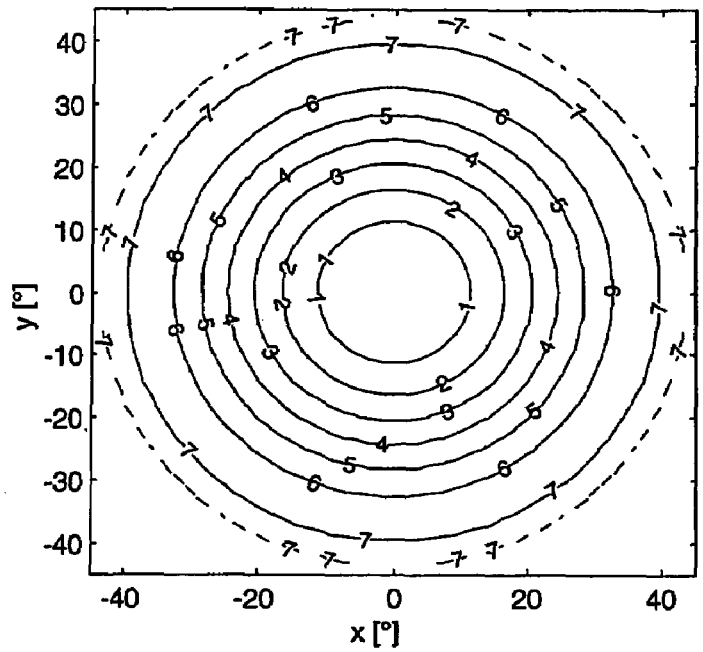
Figure 3D:
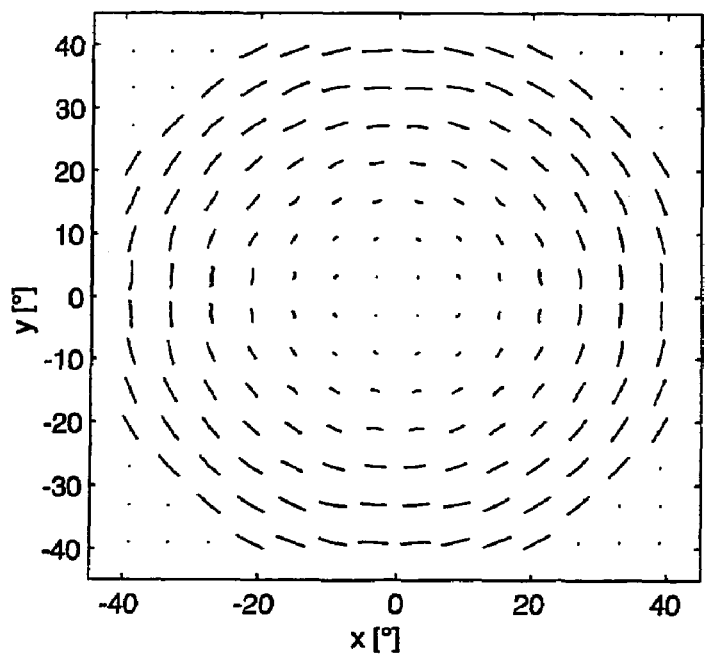

FIGS. 3C and 3D represent the magnitude and direction of the effective birefringence for different ray directions in a homogeneous group of (100)-lenses.

Figure 3E:
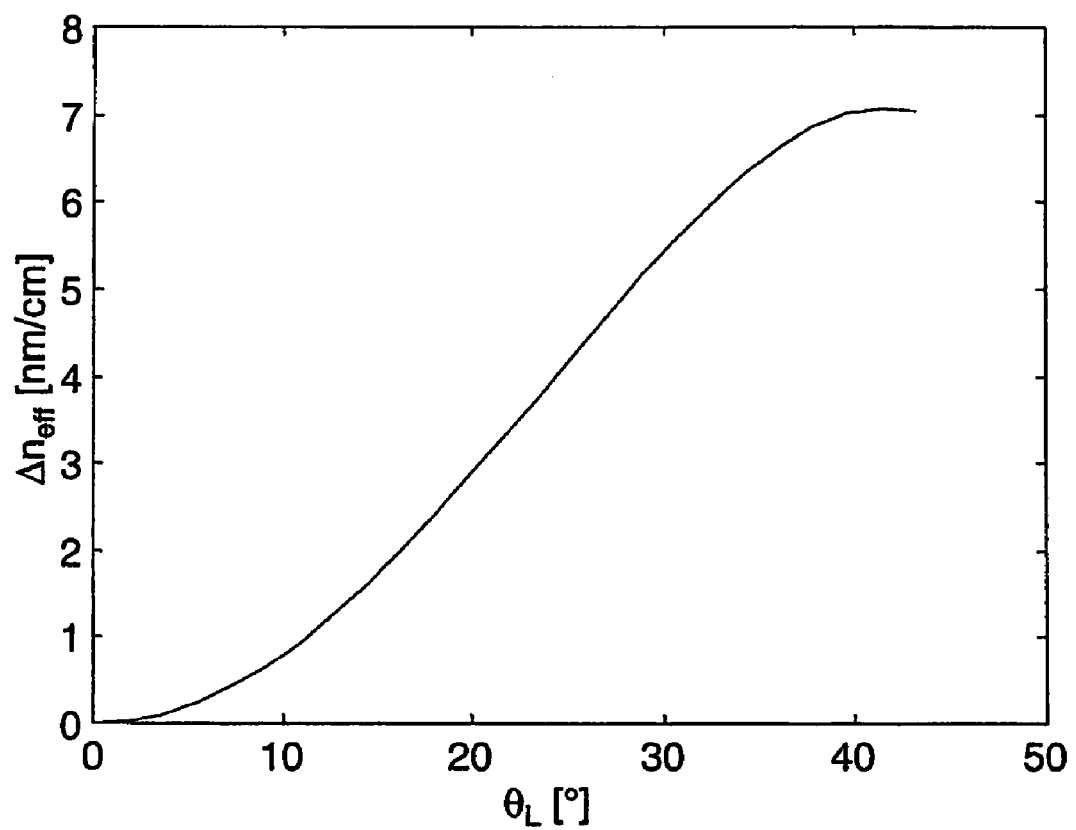

FIG. 3E represents a radial profile of the effective birefringence distribution. The profile curve can be described by the equation:

$$\Delta n_{eff}(\theta_L) = MA_L \cdot DI_L \cdot \sin^2 \theta_L \cdot (7 \cdot \cos^2 \theta_L - 1), \quad (11)$$

wherein the material factor $MA_L$ equals $-11$ nm/cm and the orientation factor $DI_L$ equals $-0.5$. For aperture angles $\theta_L < 40°$, the preceding equation can be approximated by $$\Delta n_{eff}(\theta_L) \approx MA_L \cdot DI_L \cdot (9/7) \cdot \sin^2(2.17 \cdot \theta_L) \quad (12)$$

Figure 4A:
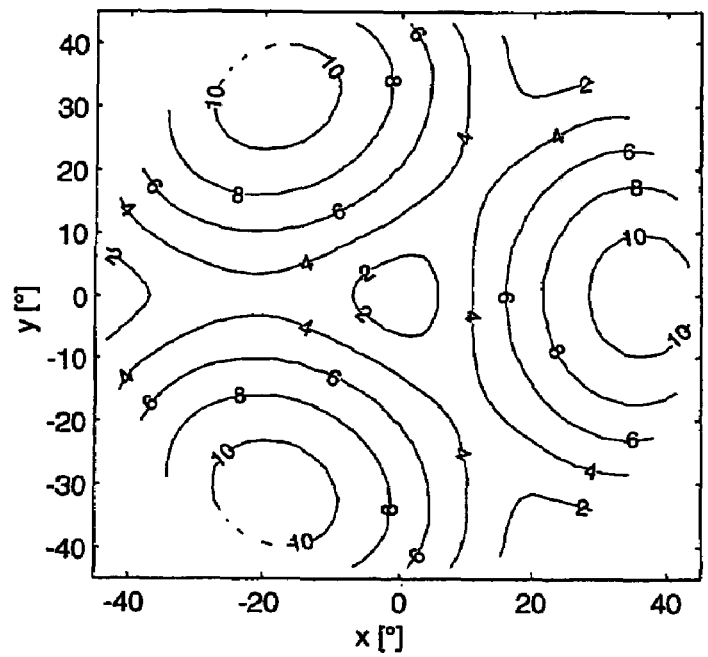
FIGS. 4A-E illustrate the birefringence distribution for (111)-lenses in different representations, as well as the effective birefringence distribution for a homogeneous group of (111)-lenses.
Figure 4B:
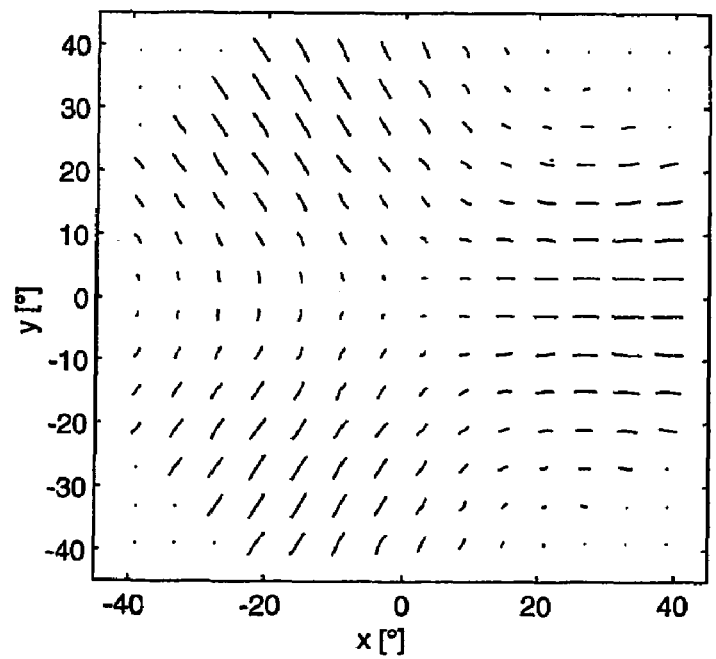

FIGS. 4A and 4B illustrate the birefringence distribution $\Delta n(\theta_L, \alpha_L)$ for (111)-lenses of calcium fluoride. The form of representation is analogous to FIGS. 3A and 3B. The three-fold azimuthal symmetry of the birefringence distribution of (111)-lenses is made evident by FIGS. 4A and 4B. The intrinsic birefringence has its maxima at the azimuth angles 0°, 120°, and 240°.

By rotating the (111)-lenses in relation to each other about the lens axes, it is likewise possible to produce an effective birefringence distribution $\Delta n_{eff}(\theta_L)$ which depends on the aperture angle $\theta_L$ alone.

Figure 4C:
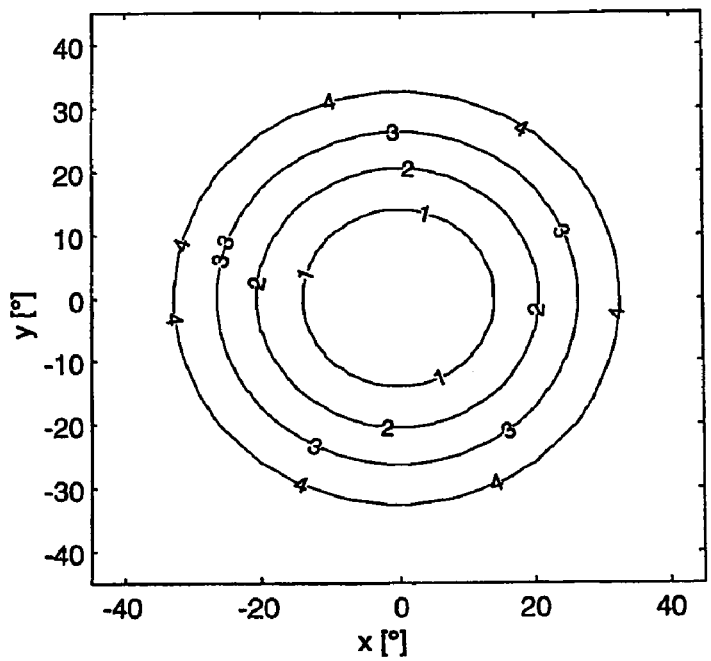
Figure 4D:
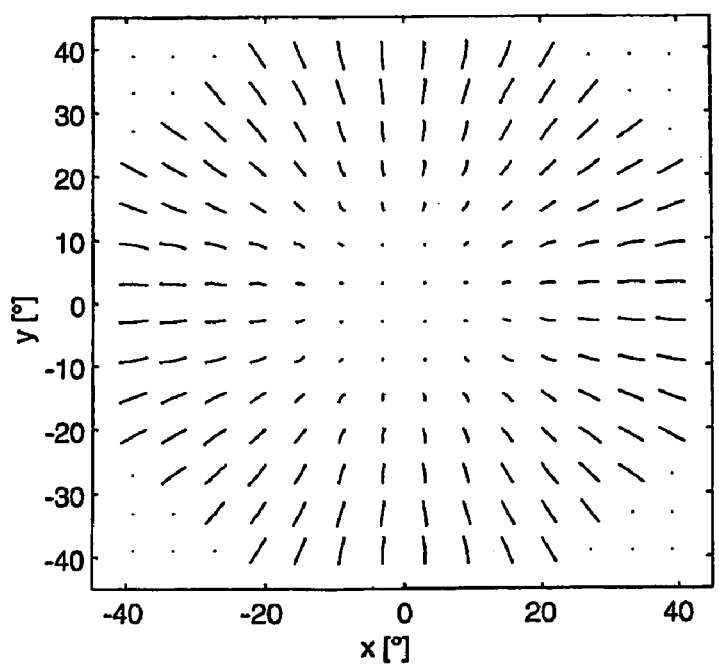

FIGS. 4C and 4D represent the magnitude and direction of the effective birefringence for different ray directions in a homogeneous group of (111)-lenses.

Figure 4E:
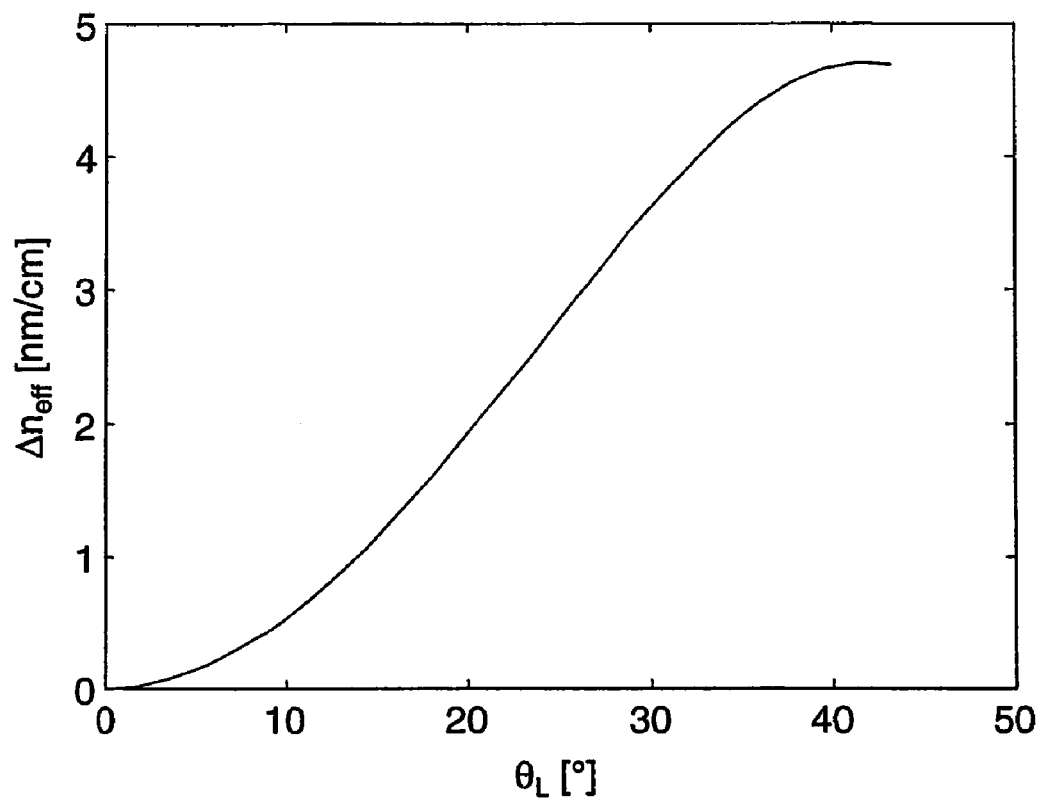

FIG. 4E represents a radial profile of the effective birefringence distribution. The profile curve can likewise be described by equation (11), wherein the material factor $MA_L$ equals $-11$ nm/cm and the orientation factor $DI_L$ equals $+\frac{1}{3}$.

Figure 5A:
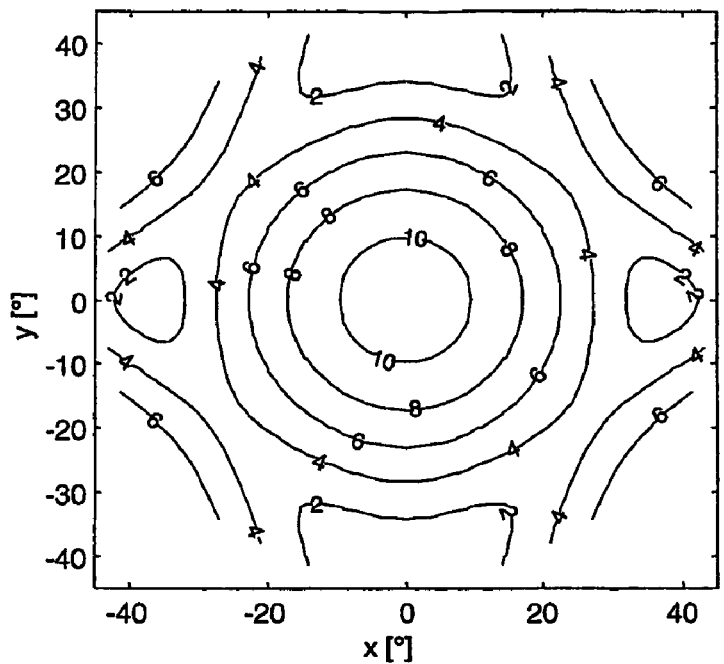
FIGS. 5A-E illustrate the birefringence distribution for (110)-lenses in different representations, as well as the effective birefringence distribution for a homogeneous group of (110)-lenses.
Figure 5B:
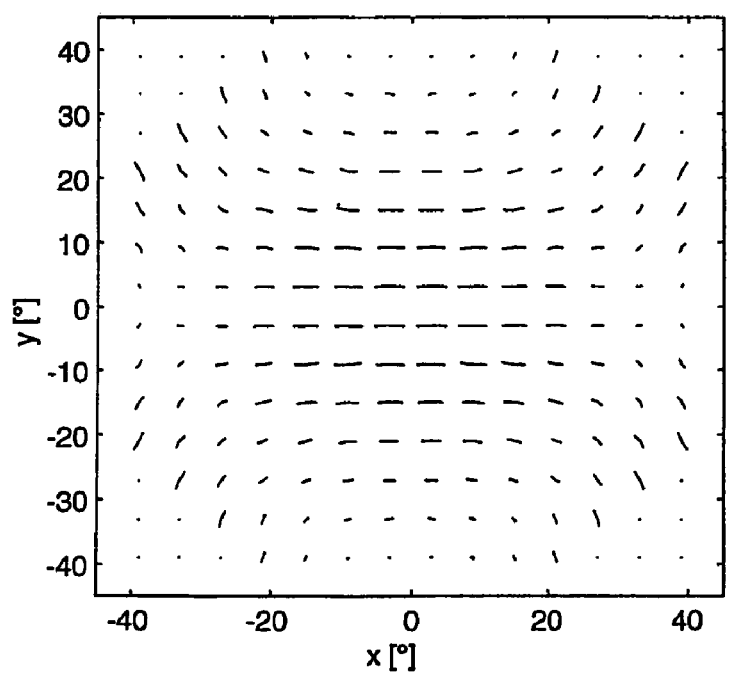

FIGS. 5A and 5B illustrate the birefringence distribution $\Delta n(\theta_L, \alpha_L)$ for (110)-lenses of calcium fluoride. The form of representation is analogous to FIGS. 3A and 3B. The two-fold azimuthal symmetry of the birefringence distribution of (110)-lenses is made evident by FIGS. 5A and 5B. The intrinsic birefringence has its maxima at the azimuth angles 0° and 180°.

By rotating the (110)-lenses in relation to each other about the lens axes, it is likewise possible to produce an effective birefringence distribution $\Delta n_{\mathit{eff}}(\theta_L)$ which depends on the aperture angle $\theta_L$ alone. However, in order to achieve this result to an ideal degree, at least four suitable (110)-lenses are required. But even with only two suitable and mutually rotated (110)-lenses, the effective birefringence distribution shows a dependency on the azimuth angle $\alpha_L$ only at larger aperture angles $\theta_L$.

Figure 5C:
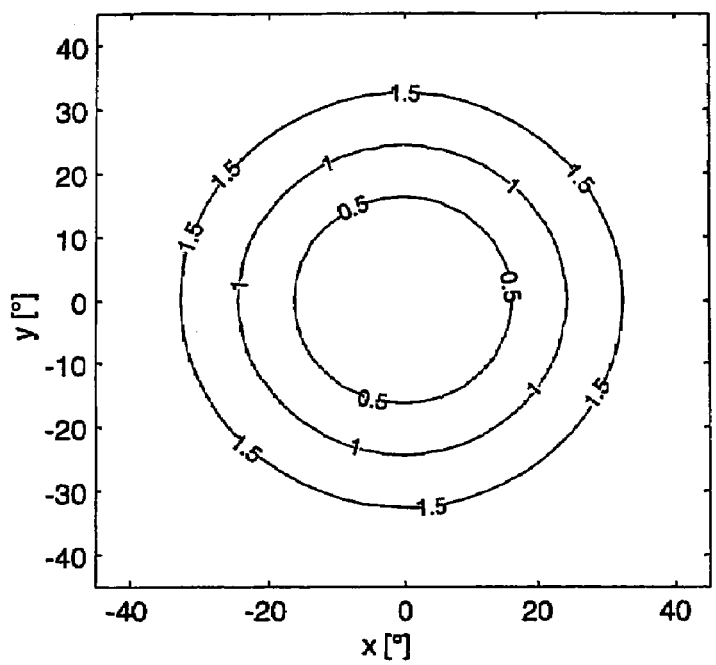
Figure 5D:
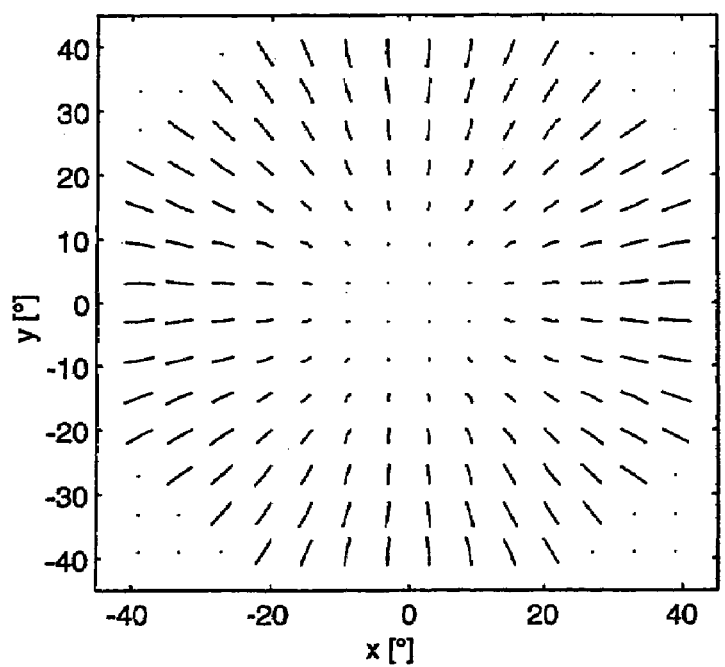

FIGS. 5C and 5D represent the magnitude and direction of the effective birefringence for different ray directions in a homogeneous group of (110)-lenses.

Figure 5E:
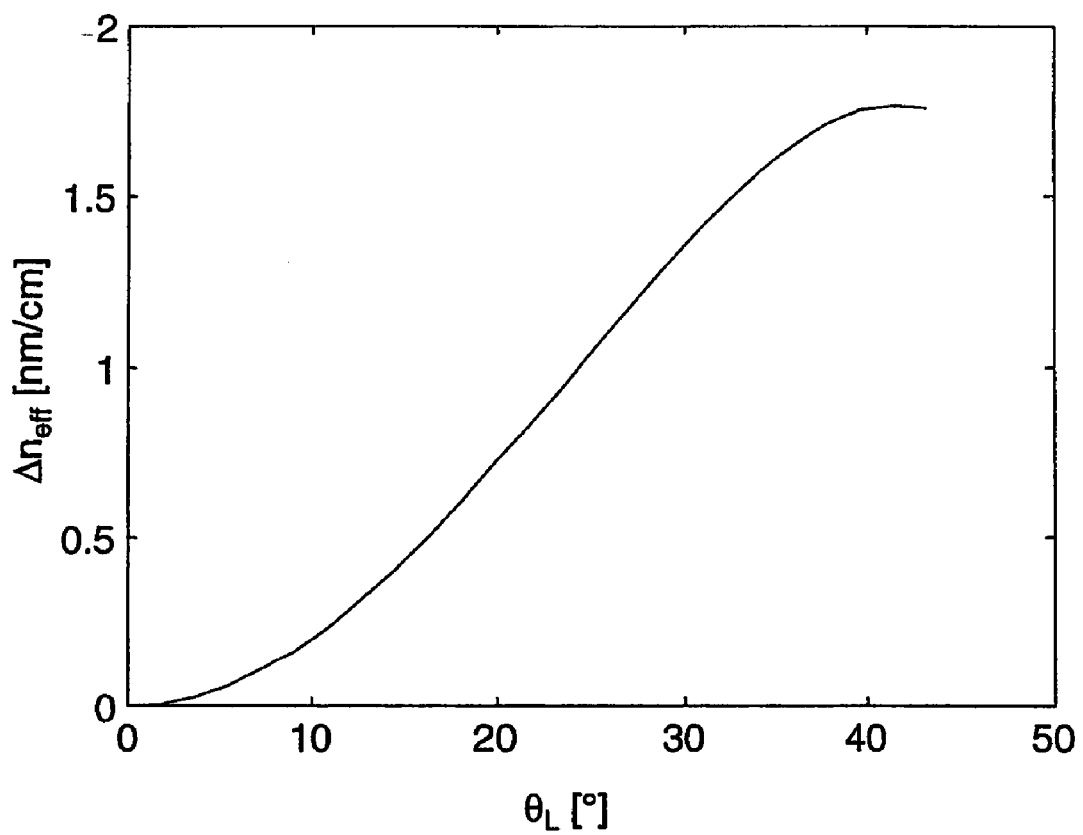

FIG. 5E represents a radial profile of the effective birefringence distribution. The profile curve can likewise be described by equation (11), wherein the material factor $MA_L$ equals $-11$ nm/cm and the orientation factor $DI_L$ equals $+\frac{1}{8}$.

In a ray passing through a fluoride crystal lens that is used according to the invention, the effective optical path difference between two mutually orthogonal states of polarization is obtained by multiplying the ray path length $OP_L$ with the effective birefringence value $\Delta n_{\mathit{eff}}$ for the aperture angle $\theta_L$ of the ray. The effective optical path difference is thus proportionate to the ray factor $SP_L$ according to equation (1).

In the first embodiment, the harmful influence of intrinsic birefringence is reduced by combining two mutually rotated (100)-lenses of calcium fluoride with mutually rotated (111)-lenses of calcium fluoride. All of the lenses L101 to L130 in this example have the same material parameter $MA_L$.

The first step in the optimizing method consists of assigning orientation factors $DI_L$ to the lenses L101 to L130 of the given starting system, in other words, designating the lenses whose lens axes are to be oriented in the crystallographic (100)-direction and those whose lens axes are to be oriented in the crystallographic (111)-direction. The assignment of orientation factors is made in such a way that there are always at least two adjacent lenses with the same orientation factor $DI_L$. The arrangement and the dimensions of the lenses of the objective remain unchanged for the time being.

In a second step of the optimizing method, the (100)-lenses are assigned to a first homogeneous group and the (111)-lenses are assigned to a second homogeneous group.

In a third step of the optimizing method, angles of rotation $\gamma_L$ are assigned to the respective fluoride crystal lenses of the first homogeneous group and the second homogeneous group. In the first embodiment, the angles of rotation assigned to the individual (100)-lenses are either 0° or 45°, and the angles of rotation assigned to the individual (111)-lenses are either 0° or 60°.

In a fourth step of the optimizing method, the optical retardation $$OR_{LG} = \sum_{L \text{ in } LG} BF_L$$

is calculated for the lenses L101 to L130. The calculation is based on an outer aperture ray 7.

In a fifth step of the optimizing method, the respective asymmetries of the retardation $$ORAS_{HGI} = \left| \sum_{L \text{ in } HGI} (MA_L \cdot DI_L \cdot DS_L \cdot AP_L \cdot SP_L) \right| \text{ and}$$

$$ORAS_{HGII} = \left| \sum_{L \text{ in } HGII} (MA_L \cdot DI_L \cdot DS_L \cdot AP_L \cdot SP_L) \right|$$

are calculated for the lenses of the first homogeneous group and second homogeneous group.

The sixth step of the optimizing method consists of a test whether $OR_{LG} < \frac{1}{4} \cdot \lambda_0$, wherein $\lambda_0$ represents the working wavelength of the objective, as well as additional tests whether $ORAS_{LGI} < \frac{1}{4} \cdot \lambda_0$ and $ORAS_{LGII} < \frac{1}{4} \cdot \lambda_0$. If these threshold values are exceeded, the optimizing procedure is repeated with other orientation factors $DI_L$ for the lenses L101 to L130.

The different assignment possibilities in the foregoing steps are evaluated through a numerical optimizing program. Although the numerical optimizing program may not necessarily find the optimal solution, it will yield a solution in which the foregoing criteria are below the threshold values. A closely related problem in the mathematical literature is known as "the problem of the traveling salesman" where the shortest possible route has to be found to visit a given set of cities on a geographical map.

The optimization may be accomplished by one of the following methods, which are known from the literature under the terms:
1. Monte Carlo Search,
2. Simulated Annealing
3. Threshold Accepting
4. Simulated annealing with reheating
5. Genetic algorithm Should these methods fail to deliver a solution within a finite time period, the problem may also be solved by raising the threshold values.

In order to obtain a better starting system for the fine optimization, it is also possible to lower the threshold values to $\frac{1}{10} \cdot \lambda_0$.

In the case of the first embodiment, a solution is found for the following orientations of the lens axes:
first homogeneous group with (100)-lenses: L108, L109, L129, L130; and
second homogeneous group with (111)-lenses: L101 to L107, L110 to L128.

In a seventh step of the method, the degrees of freedom represented by the arrangement and dimensions of the lenses of the objective are used to achieve a further optimization of the birefringence-related image aberrations $OR_{LG}$, $ORAS_{HGI}$ and $ORAS_{HGII}$. This step can be performed for example with the aforementioned optimizing programs "Code V®" or "ZEMAX®", where the image aberrations $OR_{LG}$, $ORAS_{HGI}$ and $ORAS_{HGII}$ are treated as user defined image aberrations in the optimizing function.

In an eighth step of the optimizing method, the first homogeneous group and the second homogeneous group are each split up into further homogeneous groups. In other words, further homogeneous groups are formed, each with at least two lenses. The purpose of splitting the first and second homogeneous groups into further homogeneous groups is to obtain an arrangement where a homogeneous group is made up only of neighboring lenses. Furthermore, increasing the number of homogeneous groups has the advantage that the angles of rotation of the homogeneous groups in relation to each other can be used as degrees of freedom in the adjustment process of the objective. The arrangement and dimensions of the optical elements of the lenses of the objective remain again unchanged at the outset.

As a ninth step in the optimizing method, the asymmetry $$ORAS_{HG_n} = \left| \sum_{L \, aus \, HG_n} (MA_L \cdot DI_L \cdot DS_L \cdot AP_L \cdot SP_L) \right|$$

of the optical retardation is calculated for the lenses of the n-th homogeneous group.

The tenth step of the optimizing method consists of a test whether $ORAS_{HG_n} < \frac{1}{4} \cdot \lambda_0$ for all of the homogeneous groups. If these threshold values are exceeded, the optimizing procedure is repeated from the eight step, splitting the first and second homogeneous groups differently into further homogeneous groups.

After a way of splitting up the objective into homogeneous groups has been determined, an eleventh step of the method follows in which the degrees of freedom represented by the arrangement and dimensions of the lenses of the objective are again used to achieve a further optimization of the birefringence-related image aberrations $OR_{LG}$ and the individual asymmetries $ORAS_{HG_n}$ of the optical retardation. This step can be performed for example with the aforementioned optimizing programs "Code V®" or "ZEMAX®", where the image aberrations $OR_{LG}$ and $ORAS_{HG_n}$ for the individual homogeneous groups are treated as user defined image aberrations in the optimizing function.

The optimizing method can also be abbreviated with a modified second step in which the (100)-lenses are assigned to one or more homogeneous groups and the (111)-lenses are likewise assigned to one or more homogeneous groups. Two purposes are pursued in this step: For one, to allocate only neighboring lenses to homogeneous groups, and second, to increase the number of homogeneous groups. Steps 8 to 11 are dropped under this abbreviated version of the optimizing method.

In summary, with a given starting system as a point of departure, a solution was found for the objective 1 wherein the harmful effects of the intrinsic birefringence of the fluoride crystal lenses cause almost no polarization-dependent reduction of the imaging performance of the objective. This was achieved by orienting the lens axes of the lenses L108, L109, L129 and L130 in the crystallographic (100)-direction and orienting the lens axes of the remaining lenses in the crystallographic (111)-direction, and by appropriately adapting the arrangement and dimensions of the lenses through the optimizing method according to the invention.

The essential characterizing data of the objective 1 according to the invention are presented in Table 2. The quantities that depend on ray parameters have been calculated for the outer aperture ray 7 with the relative ray aperture of 1.0. The columns of Table 2 contain the following data:

aperture angle $\theta_L$ in [°],
ray path length $OP_L$ in [mm],
ray factor $SP_L$ in [mm],
orientation factor $DI_L$,
material factor $MA_L$ in [nm/cm],
birefringence factor $BF_L$ in [nm],
angle of rotation $\gamma_L$ [°],
symmetry factor $SF_{DI\_L}$,
azimuth angle $\alpha_L$ in [°], as well as
azimuth parameter $AP_L$.

The reference direction of a lens is parallel to a direction that is defined by projecting the crystallographic (110)-direction into a plane whose normal vector points in the crystallographic (100)- or (111)-direction, depending on the direction of the lens axis.

TABLE 2

| Lens | $\theta_L$ [°] | $OP_L$ [mm] | $SP_L$ [mm] | $DI_L$ | $MA_L$ [nm/mm] | $BF_L$ [nm] | $\gamma_L$ [°] | $SF_{DI\_L}$ | $\alpha_L$ [°] | $AP_L$ |
|---|---|---|---|---|---|---|---|---|---|---|
| L101 | 8.15 | 15.92 | 1.87 | 0.33 | −1.1 | −0.69 | 60 | 3 | 60 | 1 |
| L102 | 8.68 | 8.72 | 1.16 | 0.33 | −1.1 | −0.43 | 60 | 3 | 60 | 1 |
| L103 | 7.74 | 10.75 | 1.14 | 0.33 | −1.1 | −0.42 | 60 | 3 | 60 | 1 |
| L104 | 10.74 | 7.48 | 1.50 | 0.33 | −1.1 | −0.55 | 60 | 3 | 60 | 1 |
| L105 | 9.42 | 6.87 | 1.07 | 0.33 | −1.1 | −0.39 | 60 | 3 | 60 | 1 |
| L106 | 10.36 | 8.98 | 1.68 | 0.33 | −1.1 | −0.61 | 60 | 3 | 60 | 1 |
| L107 | 21.80 | 12.83 | 8.91 | 0.33 | −1.1 | −3.27 | 0 | 3 | 0 | 1 |
| L108 | 25.49 | 20.40 | 17.77 | −0.5 | −1.1 | 9.77 | 0 | 4 | 0 | 1 |
| L109 | 16.51 | 39.96 | 17.53 | −0.5 | −1.1 | 9.64 | 45 | 4 | 45 | 1 |
| L110 | 12.43 | 14.78 | 3.89 | 0.33 | −1.1 | −1.43 | 0 | 3 | 0 | 1 |
| L111 | 2.35 | 25.63 | 0.26 | 0.33 | −1.1 | −0.09 | 0 | 3 | 0 | 1 |
| L112 | 2.30 | 30.95 | 0.30 | 0.33 | −1.1 | −0.11 | 0 | 3 | 0 | 1 |
| L113 | 18.47 | 30.77 | 16.36 | 0.33 | −1.1 | −6.00 | 0 | 3 | 180 | −1 |
| L114 | 18.84 | 22.13 | 12.17 | 0.33 | −1.1 | −4.46 | 60 | 3 | 240 | −1 |
| L115 | 14.22 | 9.98 | 3.36 | 0.33 | −1.1 | −1.23 | 0 | 3 | 180 | −1 |
| L116 | 1.35 | 30.01 | 0.10 | 0.33 | −1.1 | −0.04 | 0 | 3 | 180 | −1 |
| L117 | 26.48 | 32.58 | 29.85 | 0.33 | −1.1 | −10.94 | 0 | 3 | 0 | 1 |
| L118 | 33.64 | 14.03 | 16.58 | 0.33 | −1.1 | −6.08 | 60 | 3 | 60 | 1 |
| L119 | 26.60 | 7.07 | 6.52 | 0.33 | −1.1 | −2.39 | 60 | 3 | 60 | 1 |
| L120 | 19.37 | 6.02 | 3.47 | 0.33 | −1.1 | −1.27 | 60 | 3 | 60 | 1 |
| L121 | 6.66 | 6.55 | 0.52 | 0.33 | −1.1 | −0.19 | 60 | 3 | 60 | 1 |
| L122 | 10.40 | 8.76 | 1.65 | 0.33 | −1.1 | −0.60 | 60 | 3 | 240 | −1 |
| L123 | 12.05 | 9.01 | 2.24 | 0.33 | −1.1 | −0.82 | 0 | 3 | 180 | −1 |
| L124 | 0.04 | 17.43 | 0.00 | 0.33 | −1.1 | −0.00 | 0 | 3 | 0 | 1 |
| L125 | 5.50 | 15.89 | 0.87 | 0.33 | −1.1 | −0.32 | 0 | 3 | 0 | 1 |
| L126 | 24.13 | 9.23 | 7.46 | 0.33 | −1.1 | −2.73 | 0 | 3 | 180 | −1 |
| L127 | 35.54 | 8.14 | 10.00 | 0.33 | −1.1 | −3.67 | 0 | 3 | 180 | −1 |
| L128 | 39.30 | 13.40 | 17.16 | 0.33 | −1.1 | −6.29 | 60 | 3 | 240 | −1 |

TABLE 2-continued

| Lens | $\theta_L$ [°] | $OP_L$ [mm] | $SP_L$ [mm] | $DI_L$ | $MA_L$ [nm/mm] | $BF_L$ [nm] | $\gamma_L$ [°] | $SF_{DI\_L}$ | $\alpha_L$ [°] | $AP_L$ |
|---|---|---|---|---|---|---|---|---|---|---|
| L129 | 35.27 | 26.67 | 32.59 | −0.5 | −1.1 | 17.93 | 45 | 4 | 45 | 1 |
| L130 | 35.27 | 26.45 | 32.33 | −0.5 | −1.1 | 17.78 | 0 | 4 | 0 | 1 |
| Sum | | | | | | 0.10 | | | | |

The total optical retardation $$OR_{LG} = \sum_{L101\,to\,L130} BF_L$$

of the lenses is ±0.1 nm, thus smaller than 1% of the working wavelength. The total for the asymmetry of the optical retardation $$ORAS_{LG} = \left| \sum_{L101\,bis\,L130} (DS_L \cdot AP_L \cdot BF_L) \right|$$

is 1.96 nm, thus smaller than 2% of the working wavelength.

The lenses of the objective 1 are assigned to the five homogeneous groups of (111)-lenses HG1, HG3, HG4, HG5 and HG6 and to the two homogeneous groups HG2 and HG7 of (100)-lenses.

The lenses are assigned to the homogeneous groups as shown in Table 3.

TABLE 3

| Homogeneous group | Lenses | Crystallographic orientation of the lens axis | ORAS [nm] |
|---|---|---|---|
| HG1 | L101–L107 | (111) | 0.49 |
| HG2 | L108–L109 | (100) | 0.24 |
| HG3 | L110–L114 | (111) | 0.26 |
| HG4 | L115–L120 | (111) | 0.18 |
| HG5 | L121–L125 | (111) | 0.24 |
| HG6 | L126–L128 | (111) | 0.30 |
| HG7 | L129–L130 | (100) | 0.26 |

The asymmetry $$ORAS_{HG_n} = \left| \sum_{L\,in\,HG_n} (MA_L \cdot DI_L \cdot DS_L \cdot AP_L \cdot SP_L) \right|$$

of the optical retardation in all groups is smaller than 1% of the working wavelength.

In each of the homogeneous groups HG2, HG3, HG4, HG6 and HG7 there is one lens whose birefringence factor $BF_L$ is larger that 3% of the working wavelength $\lambda_0 = 157$ nm.

FIG. 6 illustrates a second embodiment in which the invention was put into practice in an objective 601. The central object point 603 is located on the optical axis OA. One difference to the first embodiment is that the optimization was performed by considering not only an outer aperture ray but two outer aperture rays. The birefringence-related image aberrations were optimized not only for the outer aperture ray 607 which has a relative ray aperture of 1.0 in the image plane IM, but also for the outer aperture ray 609 which has a relative ray aperture of 0.7 in the image plane IM.

The optical data of the objective 601 are listed in Table 4.

Table 5 presents the essential data that characterize the objective 601 in accordance with the invention. The quantities that depend on the ray parameters were calculated for the outer aperture ray 607 with the relative ray aperture 1.0 and the outer aperture ray with the relative ray aperture 0.7.

TABLE 5

| Lens | $DI_L$ | $MA_L$ [nm/mm] | $\theta_L$ [°] Outer aperture ray 607 Rel. ray aperture = 1.0 | $OP_L$ [mm] | $SP_L$ [mm] | $BF_L$ [nm] | $\theta_L$ [°] Outer aperture ray 609 Rel. ray aperture = 0.7 | $OP_L$ [mm] | $SP_L$ [mm] | $BF_L$ [nm] | $\gamma_L$ [°] | $SF_{DI\_L}$ | $\alpha_L$ [°] | $AP_L$ |
|---|---|---|---|---|---|---|---|---|---|---|---|---|---|---|
| L601 | 0.33 | −1.1 | 8.11 | 12.55 | 1.47 | −0.54 | 5.67 | 12.56 | 0.73 | −0.27 | 60 | 3 | 60 | 1 |
| L602 | 0.33 | −1.1 | 8.67 | 6.20 | 0.82 | −0.30 | 6.06 | 6.24 | 0.41 | −0.15 | 60 | 3 | 60 | 1 |
| L603 | 0.33 | −1.1 | 7.57 | 13.27 | 1.35 | −0.50 | 5.30 | 13.58 | 0.69 | −0.25 | 60 | 3 | 60 | 1 |
| L604 | 0.33 | −1.1 | 10.82 | 5.33 | 1.08 | −0.40 | 7.56 | 5.50 | 0.56 | −0.21 | 60 | 3 | 60 | 1 |
| L605 | 0.33 | −1.1 | 9.58 | 9.69 | 1.56 | −0.57 | 6.75 | 8.89 | 0.73 | −0.27 | 60 | 3 | 60 | 1 |
| L606 | 0.33 | −1.1 | 10.49 | 10.69 | 2.04 | −0.75 | 7.39 | 8.71 | 0.85 | −0.31 | 60 | 3 | 60 | 1 |
| L607 | 0.33 | −1.1 | 23.00 | 14.26 | 10.73 | −3.94 | 15.93 | 9.39 | 3.87 | −1.42 | 0 | 3 | 0 | 1 |
| L608 | −0.5 | −1.1 | 27.16 | 21.22 | 20.07 | 11.04 | 18.31 | 26.19 | 13.72 | 7.54 | 0 | 4 | 0 | 1 |
| L609 | −0.5 | −1.1 | 17.60 | 39.44 | 19.33 | 10.63 | 11.78 | 49.59 | 11.80 | 6.49 | 45 | 4 | 45 | 1 |
| L610 | 0.33 | −1.1 | 11.62 | 17.22 | 3.99 | −1.46 | 7.77 | 19.79 | 2.12 | −0.78 | 0 | 3 | 0 | 1 |
| L611 | 0.33 | −1.1 | 1.73 | 19.81 | 0.11 | −0.04 | 1.12 | 25.23 | 0.06 | −0.02 | 0 | 3 | 0 | 1 |
| L612 | 0.33 | −1.1 | 1.56 | 26.17 | 0.12 | −0.04 | 1.00 | 33.62 | 0.06 | −0.02 | 0 | 3 | 0 | 1 |
| L613 | 0.33 | −1.1 | 19.82 | 33.61 | 20.07 | −7.36 | 13.08 | 47.57 | 13.74 | −5.04 | 0 | 3 | 180 | −1 |
| L614 | 0.33 | −1.1 | 20.20 | 25.32 | 15.59 | −5.72 | 13.57 | 18.67 | 5.77 | −2.12 | 0 | 3 | 180 | −1 |

TABLE 5-continued

| Lens | $DI_L$ | $MA_L$ [nm/mm] | $\theta_L$ [°] | $OP_L$ [mm] | $SP_L$ [mm] | $BF_L$ [nm] | $\theta_L$ [°] | $OP_L$ [mm] | $SP_L$ [mm] | $BF_L$ [nm] | $\gamma_L$ [°] | $SF_{DL\_L}$ | $\alpha_L$ [°] | $AP_L$ |
|---|---|---|---|---|---|---|---|---|---|---|---|---|---|---|
| | | | Outer aperture ray 607 Rel. ray aperture = 1.0 | | | | Outer aperture ray 609 Rel. ray aperture = 0.7 | | | | | | | |
| L615 | 0.33 | −1.1 | 17.87 | 9.51 | 4.78 | −1.75 | 11.97 | 7.13 | 1.75 | −0.64 | 0 | 3 | 180 | −1 |
| L616 | 0.33 | −1.1 | 3.53 | 29.20 | 0.66 | −0.24 | 2.37 | 15.90 | 0.16 | −0.06 | 60 | 3 | 240 | −1 |
| L617 | 0.33 | −1.1 | 21.73 | 45.63 | 31.52 | −11.56 | 14.12 | 32.49 | 10.80 | −3.96 | 0 | 3 | 0 | 1 |
| L618 | 0.33 | −1.1 | 28.95 | 6.27 | 6.40 | −2.35 | 18.21 | 11.72 | 6.09 | −2.23 | 60 | 3 | 60 | 1 |
| L619 | 0.33 | −1.1 | 24.50 | 17.73 | 14.63 | −5.36 | 15.13 | 24.17 | 9.09 | −3.33 | 60 | 3 | 60 | 1 |
| L620 | 0.33 | −1.1 | 16.99 | 32.55 | 15.01 | −5.50 | 10.03 | 40.58 | 7.12 | −2.61 | 0 | 3 | 0 | 1 |
| L621 | 0.33 | −1.1 | 5.39 | 17.15 | 0.90 | −0.33 | 2.68 | 35.09 | 0.46 | −0.17 | 0 | 3 | 0 | 1 |
| L622 | 0.33 | −1.1 | 10.49 | 5.05 | 0.97 | −0.35 | 7.07 | 21.98 | 1.96 | −0.72 | 0 | 3 | 180 | −1 |
| L623 | 0.33 | −1.1 | 11.47 | 5.19 | 1.18 | −0.43 | 7.68 | 20.67 | 2.17 | −0.80 | 0 | 3 | 180 | −1 |
| L624 | 0.33 | −1.1 | 0.86 | 9.56 | 0.01 | 0.00 | 3.03 | 6.30 | 0.11 | −0.04 | 0 | 3 | 0 | 1 |
| L625 | 0.33 | −1.1 | 6.84 | 12.84 | 1.08 | −0.39 | 1.35 | 13.54 | 0.05 | −0.02 | 0 | 3 | 0 | 1 |
| L626 | 0.33 | −1.1 | 22.16 | 5.73 | 4.08 | −1.50 | 14.54 | 12.23 | 4.28 | −1.57 | 0 | 3 | 180 | −1 |
| L627 | 0.33 | −1.1 | 29.43 | 5.59 | 5.82 | −2.13 | 19.01 | 9.31 | 5.19 | −1.90 | 0 | 3 | 180 | −1 |
| L628 | 0.33 | −1.1 | 39.04 | 14.56 | 18.62 | −6.83 | 24.92 | 33.63 | 28.40 | −10.41 | 60 | 3 | 240 | −1 |
| L629 | −0.5 | −1.1 | 35.27 | 30.56 | 37.35 | 20.54 | 23.84 | 27.28 | 21.64 | 11.90 | 45 | 4 | 45 | 1 |
| L630 | −0.5 | −1.1 | 35.27 | 29.38 | 35.91 | 19.75 | 23.84 | 26.23 | 20.81 | 11.44 | 0 | 4 | 0 | 1 |
| Sum | | | | | | 1.62 | | | | −1.93 | | | | |

The optical retardation $$OR_{LG} = \sum_{L601 \text{ to } L630} BF_L$$

of all of the lenses is 1.6 nm for the outer aperture ray 607 and −1.9 nm for the outer aperture ray 609, thus smaller than 2% of the working wavelength.

The asymmetry of the optical retardation $$ORAS_{LG} = \left| \sum_{L601 \text{ to } L630} (DS_L \cdot AP_L \cdot BF_L) \right|$$

for all of the lenses is 6.1 nm for the outer aperture ray 607 and 3.5 nm for the outer aperture ray 609, thus smaller than 4% of the working wavelength.

The lenses of the objective 601 are assigned to the two homogeneous groups HG61 and HG63 with (111)-lenses and the two homogeneous groups HG62 and HG64 with (100)-lenses.

Table 6 lists the assignments of the lenses to the homogeneous groups as well as the asymmetries of the optical retardation for the two outer aperture rays 607 and 609.

TABLE 6

| Homogeneous group | Lenses | Crystallographic orientation of the lens axis | ORAS [nm] | |
|---|---|---|---|---|
| HG61 | L601–L607 | (111) | 2.41 | 0.09 |
| HG62 | L608–L609 | (100) | 0.74 | 1.92 |
| HG63 | L610–L628 | (111) | 1.49 | 0.70 |
| HG64 | L629–L630 | (100) | 1.44 | 0.83 |

The asymmetry $$ORAS_{HG_n} = \left| \sum_{L \text{ in } HG_n} (MA_L \cdot DI_L \cdot DS_L \cdot AP_L \cdot SP_L) \right|$$

of the optical retardation for the outer aperture ray 607 as well as for the outer aperture ray 609 in all homogeneous groups is smaller than 2% of the working wavelength.

In each of the homogeneous groups HG62, HG63 and HG64, there is one lens whose birefringence factor $BF_L$ is larger than 3% of the working wavelength $\lambda_0$=157 nm.

FIG. 7 illustrates a third embodiment in which the invention was put into practice in an objective 701. In this third embodiment, the harmful effects of intrinsic birefringence are reduced by using a combination of mutually rotated lenses of barium fluoride and mutually rotated lenses of calcium fluoride. The lens axes of the lens L701 to L730 are oriented in the crystallographic (111)-direction. Thus the orientation factor is the same for all of the lenses.

The optical data for the objective 701 are listed in Table 7. The image-side numerical aperture of the objective 701 is 0.9. The object field which is centered on the optical axis OA has a diameter of 92.4 mm. The central object point 703 is located on the optical axis OA, and a further object point 705 is located at the periphery of the object field. The imaging scale ratio of the objective 701 between the object plane OB and the image plane IM is 0.25. The imaging performance of the objective 701 is corrected to such a high degree that the deviation from the wave front of an ideal spherical wave for all image points of the image field is less than ten thousandths of a wavelength in relation to a working wavelength of 157 nm, if only those aberrations are considered that are caused by the lens geometry. The principle-ray-induced and coma-induced distortion for all image points is smaller than 3 nm.

The starting system for the optimization of the objective 701 is the same as in the first embodiment, i.e., the objective illustrated in FIG. 7 of WO 01/50171 (U.S. Ser. No. 10/177, 580).

With a given starting system as a point of departure, the lenses L701 to L730 are in this case assigned material factors $MA_L$ rather than orientation factors $DI_L$. In other words, the decision is made as to which of the lenses are to consist of barium fluoride and which are to consist of calcium fluoride. In this case, too, the assignment is made in such a way that in all cases at least two neighboring lenses have the same material factor $MA_L$. Because a change of the material factor $MA_L$ also entails a change of the refractive index, a first step in the optimizing process serves to optimize the image aberrations caused by the change in the refractive index. Following this optimization, the arrangement and dimensions of the lenses of the objective remain at first unchanged.

In a second optimizing step, the barium fluoride lenses are assigned to a first homogeneous group and the calcium fluoride lenses are assigned to a second homogeneous group.

In a third step of the optimizing process, angles of rotation $\gamma_L$ are assigned to the fluoride crystal lenses of the first homogeneous group and the second homogeneous group. Given that in this third embodiment the lens axes of the barium fluoride lenses as well as of the calcium fluoride lenses are oriented in the crystallographic (111)-direction, the individual lenses are assigned an angle of rotation of either 0° or 60°. If the lens axes were pointing in the crystallographic (100)-direction, the angle to assign to the lenses would be either 0° or 45°.

In a fourth step of the optimizing method, the optical retardation $$OR_{LG} = \sum_{L701\ to\ L730} BF_L$$

is calculated for the lenses L701 to L730. The calculation is based on an outer aperture ray 707.

In a fifth step of the optimizing method, the respective asymmetries of the retardation $$ORAS_{HGI} = \left| \sum_{L\ in\ HGI} (MA_L \cdot DI_L \cdot DS_L \cdot AP_L \cdot SP_L) \right| \text{ and }$$

$$ORAS_{HGII} = \left| \sum_{L\ in\ HGII} (MA_L \cdot DI_L \cdot DS_L \cdot AP_L \cdot SP_L) \right|$$

are calculated for the lenses of the first homogeneous group and the second homogeneous group.

The sixth step of the optimizing method consists of a test whether $OR_{LG} < \frac{1}{4} \cdot \lambda_0$, wherein $\lambda_0$ represents the working wavelength of the objective, as well as additional tests whether $ORAS_{LGI} < \frac{1}{4} \cdot \lambda_0$ and $ORAS_{LGII} < \frac{1}{4} \cdot \lambda_0$. If these threshold values are exceeded, the optimizing procedure is repeated with other material factors $MA_L$ for the lenses L701 to L730.

The different assignment possibilities are evaluated through the numerical optimizing procedures that have already been discussed above in the context of the first embodiment.

Should these methods fail to deliver a solution within a finite time period, the problem may also be solved by raising the threshold values.

In order to obtain a better starting system for the fine optimization, it is also possible to lower the threshold values to $\frac{1}{10} \cdot \lambda_0$.

In the case of the third embodiment, a solution is found for the following assignment of materials to the lenses:

a first homogeneous group with barium fluoride lenses: L729, L730; and a second homogeneous group with calcium fluoride lenses: L701 to L728.

In a seventh step of the method, the degrees of freedom represented by the arrangement and dimensions of the lenses of the objective are used to achieve a further optimization of the birefringence-related image aberrations $OR_{LG}$, $ORAS_{HGI}$ and $ORAS_{HGII}$.

As described for the first embodiment, it is advantageous to define further homogeneous groups either in subsequent further optimizing steps or already in the second step of the optimizing method. As the first homogeneous group in the third embodiment consists of only two lenses, it cannot be split up further. However, the second homogeneous group can be subdivided into further homogeneous groups.

In summary, with a given starting system as a point of departure, a solution was found for the objective 701 wherein the harmful influence of the intrinsic birefringence of the fluoride crystal lenses is significantly reduced. This was achieved by changing the material in the lenses L729 and L730 of the starting system from calcium fluoride to barium fluoride and by appropriately adapting the arrangement and dimensions of the lenses through the optimizing method according to the invention.

The essential characterizing data of the objective 701 according to the invention are presented in Table 8. The quantities that depend on ray parameters have been calculated for the outer aperture ray 707 with the relative ray aperture of 1.0.

TABLE 8

| Lens | $\theta_L$ [°] | $OP_L$ [mm] | $SP_L$ [mm] | $DI_L$ | $MA_L$ [nm/mm] | $BF_L$ [nm] | $\gamma_L$ [°] | $SF_{DI\_L}$ | $\alpha_L$ [°] | $AP_L$ |
|------|------|------|------|------|------|------|------|------|------|------|
| L701 | 8.18 | 13.81 | 1.64 | 0.33 | −1.1 | −0.60 | 60 | 3 | 60 | 1.00 |
| L702 | 8.79 | 6.72 | 0.91 | 0.33 | −1.1 | −0.34 | 60 | 3 | 60 | 1.00 |
| L703 | 7.94 | 11.78 | 1.32 | 0.33 | −1.1 | −0.48 | 60 | 3 | 60 | 1.00 |
| L704 | 10.84 | 7.99 | 1.63 | 0.33 | −1.1 | −0.60 | 60 | 3 | 60 | 1.00 |
| L705 | 9.56 | 6.05 | 0.97 | 0.33 | −1.1 | −0.36 | 60 | 3 | 60 | 1.00 |
| L706 | 10.34 | 8.86 | 1.65 | 0.33 | −1.1 | −0.60 | 60 | 3 | 60 | 1.00 |
| L707 | 21.32 | 12.28 | 8.24 | 0.33 | −1.1 | −3.02 | 0 | 3 | 0 | 1.00 |
| L708 | 24.76 | 20.99 | 17.57 | 0.33 | −1.1 | −6.38 | 0 | 3 | 0 | 1.00 |
| L709 | 16.32 | 40.74 | 17.51 | 0.33 | −1.1 | −6.36 | 60 | 3 | 60 | 1.00 |
| L710 | 11.24 | 10.74 | 2.34 | 0.33 | −1.1 | −0.86 | 60 | 3 | 60 | 1.00 |
| L711 | 2.37 | 18.43 | 0.19 | 0.33 | −1.1 | −0.07 | 60 | 3 | 60 | 1.00 |
| L712 | 2.31 | 31.79 | 0.31 | 0.33 | −1.1 | −0.11 | 60 | 3 | 60 | 1.00 |
| L713 | 17.43 | 27.01 | 13.02 | 0.33 | −1.1 | −4.77 | 0 | 3 | 180 | −1.00 |
| L714 | 17.86 | 31.29 | 15.73 | 0.33 | −1.1 | −5.77 | 60 | 3 | 240 | −1.00 |

TABLE 8-continued

| Lens | $\theta_L$ [°] | $OP_L$ [mm] | $SP_L$ [mm] | $DI_L$ | $MA_L$ [nm/mm] | $BF_L$ [nm] | $\gamma_L$ [°] | $SF_{DI\_L}$ | $\alpha_L$ [°] | $AP_L$ |
|---|---|---|---|---|---|---|---|---|---|---|
| L715 | 12.14 | 7.30 | 1.84 | 0.33 | −1.1 | −0.67 | 60 | 3 | 240 | −1.00 |
| L716 | 0.79 | 29.31 | 0.03 | 0.33 | −1.1 | −0.01 | 0 | 3 | 180 | −1.00 |
| L717 | 26.13 | 30.59 | 27.54 | 0.33 | −1.1 | −10.10 | 0 | 3 | 0 | 1.00 |
| L718 | 33.53 | 14.96 | 17.64 | 0.33 | −1.1 | −6.47 | 60 | 3 | 60 | 1.00 |
| L719 | 25.64 | 8.90 | 7.82 | 0.33 | −1.1 | −2.87 | 60 | 3 | 60 | 1.00 |
| L720 | 18.57 | 7.41 | 3.98 | 0.33 | −1.1 | −1.46 | 60 | 3 | 60 | 1.00 |
| L721 | 7.05 | 5.65 | 0.50 | 0.33 | −1.1 | −0.18 | 60 | 3 | 60 | 1.00 |
| L722 | 10.96 | 6.76 | 1.40 | 0.33 | −1.1 | −0.51 | 60 | 3 | 240 | −1.00 |
| L723 | 12.62 | 6.07 | 1.64 | 0.33 | −1.1 | −0.60 | 0 | 3 | 180 | −1.00 |
| L724 | 0.29 | 19.14 | 0.00 | 0.33 | −1.1 | 0.00 | 0 | 3 | 0 | 1.00 |
| L725 | 4.50 | 19.05 | 0.70 | 0.33 | −1.1 | −0.26 | 0 | 3 | 0 | 1.00 |
| L726 | 24.01 | 6.97 | 5.59 | 0.33 | −1.1 | −2.05 | 0 | 3 | 180 | −1.00 |
| L727 | 35.82 | 8.07 | 9.96 | 0.33 | −1.1 | −3.65 | 0 | 3 | 180 | −1.00 |
| L728 | 39.78 | 12.06 | 15.48 | 0.33 | −1.1 | −5.68 | 60 | 3 | 240 | −1.00 |
| L729 | 32.92 | 25.44 | 29.55 | 0.33 | 3.3 | 32.50 | 60 | 3 | 240 | −1.00 |
| L730 | 32.92 | 25.42 | 29.53 | 0.33 | 3.3 | 32.48 | 0 | 3 | 180 | −1.00 |
| Sum | | | | | | 0.16 | | | | |

The total optical retardation $$ OR_{LG} = \sum_{L701\,to\,L730} BF_L $$

of the lenses is +0.16 nm, thus smaller than 1% of the working wavelength. The total for the asymmetry of the optical retardation $$ ORAS_{LG} = \left| \sum_{L701\,to\,L730} (DS_L \cdot AP_L \cdot BF_L) \right| $$

is 0.53 nm, thus smaller than 1% of the working wavelength.

The lenses of the objective 701 are assigned to the six homogeneous groups HG71, HG72, HG73, HG74, HG75 and HG76 with calcium fluoride lenses and to the homogeneous group HG77 with barium fluoride lenses.

The lenses are assigned to the homogeneous groups as shown in Table 9.

TABLE 9

| Homogeneous group | Lenses | Crystallographic orientation of the lens axis | ORAS [nm] |
|---|---|---|---|
| HG71 | L701–L707 | calcium fluoride | 0.12 |
| HG72 | L708–L709 | calcium fluoride | 0.05 |
| HG73 | L710–L714 | calcium fluoride | 0.13 |
| HG74 | L715–L720 | calcium fluoride | 0.09 |
| HG75 | L721–L725 | calcium fluoride | 0.04 |
| HG76 | L726–L728 | calcium fluoride | 0.07 |
| HG77 | L729–L730 | barium fluoride | 0.02 |

The asymmetry $$ ORAS_{HG_n} = \left| \sum_{L\,in\,HG_n} (MA_L \cdot DI_L \cdot DS_L \cdot AP_L \cdot SP_L) \right| $$

of the optical retardation in all groups is smaller than 1% of the working wavelength.

In each of the homogeneous groups HG72, HG73, HG74, HG76 and HG77 there is one lens whose birefringence factor $BF_L$ is larger than 3% of the working wavelength $\lambda_0$=157 nm.

Figure 8:
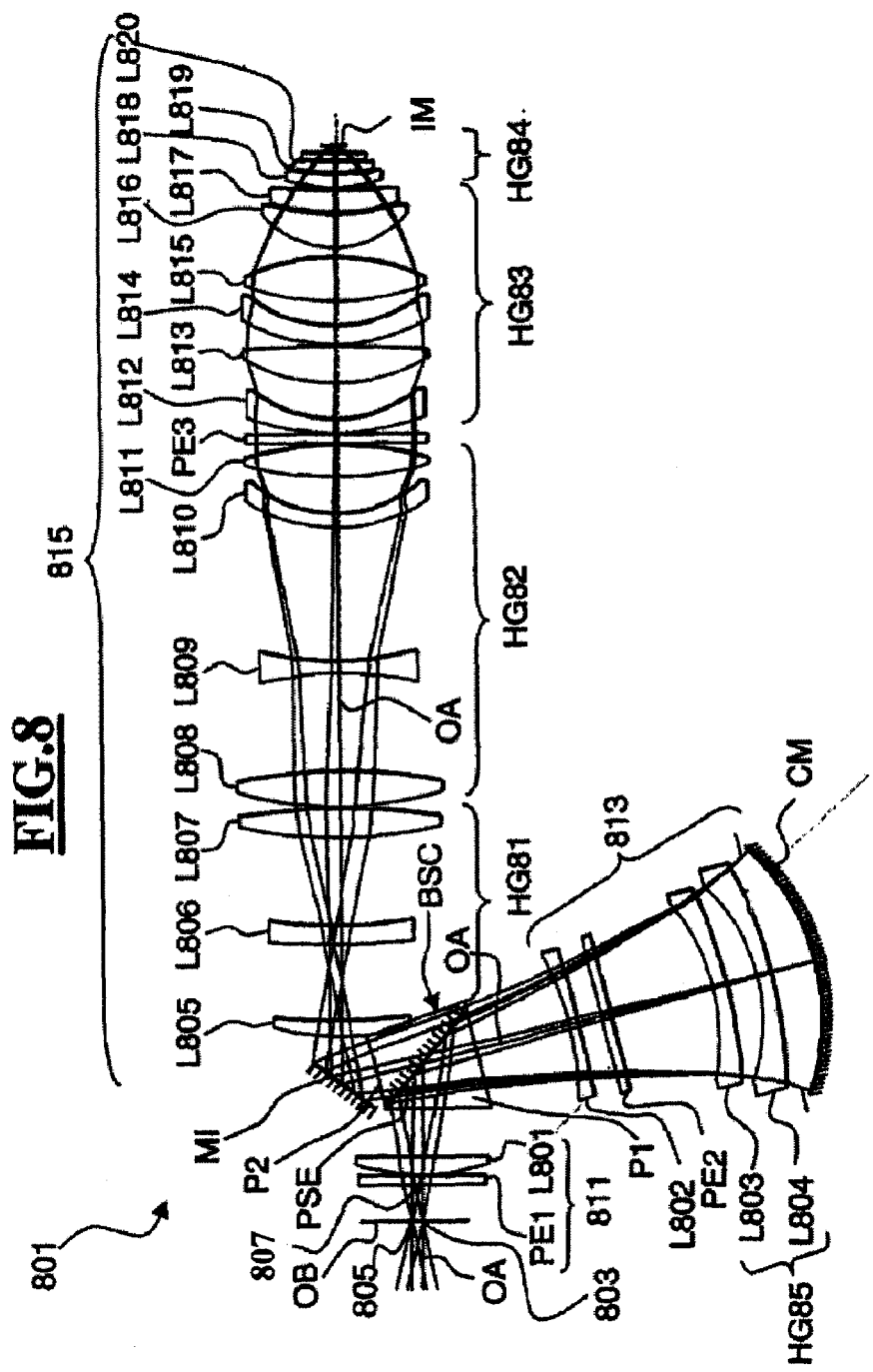
FIG. 8 represents the lens section of a catadioptric projection objective according to the fourth embodiment.

FIG. 8 illustrates a fourth embodiment in which the invention was put into practice in an objective 801. The objective 801 is a catadioptric projection objective for a microlithography projection system. The optical data for the objective 801 are listed in Table 10. The image-side numerical aperture of the objective 801 is 0.9. The object field which is centered on the optical axis OA has a diameter of 106.4 mm. The central object point 803 is located on the optical axis OA, and a further object point 805 is located at the periphery of the object field. The imaging scale ratio of the objective 801 between the object plane OB and the image plane IM is 0.25. The imaging performance of the objective 801 is corrected to such a high degree that the deviation from the wave front of an ideal spherical wave for all object points of the object field is less than six thousandths of a wavelength in relation to a working wavelength of 157 nm, if only those aberrations are considered that are caused by the geometry of the optical components. The principle-ray-induced and coma-induced distortion for all image points is smaller than 3 nm.

Next to the object plane OB, the objective 801 has a first partial system 811 which contains the exclusively refractive optical components L801 and PE1, a beam-splitter device BSC, a second catadioptric partial system 813 with a concave mirror CM and a plurality of refractive optical components L802 to L804 and PE2, as well as a third partial system 815 with a beam-deflecting element MI and refractive optical components L805 to L820 and PE3.

The first partial system 811 includes the quarter-lambda plate PE1 as well as the lens L801.

The beam-splitter device BSC is configured as a beam-splitter cube composed of two prisms P1 and P2 with triangular cross-sectional shapes. A polarization-selective beam-splitting layer PSE which is interposed between the prisms is configured as a so-called S-P layer. This means that, ideally, the beam-splitting layer PSE reflects 100% of the electric field component that oscillates in the perpendicular direction to the plane of incidence of the light (S-component) while it transmits 100% of the electric field component that oscillates parallel to the plane of incidence of the light (P-component). Beam-splitting layers PSE of the S-P type which have been realized in practice come respectably close to these ideal values.

The quarter-lambda plate PE1 in the first partial system 811 has the purpose to change the circular polarization of the light that originates from the object, so that when the light meets the beam-splitting layer PSE, it has S-polarization as is necessary for reflection.

The light that was reflected by the beam-splitting layer PSE passes through the catadioptric partial system 813 and meets the beam-splitting layer a second time. A further quarter-lambda plate PE2 which is arranged in the catadioptric partial system 813 has the effect that the light meets the beam-splitting layer PSE with the required P-polarization so that it is transmitted by the beam-splitting layer PSE.

The light is reflected on a direction-changing mirror MI and passes through the lenses L805 to L820 and a further quarter-lambda plate PE3 to the image plane IM.

All refractive optical components of the objective 801 consist of calcium fluoride. Given that the objective has a working wavelength of 157 nm, the harmful influence of intrinsic birefringence needs to be reduced. Due to the configuration of the objective 801 as a catadioptric objective with a polarization-selective beam-splitting layer PSE, the partial systems 811, 813 and 815 are uncoupled from each other in regard to their polarizing properties. After it has been reflected or transmitted at the beam-splitting layer PSE, the light has a defined state of polarization, i.e., S-polarization in the case of reflection and P-polarization in the case of transmission. Other polarization components of the light falling on the beam-splitting layer are automatically filtered out. Light which is not S-polarized after passing through the first partial system 811 is absorbed or transmitted, while light which is not P-polarized after passing through the second catadioptric partial system 813 is absorbed or reflected.

It is therefore not possible to form homogeneous groups of lenses which are arranged in the light path ahead of and after the beam-splitting layer PSE. Each of the partial systems 811, 813 and 815 therefore has to be optimized by itself in regard to the birefringence-related image aberrations.

The lens axis of the lens L801 in the first partial system 811 is arranged parallel to the crystallographic (100)-direction.

In the second catadioptric partial system, the lens axis of the lens L802 is parallel to the crystallographic (100)-direction, while the lens axes of the lenses L803 and L804 are oriented parallel to the crystallographic (110)-direction. The lenses L803 and L804 form a homogeneous group HG85, wherein the lens L803 is set at an angle of rotation $\gamma_{L803}=0°$ and the lens L804 is set at an angle of rotation $\gamma_{L804}=90°$ relative to a reference direction that is fixed in the homogeneous group.

The most stringent requirements on the birefringence correction have to be imposed in the partial system 815, because the partial system 815 is arranged immediately ahead of the image plane IM and the harmful effect of the intrinsic birefringence of the lenses L805 to L820 directly reduces the imaging performance.

Following is a description of how the birefringence-related image aberrations are corrected in the third partial system 815 which is arranged between the polarization-selective optical element BSC and the image plane IM.

The reduction of the harmful effects of birefringence in the third partial system 815 is achieved by forming the homogeneous group HG84 of (100)-lenses and the homogeneous groups HG81 to HG83 of (111)-lenses. The lens axes of the lenses L805 to L817 are oriented in the crystallographic (111)-direction, and the lens axes of the lenses L818 to L820 are oriented in the crystallographic (100)-direction.

The essential characterizing data of the third partial system 815 according to the invention are presented in Table 11. The quantities that depend on ray parameters have been calculated for the outer aperture ray 807 with the relative ray aperture of 1.0.

TABLE 11

| Lens | $\theta_L$ [°] | $OP_L$ [mm] | $SP_L$ [mm] | $DI_L$ | $MA_L$ [nm/mm] | $BF_L$ [nm] | $\gamma_L$ [°] | $SF_{DI\_L}$ | $\alpha_L$ [°] | $AP_L$ |
|---|---|---|---|---|---|---|---|---|---|---|
| L805 | 7.94 | 16.32 | 1.83 | 0.33 | −1.1 | −0.67 | 0 | 3 | 0 | 1 |
| L806 | 7.38 | 19.87 | 1.93 | 0.33 | −1.1 | −0.71 | 36.1 | 3 | 36.1 | 1 |
| L807 | 6.49 | 29.15 | 2.20 | 0.33 | −1.1 | −0.81 | 78.8 | 3 | 78.8 | 1 |
| L808 | 3.75 | 35.57 | 0.91 | 0.33 | −1.1 | −0.33 | 0 | 3 | 180 | −1 |
| L809 | 4.84 | 17.67 | 0.75 | 0.33 | −1.1 | −0.28 | 33.1 | 3 | 213.1 | −1 |
| L810 | 2.76 | 20.37 | 0.28 | 0.33 | −1.1 | −0.10 | 33.1 | 3 | 213.1 | −1 |
| L811 | 7.45 | 12.72 | 1.26 | 0.33 | −1.1 | −0.46 | 78 | 3 | 258 | −1 |
| PE3 | 1.98 | 10.01 | 0.07 | 0.33 | −1.1 | −0.03 | 80.2 | 3 | 260.2 | −1 |
| L812 | 4.80 | 30.66 | 1.28 | 0.33 | −1.1 | −0.47 | 0 | 3 | 180 | −1 |
| L813 | 0.66 | 5.83 | 0.00 | 0.33 | −1.1 | 0.00 | 0 | 3 | 180 | −1 |
| L814 | 12.90 | 28.23 | 7.96 | 0.33 | −1.1 | −2.92 | 0 | 3 | 180 | −1 |
| L815 | 2.88 | 8.90 | 0.13 | 0.33 | −1.1 | −0.05 | 0 | 3 | 180 | −1 |
| L816 | 31.04 | 16.87 | 18.56 | 0.33 | −1.1 | −6.81 | 28.5 | 3 | 208.5 | −1 |
| L817 | 31.01 | 19.50 | 21.44 | 0.33 | −1.1 | −7.86 | 79.9 | 3 | 259.9 | −1 |
| L818 | 35.15 | 13.27 | 16.18 | −0.5 | −1.1 | 8.90 | 0 | 4 | 180 | −1 |
| L819 | 34.69 | 11.22 | 13.57 | −0.5 | −1.1 | 7.46 | 34.7 | 4 | 214.7 | −1 |
| L820 | 35.28 | 8.82 | 10.78 | −0.5 | −1.1 | 5.93 | 59.1 | 4 | 239.1 | −1 |
| Sum | | | | | | 0.81 | | | | |

The total optical retardation $$OR_{LG} = \sum_{L805\ to\ L820} BF_L$$

for all of the lenses of the partial system 815 is +0.81 nm, thus smaller than 1% of the working wavelength.

The total for the asymmetry of the optical retardation $$ORAS_{LG} = \left| \sum_{L805 \text{ to } L820} (DS_L \cdot AP_L \cdot BF_L) \right|$$

for all of the lenses of the partial system 815 is 0.06 nm, thus smaller than 1% of the working wavelength.

The lenses of the partial system 815 are assigned to the three homogeneous groups HG81, HG82 and HG93 with (111)-lenses and to the homogeneous group HG84 with (100)-lenses. The lenses are assigned to the homogeneous groups as shown in Table 12.

TABLE 12

| Homogeneous group | Lenses | Crystallographic orientation of the lens axis | ORAS [nm] |
|---|---|---|---|
| HG81 | L805–L807 | (111) | 0.002 |
| HG82 | L808–L811 | (111) | 0.003 |
| HG83 | L812–L817 | (111) | 0.012 |
| HG84 | L818–L820 | (100) | 0.043 |

The asymmetry $$ORAS_{HG_n} = \left| \sum_{L \text{ in } HG_n} (MA_L \cdot DI_L \cdot DS_L \cdot AP_L \cdot SP_L) \right|$$

of the optical retardation in all groups is smaller than 1% of the working wavelength.

In each of the homogeneous groups HG83 and HG84 there is one lens whose birefringence factor $BF_L$ is larger than 3% of the working wavelength $\lambda_0 = 157$ nm.

In contrast to the first three examples where the (100)-lenses have angles of rotation of either $\gamma_L = 0°$ or $\gamma_L = 45°$ and the (111)-lenses have angles of rotation of either $\gamma_L = 0°$ or $\gamma_L = 60°$, the fourth embodiment takes advantage of the fact that the asymmetry of the optical retardation ORAS of a homogeneous group can also be minimized through a specifically targeted adaptation of the angles of rotation $\gamma_L$.

The homogeneous group H84 will serve as an example to explain the concept of a targeted adaptation. The homogeneous group HG84 has the three lenses L818, L819 and L820.

The aim is for an asymmetry of the optical retardation $$ORAS_{HG84} = \left| \sum_{L \text{ in } HG84} (DS_L \cdot AP_L \cdot SP_L) \right| \stackrel{!}{=} 0.$$

As the lenses are (100)-lenses, the aperture factor $AP_L$ equals +1 and the symmetry factor $SF_{DI\_L}$ equals +4, independent of the azimuth angle $\alpha_L$ of the outer aperture ray 807. Consequently, the preceding equation can be stated as:

$$ORAS_{HG84} = |\exp(i \cdot 4 \cdot \gamma_{L818}) \cdot SP_{L818} + \exp(i \cdot 4 \cdot \gamma_{L819}) \cdot SP_{L819} + \exp(i \cdot 4 \cdot \gamma_{830}) \cdot SL_{L820}| \stackrel{!}{=} 0$$

With the angle $\gamma_{L818} = 0°$ for the lens L818, one obtains for the two other lenses:

$$\gamma_{L819} = \frac{1}{4} \cdot \arccos\left(\frac{SP_{L820}^2 - SP_{L819}^2 - SP_{L818}^2}{2 \cdot SP_{L818} \cdot SP_{L819}}\right) = 35°, \text{ and}$$

$$\gamma_{L820} = \frac{1}{4} \cdot \left(\arctan\left(\frac{SP_{L819} \cdot \sin(4 \cdot \gamma_{L819})}{SP_{L818} + SP_{L819} \cdot \cos(4 \cdot \gamma_{L819})}\right) + 180°\right) = 59°.$$

On the other hand, it is impossible to form a homogeneous group with the lenses L818, L819 and L820 if the available angles of rotation are limited to 0° and 45°. This is a consequence of the following:

$$\left| \sum_{L \text{ in } HG84} (c_L \cdot BF_L) \right| > 0$$

for any combination of the coefficients $c_L = \pm 1$.

TABLE 13

| $c_{L818}$ | $c_{L819}$ | $c_{L820}$ | $\left\| \sum_{L \text{ in } HG84} (c_L \cdot BF_L) \right\|$ [nm] |
|---|---|---|---|
| 1 | 1 | 1 | 22.29 |
| 1 | 1 | −1 | 10.43 |
| 1 | −1 | 1 | 7.37 |
| −1 | 1 | 1 | 4.49 |
| 1 | −1 | −1 | 4.49 |
| −1 | 1 | −1 | 7.37 |
| −1 | −1 | 1 | 10.43 |
| −1 | −1 | −1 | 22.29 |

If the angles of rotation are limited to 0° and 45°, the minimum value that the asymmetry of the retardation can take is $ORAS_{LG} = 4.5$ nm, which is larger than 2% of the working wavelength $\lambda_0$.

Figure 9:
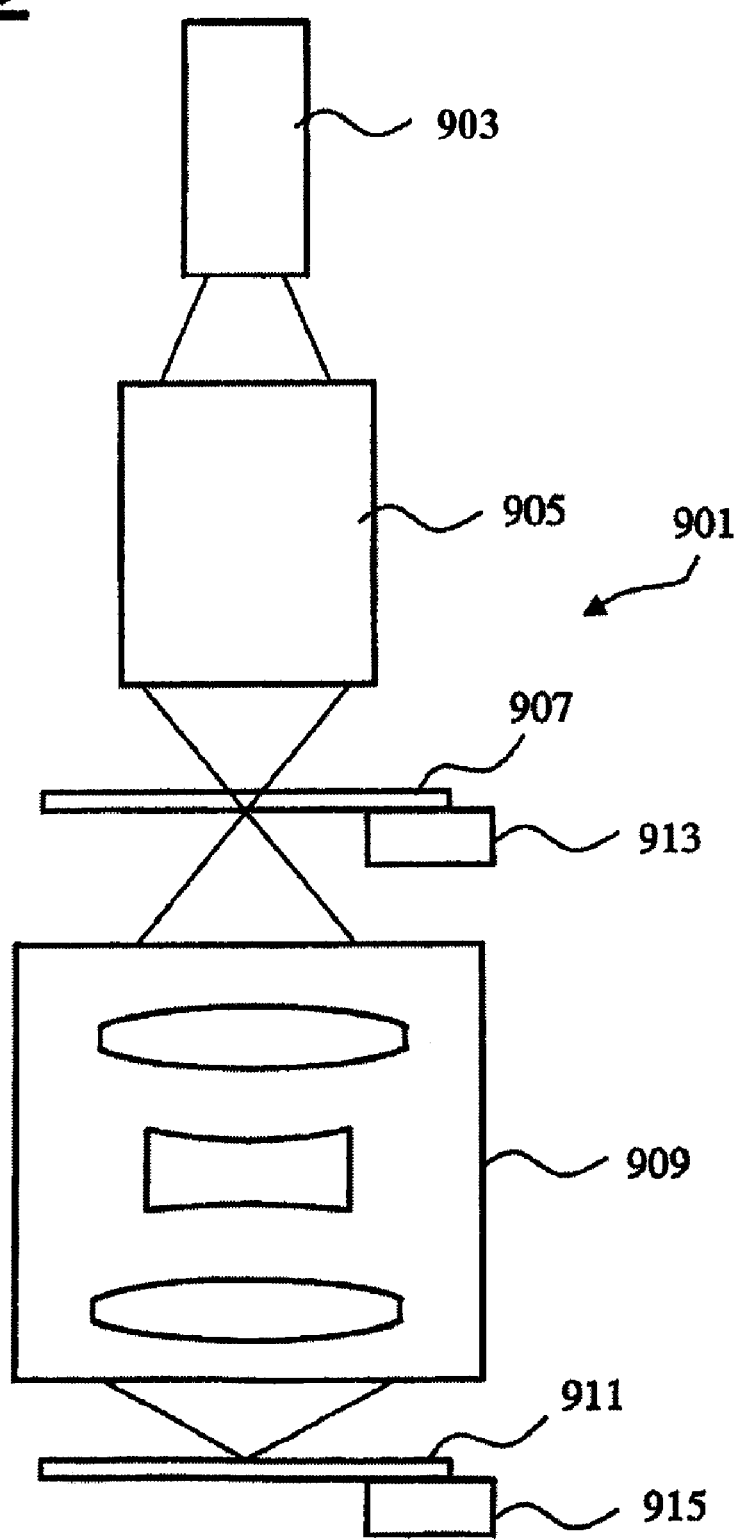
FIG. 9 schematically represents a microlithography projection system.

The principal configuration of a microlithography projection system is illustrated in FIG. 9. The projection system 901 includes a light source 903, an illumination system 905, a mask 907 carrying a structure, a projection objective 909, and a substrate 911 that is to be exposed to the projection. The illumination system 905 collects the light of the light source 903—the latter being a KrF— or ArF laser depending on the working wavelength—and illuminates the mask 907. The light source 903 and the illumination system 905 provide a light distribution with a degree of homogeneity as required by the exposure process and a required lighting level at the entry pupil of the objective 909. The mask 907 is held in the light path by means of a mask holder 913. Masks 907 of the type used in microlithography have a structure with details in the micrometer-to-nanometer range. As an alternative to a so-called reticle, one could also use a program-controlled micro-mirror array or LCD array as a structure-carrying mask. An image of the mask 907 or of a partial surface range of the mask 907 is projected by the projection objective 909 onto the substrate 911 which is held in position by a substrate holder 915. Examples of actual designs of the projection objective 909 are shown in FIGS. 1, 6, 7 and 8. The substrate 911 is typically a silicon wafer which carries a light-sensitive coating, the so-called resist.

The minimal size of the structural details that can be optically resolved depends on the wavelength $\lambda$ of the light that is used for the illumination and also on the image-side numerical aperture of the projection objective 909. The ultimately achievable resolution of the projection system 901 increases with shorter wavelengths λ of the light source 903 and with larger values of the image-side numerical aperture of the projection objective 909. With the objectives presented as examples in FIGS. 1, 6, 7 and 8, detail resolutions smaller than 150 nm can be achieved. It is therefore necessary to also minimize effects like the intrinsic birefringence. By providing a numerical optimizing method which not only corrects the classical image aberrations but also birefringence-related image aberrations already in the design phase, the invention has been successful in noticeably reducing the harmful effects of intrinsic birefringence particularly in projection objectives with a large numerical aperture on the image side.

TABLE 1

| SURFACE | RADII | THICKNESSES | MATERIAL | REFR. INDEX AT 157.63 nm | ½ FREE DIAMETER | LENS |
|---|---|---|---|---|---|---|
| 0 | 0.000000000 | 27.171000000 | N2V157 | 1.00031429 | 46.200 | |
| 1 | 0.000000000 | 0.619657764 | N2V157 | 1.00031429 | 52.483 | |
| 2 | 903.368459132AS | 15.945973242 | CAF2V157 | 1.55929034 | 53.245 | L101 |
| 3 | −226.803393202 | 8.774729563 | N2V157 | 1.00031429 | 53.866 | |
| 4 | −163.038011767 | 8.803852757 | CAF2V157 | 1.55929034 | 53.909 | L102 |
| 5 | −132.829604839 | 13.660124238 | N2V157 | 1.00031429 | 54.704 | |
| 6 | −334.294132209 | 11.146309280 | CAF2V157 | 1.55929034 | 53.671 | L103 |
| 7 | −155.654931629 | 16.012958308 | N2V157 | 1.00031429 | 53.830 | |
| 8 | −73.621096309 | 7.898503828 | CAF2V157 | 1.55929034 | 53.365 | L104 |
| 9 | −68.557324695AS | 3.194701133 | N2V157 | 1.00031429 | 54.820 | |
| 10 | −87.319562124AS | 5.516496382 | CAF2V157 | 1.55929034 | 52.130 | L105 |
| 11 | −223.001598894 | 4.902719287 | N2V157 | 1.00031429 | 53.190 | |
| 12 | −156.862827901 | 5.476915177 | CAF2V157 | 1.55929034 | 53.157 | L106 |
| 13 | 155.322797951 | 34.113165766 | N2V157 | 1.00031429 | 56.119 | |
| 14 | −92.560458488 | 5.019131834 | CAF2V157 | 1.55929034 | 57.747 | L107 |
| 15 | 3978.960899432AS | 19.748553672 | N2V157 | 1.00031429 | 73.712 | |
| 16 | −431.856884247 | 28.595253978 | CAF2V157 | 1.55929034 | 86.500 | L108 |
| 17 | −141.788622554 | 0.750000000 | N2V157 | 1.00031429 | 90.287 | |
| 18 | −4023.545513230AS | 53.682797071 | CAF2V157 | 1.55929034 | 113.819 | L109 |
| 19 | −198.268499421 | 1.506249020 | N2V157 | 1.00031429 | 120.392 | |
| 20 | −391.620232439 | 21.637577380 | CAF2V157 | 1.55929034 | 126.623 | L110 |
| 21 | −230.721564146 | 1.705183768 | N2V157 | 1.00031429 | 127.866 | |
| 22 | 727.797022829 | 27.725011822 | CAF2V157 | 1.55929034 | 134.901 | L111 |
| 23 | 1275.767906513 | 8.151260102 | N2V157 | 1.00031429 | 135.253 | |
| 24 | 1243.135878600 | 48.278536826 | CAF2V157 | 1.55929034 | 135.967 | L112 |
| 25 | −284.760530410 | 2.485310208 | N2V157 | 1.00031429 | 136.058 | |
| 26 | 137.566103636 | 57.283374883 | CAF2V157 | 1.55929034 | 107.395 | L113 |
| 27 | −5301.229434367AS | 0.750000000 | N2V157 | 1.00031429 | 103.559 | |
| 28 | 2397.432274715 | 6.797107660 | CAF2V157 | 1.55929034 | 101.025 | L114 |
| 29 | 148.270665583 | 15.404593426 | N2V157 | 1.00031429 | 83.008 | |
| 30 | 274.187324420 | 6.600101122 | CAF2V157 | 1.55929034 | 81.651 | L115 |
| 31 | 182.196527770 | 32.159139227 | N2V157 | 1.00031429 | 76.539 | |
| 32 | −221.531762691 | 5.000000000 | CAF2V157 | 1.55929034 | 75.610 | L116 |
| 33 | 101.456537540AS | 57.213912935 | N2V157 | 1.00031429 | 70.207 | |
| 34 | −106.788792156 | 5.626935721 | CAF2V157 | 1.55929034 | 71.292 | L117 |
| 35 | 1650.121069070 | 20.646988678 | N2V157 | 1.00031429 | 87.893 | |
| 36 | −414.529202691 | 26.233453762 | CAF2V157 | 1.55929034 | 95.039 | L118 |
| 37 | −204.791231248 | 0.751194338 | N2V157 | 1.00031429 | 101.638 | |
| 38 | −652.140559964 | 25.729214428 | CAF2V157 | 1.55929034 | 113.777 | L119 |
| 39 | −232.560945671 | 0.757093778 | N2V157 | 1.00031429 | 116.017 | |
| 40 | −797.504020233 | 23.278583475 | CAF2V157 | 1.55929034 | 125.215 | L120 |
| 41 | −295.378918809 | 0.750000000 | N2V157 | 1.00031429 | 126.699 | |
| 42 | 788.903405379 | 39.945207546 | CAF2V157 | 1.55929034 | 136.621 | L121 |
| 43 | −429.239474965 | 11.617330294 | N2V157 | 1.00031429 | 137.091 | |
| 44 | 0.000000000 | −7.643947086 | N2V157 | 1.00031429 | 135.209 | |
| 45 | 295.350327713AS | 20.800474007 | CAF2V157 | 1.55929034 | 136.602 | L122 |
| 46 | 438.672121361 | 0.904568214 | N2V157 | 1.00031429 | 135.313 | |
| 47 | 352.144820344 | 48.858165030 | CAF2V157 | 1.55929034 | 134.930 | L123 |
| 48 | −622.347578944 | 32.531844631 | N2V157 | 1.00031429 | 133.556 | |
| 49 | −224.679062354 | 12.453352583 | CAF2V157 | 1.55929034 | 131.448 | L124 |
| 50 | −251.422789558AS | 16.098277935 | N2V157 | 1.00031429 | 132.009 | |
| 51 | −194.298972775AS | 15.943567731 | CAF2V157 | 1.55929034 | 130.929 | L125 |
| 52 | −198.881082726 | 0.874791605 | N2V157 | 1.00031429 | 133.010 | |
| 53 | 204.783706668 | 19.816707893 | CAF2V157 | 1.55929034 | 104.687 | L126 |
| 54 | 329.789425103 | 0.940362287 | N2V157 | 1.00031429 | 101.615 | |
| 55 | 110.493410262 | 24.685776450 | CAF2V157 | 1.55929034 | 87.597 | L127 |
| 56 | 170.824363408 | 0.818849688 | N2V157 | 1.00031429 | 84.672 | |
| 57 | 118.591490343 | 31.724780430 | CAF2V157 | 1.55929034 | 78.184 | L128 |
| 58 | 919.618517702AS | 7.153083120 | N2V157 | 1.00031429 | 72.743 | |
| 59 | 0.000000000 | 21.772860633 | CAF2V157 | 1.55929034 | 66.406 | L129 |
| 60 | 0.000000000 | 3.000000000 | N2V157 | 1.00031429 | 50.979 | |
| 61 | 0.000000000 | 21.595848862 | CAF2V157 | 1.55929034 | 44.742 | L130 |
| 62 | 0.000000000 | 8.604422398 | N2V157 | 1.00031429 | 29.441 | |
| 63 | 0.000000000 | 0.000009908 | | 1.00000000 | 11.551 | |

Formula for Aspherical Surfaces:

$$z = \frac{\frac{1}{R}h^2}{1+\sqrt{1-(1+K)\left(\frac{1}{R}\right)^2 h^2}} + \sum_{k=1}^{\infty} c_k h^{2k+2}$$

-continued $z$: sagittal height    $h$: height    $R$: radius
$k$: conical constant    $c_k$: aspheric constants Aspherical Constants:

| SURFACE NO. 2 | | SURFACE NO. 9 | | SURFACE NO. 10 | |
|---|---|---|---|---|---|
| K | 0.0000 | K | −1.3312 | K | −1.1416 |
| C1 | 1.32190816e−007 | C1 | −4.03409633e−007 | C1 | 1.33648424e−007 |
| C2 | 1.18917598e−012 | C2 | 2.25345866e−011 | C2 | 1.59901344e−011 |
| C3 | 9.89822795e−017 | C3 | −2.16996631e−014 | C3 | −1.67348850e−014 |
| C4 | 2.42293194e−019 | C4 | 4.31434675e−018 | C4 | 3.68207274e−018 |
| C5 | −1.33402482e−022 | C5 | −7.88859611e−022 | C5 | −5.08498969e−022 |
| C6 | 3.58561252e−026 | C6 | 7.38357552e−026 | C6 | 9.85142914e−027 |
| C7 | −4.52438519e−030 | C7 | −6.76351468e−030 | C7 | 2.52500963e−030 |

| SURFACE NO. 15 | | SURFACE NO. 18 | | SURFACE NO. 27 | |
|---|---|---|---|---|---|
| K | 0.0000 | K | 0.0000 | K | 0.0000 |
| C1 | 1.34648983e−007 | C1 | 6.83914897e−009 | C1 | 2.24804464e−008 |
| C2 | −2.19881265e−011 | C2 | −4.90773882e−013 | C2 | −4.42085557e−013 |
| C3 | 1.21097573e−015 | C3 | −7.12121614e−018 | C3 | −4.09221540e−017 |
| C4 | 4.34372877e−020 | C4 | −4.01052617e−022 | C4 | 4.34358300e−021 |
| C5 | −2.32460561e−023 | C5 | 2.86719325e−026 | C5 | −3.23260451e−025 |
| C6 | 2.73872082e−027 | C6 | 3.52889830e−031 | C6 | 1.32073344e−029 |
| C7 | −1.29386402e−031 | C7 | −4.92826156e−035 | C7 | −2.22573939e−034 |

| SURFACE NO. 33 | | SURFACE NO. 45 | | SURFACE NO. 50 | |
|---|---|---|---|---|---|
| K | 0.0000 | K | 0.0432 | K | 0.0000 |
| C1 | −2.84926847e−008 | C1 | 7.18091870e−010 | C1 | 3.00490068e−010 |
| C2 | −1.11911567e−011 | C2 | −2.07564469e−014 | C2 | −2.29783717e−014 |
| C3 | −1.98673848e−016 | C3 | −6.90886458e−020 | C3 | −3.67108730e−019 |
| C4 | −1.64721030e−020 | C4 | 1.21545976e−024 | C4 | 1.62639442e−022 |
| C5 | −5.16269613e−024 | C5 | 1.92967617e−027 | C5 | −8.48026147e−027 |
| C6 | 9.67341069e−028 | C6 | −5.98854019e−032 | C6 | 2.19056910e−031 |
| C7 | −9.95326868e−032 | C7 | 2.74615721e−036 | C7 | −5.19843579e−036 |

| SURFACE NO. 51 | | SURFACE NO. 58 | |
|---|---|---|---|
| K | 0.0000 | K | 0.0000 |
| C1 | −3.97920075e−010 | C1 | 4.41074602e−008 |
| C2 | 5.69350322e−014 | C2 | 1.63744260e−012 |
| C3 | 3.61452787e−018 | C3 | −5.56126851e−016 |
| C4 | −3.91454103e−023 | C4 | 6.15209417e−020 |
| C5 | −6.08597698e−027 | C5 | −4.00572791e−024 |
| C6 | 1.43804179e−031 | C6 | 1.31913491e−028 |
| C7 | −2.06445881e−036 | C7 | −7.75532664e−034 |

TABLE 4

| SURFACE | RADII | THICKNESSES | MATERIAL | REFR. INDEX AT 157.63 nm | ½ FREE DIAMETER | LENS |
|---|---|---|---|---|---|---|
| 0 | 0.000000000 | 27.171000000 | N2V157 | 1.00031429 | 46.200 | |
| 1 | 0.000000000 | 1.833271786 | N2V157 | 1.00031429 | 52.489 | |
| 2 | 783.892924679AS | 12.563837338 | CAF2V157 | 1.55928774 | 53.615 | L601 |
| 3 | −336.178598782 | 13.483853547 | N2V157 | 1.00031429 | 54.059 | |
| 4 | −218.390059183 | 6.276663903 | CAF2V157 | 1.55928774 | 54.534 | L602 |
| 5 | −171.176002650 | 16.023795053 | N2V157 | 1.00031429 | 55.025 | |
| 6 | −823.461800230 | 13.872747800 | CAF2V157 | 1.55928774 | 55.001 | L603 |
| 7 | −170.998932676 | 19.262379607 | N2V157 | 1.00031429 | 55.155 | |
| 8 | −77.592079873 | 5.663422495 | CAF2V157 | 1.55928774 | 54.129 | L604 |
| 9 | −73.368538462AS | 0.750000000 | N2V157 | 1.00031429 | 55.071 | |
| 10 | −90.155314860AS | 8.095946137 | CAF2V157 | 1.55928774 | 53.391 | L605 |
| 11 | −264.588184825 | 4.749021909 | N2V157 | 1.00031429 | 55.096 | |
| 12 | −182.203588417 | 6.916852485 | CAF2V157 | 1.55928774 | 55.160 | L606 |
| 13 | 157.890718729 | 35.996521212 | N2V157 | 1.00031429 | 58.722 | |
| 14 | −90.120717591 | 5.000000000 | CAF2V157 | 1.55928774 | 59.783 | L607 |

TABLE 4-continued

| SURFACE | RADII | THICKNESSES | MATERIAL | REFR. INDEX AT 157.63 nm | ½ FREE DIAMETER | LENS |
|---|---|---|---|---|---|---|
| 15 | 6089.901973469AS | 19.262044202 | N2V157 | 1.00031429 | 79.096 | |
| 16 | −411.048664379 | 30.748361980 | CAF2V157 | 1.55928774 | 91.374 | L608 |
| 17 | −140.007509177 | 1.359795266 | N2V157 | 1.00031429 | 94.872 | |
| 18 | −2454.195838756AS | 58.056302567 | CAF2V157 | 1.55928774 | 124.448 | L609 |
| 19 | −175.631024720 | 0.750000000 | N2V157 | 1.00031429 | 127.844 | |
| 20 | −410.392028061 | 22.012182507 | CAF2V157 | 1.55928774 | 136.898 | L610 |
| 21 | −289.170948659 | 0.750000000 | N2V157 | 1.00031429 | 139.795 | |
| 22 | 589.226039742 | 29.718069927 | CAF2V157 | 1.55928774 | 149.822 | L611 |
| 23 | −1764.716438457 | 0.750000000 | N2V157 | 1.00031429 | 149.885 | |
| 24 | −2091.165786491 | 39.679372288 | CAF2V157 | 1.55928774 | 149.845 | L612 |
| 25 | −293.921040686 | 0.750000000 | N2V157 | 1.00031429 | 149.889 | |
| 26 | 141.074690739 | 59.683732997 | CAF2V157 | 1.55928774 | 112.927 | L613 |
| 27 | 1804.605848698AS | 0.750000000 | N2V157 | 1.00031429 | 107.252 | |
| 28 | 808.544300607 | 12.982088851 | CAF2V157 | 1.55928774 | 104.923 | L614 |
| 29 | 160.839676617 | 9.023109975 | N2V157 | 1.00031429 | 85.208 | |
| 30 | 210.991861097 | 5.000000000 | CAF2V157 | 1.55928774 | 83.898 | L615 |
| 31 | 141.292536926 | 36.911717304 | N2V157 | 1.00031429 | 77.686 | |
| 32 | −257.654928360 | 5.000000000 | CAF2V157 | 1.55928774 | 76.651 | L616 |
| 33 | 95.325935587AS | 50.330906414 | N2V157 | 1.00031429 | 69.151 | |
| 34 | −125.531518779 | 20.880133925 | CAF2V157 | 1.55928774 | 69.569 | L617 |
| 35 | 561.430837955 | 17.110748098 | N2V157 | 1.00031429 | 87.312 | |
| 36 | −691.613901731 | 16.894726714 | CAF2V157 | 1.55928774 | 90.907 | L618 |
| 37 | −238.199336305 | 0.750000000 | N2V157 | 1.00031429 | 93.001 | |
| 38 | −554.106915935 | 29.955101210 | CAF2V157 | 1.55928774 | 99.262 | L619 |
| 39 | −244.266487405 | 2.599916083 | N2V157 | 1.00031429 | 105.597 | |
| 40 | −1623.632930866 | 46.979341235 | CAF2V157 | 1.55928774 | 114.510 | L620 |
| 41 | −375.299861939 | 2.616280056 | N2V157 | 1.00031429 | 122.751 | |
| 42 | 602.812130427 | 47.262141123 | CAF2V157 | 1.55928774 | 131.456 | L621 |
| 43 | −552.389590238 | −2.631399003 | N2V157 | 1.00031429 | 132.469 | |
| 44 | 0.000000000 | 3.381399003 | N2V157 | 1.00031429 | 131.890 | |
| 45 | 270.247424481AS | 32.690154914 | CAF2V157 | 1.55928774 | 134.441 | L622 |
| 46 | 1298.609020888 | 0.750000000 | N2V157 | 1.00031429 | 133.808 | |
| 47 | 882.110993726 | 29.603096927 | CAF2V157 | 1.55928774 | 133.074 | L623 |
| 48 | −574.232533851 | 30.690878416 | N2V157 | 1.00031429 | 132.370 | |
| 49 | −217.978483622 | 5.000000000 | CAF2V157 | 1.55928774 | 131.415 | L624 |
| 50 | −240.865295878AS | 16.295961279 | N2V157 | 1.00031429 | 131.876 | |
| 51 | −186.443056187AS | 13.165321161 | CAF2V157 | 1.55928774 | 131.160 | L625 |
| 52 | −190.144960734 | 0.750000000 | N2V157 | 1.00031429 | 133.154 | |
| 53 | 255.761927404 | 15.864536301 | CAF2V157 | 1.55928774 | 105.450 | L626 |
| 54 | 500.272020192 | 0.750000000 | N2V157 | 1.00031429 | 103.884 | |
| 55 | 170.920660735 | 11.503993632 | CAF2V157 | 1.55928774 | 94.653 | L627 |
| 56 | 212.512004177 | 0.750000000 | N2V157 | 1.00031429 | 92.402 | |
| 57 | 96.902427286 | 43.472669787 | CAF2V157 | 1.55928774 | 79.622 | L628 |
| 58 | 1009.084489782AS | 6.705862408 | N2V157 | 1.00031429 | 74.819 | |
| 59 | 0.000000000 | 24.951415814 | CAF2V157 | 1.55928774 | 69.056 | L629 |
| 60 | 0.000000000 | 3.000000000 | N2V157 | 1.00031429 | 51.384 | |
| 61 | 0.000000000 | 23.991545946 | CAF2V157 | 1.55928774 | 45.154 | L630 |
| 62 | 0.000000000 | 7.999939498 | N2V157 | 1.00031429 | 28.161 | |
| 63 | 0.000000000 | 0.000060502 | | 1.00000000 | 11.552 | |

Formula for Aspherical Surfaces:

$$z = \frac{\frac{1}{R}h^2}{1+\sqrt{1-(1+K)\left(\frac{1}{R}\right)^2 h^2}} + \sum_{k=1} c_k h^{2k+2}$$

$z$: sagittal height  $h$: height  $R$: radius $k$: conical constant  $c_k$: aspheric constants Aspherical Constants:

| | SURFACE NO. 2 | | SURFACE NO. 9 | | SURFACE NO. 10 |
|---|---|---|---|---|---|
| K | 0.0000 | K | −1.3746 | K | −0.9533 |
| C1 | 1.42412806e−007 | C1 | −3.91462584e−007 | C1 | 1.01442979e−007 |
| C2 | 3.73474543e−013 | C2 | 2.46544593e−011 | C2 | 1.12967913e−011 |
| C3 | 2.54196922e−016 | C3 | −2.04805283e−014 | C3 | −1.60528229e−014 |
| C4 | 2.41381680e−020 | C4 | 4.41946133e−018 | C4 | 3.86881987e−018 |
| C5 | −3.53116720e−023 | C5 | −7.73696956e−022 | C5 | −5.92286133e−022 |

-continued

|  |  |  |  |  |  |
|---|---|---|---|---|---|
| C6 | 1.00285257e−026 | C6 | 5.61040821e−026 | C6 | −8.49115295e−027 |
| C7 | −1.43816000e−030 | C7 | −1.94057822e−031 | C7 | 1.37474277e−029 |

| SURFACE NO. 15 | | SURFACE NO. 18 | | SURFACE NO. 27 | |
|---|---|---|---|---|---|
| K | 0.0000 | K | 0.0000 | K | 0.0000 |
| C1 | 1.35596315e−007 | C1 | 6.95701413e−009 | C1 | 2.24525214e−008 |
| C2 | −2.17108845e−011 | C2 | −5.35684131e−013 | C2 | −2.28054131e−013 |
| C3 | 1.10173478e−015 | C3 | −3.79501980e−018 | C3 | −2.89309559e−017 |
| C4 | 5.71322716e−020 | C4 | −3.23719916e−022 | C4 | 3.37316727e−021 |
| C5 | −2.18850275e−023 | C5 | 2.35866841e−026 | C5 | −3.33307440e−025 |
| C6 | 2.43291639e−027 | C6 | 5.05141936e−031 | C6 | 1.85894962e−029 |
| C7 | −1.08759646e−031 | C7 | −4.96033470e−035 | C7 | −3.99953115e−034 |

| SURFACE NO. 33 | | SURFACE NO. 45 | | SURFACE NO. 50 | |
|---|---|---|---|---|---|
| K | 0.0000 | K | −0.0114 | K | 0.0000 |
| C1 | −2.49252058e−008 | C1 | 3.23760736e−010 | C1 | 1.35832451e−010 |
| C2 | −1.22122561e−011 | C2 | −5.68267268e−014 | C2 | −2.31285858e−014 |
| C3 | −5.59522075e−016 | C3 | −9.97094762e−019 | C3 | −3.70634585e−019 |
| C4 | −7.71755056e−020 | C4 | 1.41644139e−023 | C4 | 1.51653490e−022 |
| C5 | 5.15952342e−024 | C5 | 2.51891961e−027 | C5 | −5.78380400e−027 |
| C6 | −3.42583935e−028 | C6 | −1.67433921e−031 | C6 | 3.18449388e−031 |
| C7 | −1.14822731e−031 | C7 | 8.82789504e−036 | C7 | −1.23237976e−035 |

| SURFACE NO. 51 | | SURFACE NO. 58 | |
|---|---|---|---|
| K | 0.0000 | K | 0.0000 |
| C1 | −2.57897816e−010 | C1 | 3.81430115e−008 |
| C2 | 6.04192858e−014 | C2 | 1.17273705e−012 |
| C3 | 4.22250731e−018 | C3 | −4.86017937e−016 |
| C4 | −2.38756301e−023 | C4 | 7.29496704e−020 |
| C5 | −6.77890210e−027 | C5 | −8.78403273e−024 |
| C6 | 1.05133445e−031 | C6 | 7.31555552e−028 |
| C7 | −1.84957630e−036 | C7 | −2.78651979e−032 |

TABLE 7

| SURFACE | RADII | THICKNESSES | MATERIAL | REFR. INDEX AT 157.63 nm | ½ FREE DIAMETER | LENS |
|---|---|---|---|---|---|---|
| 0 | 0.000000000 | 27.171000000 | N2V157 | 1.00031429 | 46.200 | |
| 1 | 0.000000000 | 0.000016882 | N2V157 | 1.00031429 | 52.483 | |
| 2 | 1100.049969943AS | 13.835460517 | CAF2V157 | 1.55929034 | 53.033 | L701 |
| 3 | −233.539657189 | 10.675240307 | N2V157 | 1.00031429 | 53.534 | |
| 4 | −160.949399690 | 6.811295343 | CAF2V157 | 1.55929034 | 53.674 | L702 |
| 5 | −128.254251442 | 12.843572407 | N2V157 | 1.00031429 | 54.221 | |
| 6 | −288.287586108 | 12.129185515 | CAF2V157 | 1.55929034 | 53.355 | L703 |
| 7 | −151.697146334 | 15.111929473 | N2V157 | 1.00031429 | 53.645 | |
| 8 | −73.535662368 | 8.406531732 | CAF2V157 | 1.55929034 | 53.333 | L704 |
| 9 | −68.884753499AS | 3.691428280 | N2V157 | 1.00031429 | 54.952 | |
| 10 | −87.410675872AS | 5.073239609 | CAF2V157 | 1.55929034 | 52.419 | L705 |
| 11 | −163.383192938 | 4.364422126 | N2V157 | 1.00031429 | 53.327 | |
| 12 | −130.774825158 | 5.213204736 | CAF2V157 | 1.55929034 | 53.205 | L706 |
| 13 | 157.646556769 | 32.604386473 | N2V157 | 1.00031429 | 56.407 | |
| 14 | −93.798275929 | 5.000000000 | CAF2V157 | 1.55929034 | 57.566 | L707 |
| 15 | 3368.901715215AS | 19.800420879 | N2V157 | 1.00031429 | 73.098 | |
| 16 | −454.955938310 | 28.589092202 | CAF2V157 | 1.55929034 | 86.378 | L708 |
| 17 | −145.377556116 | 1.198146349 | N2V157 | 1.00031429 | 90.432 | |
| 18 | −3181.938740937AS | 55.253140410 | CAF2V157 | 1.55929034 | 113.328 | L709 |
| 19 | −180.727077136 | 2.634998921 | N2V157 | 1.00031429 | 118.959 | |
| 20 | −417.348137567 | 14.876175782 | CAF2V157 | 1.55929034 | 125.828 | L710 |
| 21 | −280.965238275 | 5.601765271 | N2V157 | 1.00031429 | 126.912 | |
| 22 | 613.501207577 | 24.948281153 | CAF2V157 | 1.55929034 | 134.461 | L711 |
| 23 | −4575.596777639 | 19.096198360 | N2V157 | 1.00031429 | 134.559 | |
| 24 | −5577.600844823 | 44.584300088 | CAF2V157 | 1.55929034 | 134.610 | L712 |
| 25 | −286.639122553 | 6.672038356 | N2V157 | 1.00031429 | 134.739 | |
| 26 | 140.838600122 | 52.023094126 | CAF2V157 | 1.55929034 | 106.139 | L713 |
| 27 | −3009.300734493AS | 0.750000000 | N2V157 | 1.00031429 | 103.867 | |
| 28 | 3005.251076354 | 15.763320827 | CAF2V157 | 1.55929034 | 101.364 | L714 |
| 29 | 139.656974557 | 17.052540516 | N2V157 | 1.00031429 | 79.293 | |
| 30 | 322.637994941 | 5.000000000 | CAF2V157 | 1.55929034 | 78.279 | L715 |
| 31 | 226.114107896 | 28.004102435 | N2V157 | 1.00031429 | 74.948 | |
| 32 | −214.030514154 | 5.000000000 | CAF2V157 | 1.55929034 | 74.063 | L716 |
| 33 | 101.747356704AS | 52.823748660 | N2V157 | 1.00031429 | 69.305 | |
| 34 | −108.078160969 | 5.134531894 | CAF2V157 | 1.55929034 | 69.902 | L717 |

TABLE 7-continued

| SURFACE | RADII | THICKNESSES | MATERIAL | REFR. INDEX AT 157.63 nm | ½ FREE DIAMETER | LENS |
|---|---|---|---|---|---|---|
| 35 | 1340.722540577 | 20.639215645 | N2V157 | 1.00031429 | 85.380 | |
| 36 | −403.094336268 | 27.036189958 | CAF2V157 | 1.55929034 | 92.392 | L718 |
| 37 | −198.324297859 | 1.185943036 | N2V157 | 1.00031429 | 99.441 | |
| 38 | −805.161246913 | 26.726916281 | CAF2V157 | 1.55929034 | 112.885 | L719 |
| 39 | −252.128101241 | 1.573121915 | N2V157 | 1.00031429 | 115.824 | |
| 40 | −1018.605718732 | 24.715209484 | CAF2V157 | 1.55929034 | 125.021 | L720 |
| 41 | −317.737201000 | 2.188933650 | N2V157 | 1.00031429 | 126.852 | |
| 42 | 911.036061215 | 39.030703244 | CAF2V157 | 1.55929034 | 136.017 | L721 |
| 43 | −397.514153561 | 8.829809473 | N2V157 | 1.00031429 | 136.445 | |
| 44 | 0.000000000 | −8.059959988 | N2V157 | 1.00031429 | 134.458 | |
| 45 | 283.117650723AS | 19.554556520 | CAF2V157 | 1.55929034 | 135.792 | L722 |
| 46 | 427.297926263 | 0.762082509 | N2V157 | 1.00031429 | 134.749 | |
| 47 | 343.801566914 | 45.281345111 | CAF2V157 | 1.55929034 | 134.302 | L723 |
| 48 | −674.258075736 | 30.848389732 | N2V157 | 1.00031429 | 133.402 | |
| 49 | −229.146438889 | 14.057444137 | CAF2V157 | 1.55929034 | 132.464 | L724 |
| 50 | −256.824756474AS | 16.154638811 | N2V157 | 1.00031429 | 132.944 | |
| 51 | −201.324104340AS | 19.005515015 | CAF2V157 | 1.55929034 | 131.210 | L725 |
| 52 | −206.399552372 | 2.818955115 | N2V157 | 1.00031429 | 133.337 | |
| 53 | 209.927060432 | 17.433578142 | CAF2V157 | 1.55929034 | 104.967 | L726 |
| 54 | 342.745670850 | 1.853424300 | N2V157 | 1.00031429 | 102.777 | |
| 55 | 109.865402846 | 24.686242054 | CAF2V157 | 1.55929034 | 87.784 | L727 |
| 56 | 167.188686248 | 1.175052020 | N2V157 | 1.00031429 | 84.827 | |
| 57 | 114.740922142 | 31.059347722 | CAF2V157 | 1.55929034 | 77.782 | L728 |
| 58 | 774.185357516AS | 6.852711919 | N2V157 | 1.00031429 | 73.137 | |
| 59 | 0.000000000 | 21.358665091 | BAF2V157 | 1.65671094 | 68.663 | L729 |
| 60 | 0.000000000 | 4.000000000 | N2V157 | 1.00031429 | 54.812 | |
| 61 | 0.000000000 | 21.341978310 | BAF2V157 | 1.65671094 | 46.497 | L730 |
| 62 | 0.000000000 | 10.153177731 | N2V157 | 1.00031429 | 32.657 | |
| 63 | 0.000000000 | 0.000003439 | | 1.00000000 | 11.552 | |

Formula for Aspherical Surfaces:

$$z = \frac{\frac{1}{R}h^2}{1+\sqrt{1-(1+K)\left(\frac{1}{R}\right)^2 h^2}} + \sum_{k=1} c_k h^{2k+2}$$

$z$: sagittal height    $h$: height    $R$: radius
$k$: conical constant    $c_k$: aspheric constants Aspherical Constants:

| | SURFACE NO. 2 | | SURFACE NO. 9 | | SURFACE NO. 10 |
|---|---|---|---|---|---|
| K | 0.0000 | K | −1.3248 | K | −1.1638 |
| C1 | 1.33150089e−007 | C1 | −4.04298090e−007 | C1 | 1.35760045e−007 |
| C2 | 1.13763804e−012 | C2 | 2.23884711e−011 | C2 | 1.74560325e−011 |
| C3 | 1.85005495e−016 | C3 | −2.13768099e−014 | C3 | −1.69784908e−014 |
| C4 | 1.89547123e−019 | C4 | 4.32945447e−018 | C4 | 3.92332145e−018 |
| C5 | −9.08656138e−023 | C5 | −7.67218945e−022 | C5 | −5.24149627e−022 |
| C6 | 2.18841677e−026 | C6 | 6.43225430e−026 | C6 | 1.80008094e−026 |
| C7 | −2.61083456e−030 | C7 | −5.59790324e−030 | C7 | 2.11070207e−031 |
| | SURFACE NO. 15 | | SURFACE NO. 18 | | SURFACE NO. 27 |
| K | 0.0000 | K | 0.0000 | K | 0.0000 |
| C1 | 1.33720710e−007 | C1 | 6.96593187e−009 | C1 | 2.26412640e−008 |
| C2 | −2.21640015e−011 | C2 | −4.82835354e−013 | C2 | −3.47526105e−013 |
| C3 | 1.24670453e−015 | C3 | −5.25586943e−018 | C3 | −3.48221622e−017 |
| C4 | 4.68847161e−020 | C4 | −2.62033681e−022 | C4 | 4.13095973e−021 |
| C5 | −2.27314972e−023 | C5 | 2.45848299e−026 | C5 | −3.11442082e−025 |
| C6 | 2.64456225e−027 | C6 | 1.39224945e−031 | C6 | 1.49413133e−029 |
| C7 | −1.33093602e−031 | C7 | −4.77826351e−035 | C7 | −3.33941866e−034 |
| | SURFACE NO. 33 | | SURFACE NO. 45 | | SURFACE NO. 50 |
| K | 0.0000 | K | 0.0487 | K | 0.0000 |
| C1 | −3.12818340e−008 | C1 | 8.27632088e−010 | C1 | 3.00931833e−010 |
| C2 | −1.18120980e−011 | C2 | −3.11431326e−014 | C2 | −2.08657685e−014 |
| C3 | −1.57343342e−016 | C3 | −9.63321269e−020 | C3 | 2.09222892e−020 |

-continued

| | | | | | |
|---|---|---|---|---|---|
| C4 | −2.85090644e−020 | C4 | 2.68685704e−024 | C4 | 1.34320349e−022 |
| C5 | −1.86083655e−024 | C5 | 1.77884350e−027 | C5 | −9.00430590e−027 |
| C6 | 2.75973692e−028 | C6 | −4.64279136e−032 | C6 | 2.84671618e−031 |
| C7 | −5.35892988e−032 | C7 | 2.28573552e−036 | C7 | −7.19510437e−036 |

| SURFACE NO. 51 | | SURFACE NO. 58 | |
|---|---|---|---|
| K | 0.0000 | K | 0.0000 |
| C1 | −3.98465484e−010 | C1 | 4.37724949e−008 |
| C2 | 5.51545340e−014 | C2 | 1.43469905e−012 |
| C3 | 3.21278977e−018 | C3 | −4.92932980e−016 |
| C4 | −1.77115729e−023 | C4 | 5.42353817e−020 |
| C5 | −5.93690297e−027 | C5 | −3.34429725e−024 |
| C6 | 9.63915129e−032 | C6 | 7.19285978e−029 |
| C7 | −1.69407739e−036 | C7 | 2.37322857e−033 |

TABLE 10

| SURFACE | RADII | THICKNESSES | MATERIAL | REFR. INDEX AT 157.63 nm | ½ FREE DIAMETER | LENS |
|---|---|---|---|---|---|---|
| 0 | 0.000000000 | 38.000000000 | | 1.00000000 | 53.151 | |
| 1 | 0.000000000 | 0.000000000 | | 1.00000000 | 61.364 | |
| 2 | 0.000000000 | 10.000000000 | CAF2HL | 1.55840983 | 61.364 | PE1 |
| 3 | 0.000000000 | 1.300000002 | | 1.00000000 | 62.732 | |
| 4 | 231.856805366 | 18.451814820 | CAF2HL | 1.55840983 | 65.024 | L801 |
| 5 | −67509.737986018 | 50.437190129 | | 1.00000000 | 65.268 | |
| 6 | 0.000000000 | 48.000000000 | CAF2HL | 1.55840983 | 67.346 | P1 |
| 7 | 0.000000000 | 0.000000000 | CAF2HL | 1.55840983 | 68.613 | P1 |
| 8 | 0.000000000 | 57.000000000 | CAF2HL | 1.55840983 | 68.613 | P1 |
| 9 | 0.000000000 | 100.905000471 | | 1.00000000 | 70.119 | |
| 10 | −313.089957435 | 10.000000000 | CAF2HL | 1.55840983 | 73.909 | L802 |
| 11 | −1163.721587893AS | 24.741906635 | | 1.00000000 | 75.819 | |
| 12 | 0.000000000 | 10.000000000 | CAF2HL | 1.55840983 | 79.952 | PE2 |
| 13 | 0.000000000 | 107.838657624 | | 1.00000000 | 80.940 | |
| 14 | −230.899575687 | 15.000000000 | CAF2HL | 1.55840983 | 94.528 | L803 |
| 15 | −539.422130350 | 32.081825253 | | 1.00000000 | 101.113 | |
| 16 | −196.716565694 | 15.000000000 | CAF2HL | 1.55840983 | 104.520 | L804 |
| 17 | −562.409459022AS | 0.000000000 | | 1.00000000 | 117.228 | |
| 18 | 0.000000000 | 46.300616489 | | 1.00000000 | 124.128 | |
| 19 | 0.000000000 | 0.000000000 | | −1.00000000 | 156.068 | REFL |
| 20 | 247.087595697 | 46.300616489 | | 1.00000000 | 129.897 | REFL |
| 21 | 0.000000000 | 0.000000000 | | 1.00000000 | 124.128 | |
| 22 | 562.409459022AS | 15.000000000 | CAF2HL | 1.55840983 | 117.300 | L804 |
| 23 | 196.716565694 | 32.081825253 | | 1.00000000 | 104.670 | |
| 24 | 539.422130350 | 15.000000000 | CAF2HL | 1.55840983 | 101.344 | L803 |
| 25 | 230.899575687 | 107.838657624 | | 1.00000000 | 94.823 | |
| 26 | 0.000000000 | 10.000000000 | CAF2HL | 1.55840983 | 81.789 | PE2 |
| 27 | 0.000000000 | 24.741906635 | | 1.00000000 | 80.839 | |
| 28 | 1163.721587893AS | 10.000000000 | CAF2HL | 1.55840983 | 76.861 | L802 |
| 29 | 313.089957435 | 100.905000471 | | 1.00000000 | 74.991 | |
| 30 | 0.000000000 | 105.000000000 | CAF2HL | 1.55840983 | 71.949 | P1 + P2 |
| 31 | 0.000000000 | 36.835344000 | | 1.00000000 | 69.716 | |
| 32 | 0.000000000 | 0.000000000 | | 1.00000000 | 68.495 | |
| 33 | 0.000000000 | 50.000000000 | | 1.00000000 | 68.495 | |
| 34 | 213.488486974 | 16.533569876 | CAF2HL | 1.55840983 | 66.486 | L805 |
| 35 | 587.420501402 | 25.000000008 | | 1.00000000 | 65.178 | |
| 36 | 0.000000000 | 53.534353960 | | 1.00000000 | 61.944 | |
| 37 | 721.619844096AS | 19.668137773 | CAF2HL | 1.55840983 | 68.895 | L806 |
| 38 | 439.459785709 | 92.812246323 | | 1.00000000 | 71.582 | |
| 39 | 466.205048699 | 30.401957151 | CAF2HL | 1.55840983 | 99.911 | L807 |
| 40 | −643.543871149AS | 1.300000004 | | 1.00000000 | 101.061 | |
| 41 | 353.787925634 | 37.860558838 | CAF2HL | 1.55840983 | 102.798 | L808 |
| 42 | −496.630877032 | 103.286912892 | | 1.00000000 | 102.044 | |
| 43 | −330.182777990 | 12.500000000 | CAF2HL | 1.55840983 | 78.570 | L809 |
| 44 | 307.592249925AS | 139.746687714 | | 1.00000000 | 76.966 | |
| 45 | 167.227205765 | 15.000000000 | CAF2HL | 1.55840983 | 90.214 | L810 |
| 46 | 129.347785505 | 38.119964661 | | 1.00000000 | 86.513 | |
| 47 | 348.724479670 | 33.786518873 | CAF2HL | 1.55840983 | 90.897 | L811 |
| 48 | −322.472540992 | 1.308803146 | | 1.00000000 | 91.396 | |
| 49 | 0.000000000 | 10.000000000 | CAF2HL | 1.55840983 | 90.322 | PE3 |
| 50 | 0.000000000 | 1.300000001 | | 1.00000000 | 89.848 | |
| 51 | 229.767680473AS | 15.000000000 | CAF2HL | 1.55840983 | 88.591 | L812 |
| 52 | 130.158437409 | 37.918545597 | | 1.00000000 | 83.578 | |
| 53 | 182.557769223 | 38.781957950 | CAF2HL | 1.55840983 | 91.097 | L813 |
| 54 | −1723.770535736 | 2.298748296 | | 1.00000000 | 91.468 | |

TABLE 10-continued

| SURFACE | RADII | THICKNESSES | MATERIAL | REFR. INDEX AT 157.63 nm | ½ FREE DIAMETER | LENS |
|---|---|---|---|---|---|---|
| 55 | 172.070308994AS | 20.000000000 | CAF2HL | 1.55840983 | 92.034 | L814 |
| 56 | 137.116503243 | 26.094678574 |  | 1.00000000 | 87.328 |  |
| 57 | 267.312915741 | 46.319407231 | CAF2HL | 1.55840983 | 89.247 | L815 |
| 58 | −218.724324573 | 9.877811439 |  | 1.00000000 | 89.123 |  |
| 59 | 94.463410833 | 35.776202355 | CAF2HL | 1.55840983 | 71.060 | L816 |
| 60 | 221.924345592 | 2.207032267 |  | 1.00000000 | 63.953 |  |
| 61 | 216.844481669 | 23.001210787 | CAF2HL | 1.55840983 | 62.520 | L817 |
| 62 | 685.044556108 | 2.652159904 |  | 1.00000000 | 53.800 |  |
| 63 | 148.223416916AS | 14.400000000 | CAF2HL | 1.55840983 | 46.812 | L818 |
| 64 | 321.611439620 | 2.000000000 |  | 1.00000000 | 40.243 |  |
| 65 | 349.600819610 | 10.800000000 | CAF2HL | 1.55840983 | 38.412 | L819 |
| 66 | −1602.590366624 | 1.300000000 |  | 1.00000000 | 33.175 |  |
| 67 | 0.000000000 | 7.200000000 | CAF2HL | 1.55840983 | 30.577 | L820 |
| 68 | 0.000000000 | 8.000000000 |  | 1.00000000 | 25.931 |  |
| 69 | 0.000000000 | 0.000000000 |  | 1.00000000 | 13.288 |  |

Formula for Aspherical Surfaces:

$$z = \frac{\frac{1}{R}h^2}{1 + \sqrt{1 - (1+K)\left(\frac{1}{R}\right)^2 h^2}} + \sum_{k=1} C_k h^{2k+2}$$

$z$: sagittal height   $h$: height   $R$: radius
$k$: conical constant   $c_k$: aspheric constants Aspherical Constants:

| SURFACE NO. 11 | | SURFACE NO. 17 | | SURFACE NO. 22 | |
|---|---|---|---|---|---|
| K | 0.0000 | K | 0.0000 | K | 0.0000 |
| C1 | 1.89276799e−008 | C1 | −9.87667098e−009 | C1 | 9.87667098e−009 |
| C2 | −2.13543901e−013 | C2 | 1.55529229e−013 | C2 | −1.55529229e−013 |
| C3 | −1.11902161e−017 | C3 | −3.40988793e−019 | C3 | 3.40988793e−019 |
| C4 | −6.59518395e−022 | C4 | 7.86247628e−023 | C4 | −7.86247628e−023 |
| C5 | −1.30641213e−025 | C5 | 4.44084385e−027 | C5 | −4.44084385e−027 |

| SURFACE NO. 28 | | SURFACE NO. 37 | | SURFACE NO. 40 | |
|---|---|---|---|---|---|
| K | 0.0000 | K | 0.0000 | K | 0.0000 |
| C1 | −1.89276799e−008 | C1 | −2.93715143e−008 | C1 | 2.54066895e−009 |
| C2 | 2.13543901e−013 | C2 | −2.77826255e−013 | C2 | 1.03623324e−013 |
| C3 | 1.11902161e−017 | C3 | 1.23346186e−018 | C3 | 3.44744026e−018 |
| C4 | 6.59518395e−022 | C4 | 1.23771524e−022 | C4 | 1.79842868e−023 |
| C5 | 1.30641213e−025 | C5 | −6.60110415e−027 | C5 | −3.76706748e−028 |

| SURFACE NO. 44 | | SURFACE NO. 51 | | SURFACE NO. 55 | |
|---|---|---|---|---|---|
| K | 0.0000 | K | 0.0000 | K | 0.0000 |
| C1 | 2.02333456e−008 | C1 | −3.50173472e−008 | C1 | −3.47775090e−008 |
| C2 | −1.66963894e−013 | C2 | −8.25470279e−013 | C2 | 6.64588433e−013 |
| C3 | −2.27086237e−017 | C3 | 7.73468257e−017 | C3 | 4.15885969e−017 |
| C4 | −9.37730881e−022 | C4 | 3.00183277e−021 | C4 | −4.05856715e−021 |
| C5 | 9.33708378e−027 | C5 | 4.58314788e−025 | C5 | −2.48686531e−025 |

| SURFACE NO. 63 | |
|---|---|
| K | 0.0000 |
| C1 | −1.25682736e−007 |
| C2 | −2.94013947e−011 |
| C3 | −9.23361808e−016 |
| C4 | −6.75007296e−019 |
| C5 | 1.59347903e−022 |

What is claimed is:

1. A numerical optimizing method for determining optical data of an objective, wherein said optical data are determined so as to reduce harmful effects caused by intrinsic birefringence in lenses of the objective which comprise a fluoride crystal material of cubic crystal structure, said method comprising:

selecting an optimizing function which is to be minimized by the numerical optimizing method, wherein said optimizing function takes into account at least one birefringence-related image aberration which is determined from a calculation for a light ray passing through said fluoride crystal lenses, and wherein to the extent that said birefringence-related image aberration is a function of parameters of the light ray, said birefringence-related image aberration depends only on geometric parameters of the light ray; and minimizing said optimizing function by varying said optical data.

2. The method of claim 1, wherein the light ray is an outer aperture ray which in each of the fluoride crystal lenses has a respective ray path length $OP_L$ and a respective aperture angle $\theta_L$, and wherein the birefringence-related image aberration depends on the respective ray path lengths $OP_L$ and the respective aperture angles $\theta_L$ in the fluoride crystal lenses.

3. The method of claim 1, wherein the light ray is an outer aperture ray which in each of the fluoride crystal lenses has a respective azimuth angle $\alpha_L$, and wherein the birefringence-related image aberration depends on the respective azimuth angles $\alpha_L$ in the fluoride crystal lenses.

4. The method of claim 1, wherein the birefringence-related image aberration depends on respective material factors which are characteristic for the fluoride crystal material in each of the fluoride crystal lenses.

5. The method of claim 1, wherein the birefringence-related image aberration depends on respective orientation factors which are characteristic for a crystallographic orientation of the fluoride crystal material in each of the fluoride crystal lenses.

6. The method of claim 2, wherein the birefringence-related image aberration depends on respective ray factors $SP_L$ of each of the fluoride crystal lenses, wherein the ray factor $SP_L$ of a fluoride crystal lens is defined as $SP_L = OP_L \cdot \sin^2 \theta_L \cdot (719 \cos^2 \theta_L - 1)$.

7. The method of claim 6, wherein the birefringence-related image aberration depends on respective birefringence factors $BF_L$ of each of the fluoride crystal lenses, wherein the birefringence factor $BF_L = MA_L \cdot DI_L \cdot SP_L$ is defined as the product of a material factor $MA_L$, an orientation factor $DI_L$ and the ray factor $SP_L$, the material factor $MA_L$ for a fluoride crystal lens indicates the intrinsic birefringence of the lens material for a ray that propagates in the crystallographic (110)-direction, the fluoride crystal lenses have lens axes, and for a fluoride crystal lens whose lens axis is oriented in the crystallographic (100)-direction, the orientation factor $DI_L$ equals $-\frac{1}{2}$, for a fluoride crystal lens whose lens axis runs in the crystallographic (111)-direction, $DI_L$ equals $+\frac{1}{3}$, and for a fluoride crystal lens whose lens axis is oriented in the crystallographic (110)-direction, $DI_L$ equals $+\frac{1}{8}$.

8. The method of claim 7, wherein said at least one birefringence-related image aberration comprises an optical retardation $OR_{LG}$ of a group of fluoride crystal lenses, and wherein the optical retardation $$OR_{LG} = \sum_{L \text{ in } LG} BF_L$$

is defined as the sum of the birefringence factors $BF_L$ of the fluoride crystal lenses of the group.

9. The method of claim 7, wherein the birefringence-related image aberration comprises an optical retardation asymmetry $ORAS_{LG}$ of a group of fluoride crystal lenses, and wherein $$ORAS_{LG} = \left| \sum_{L \text{ in } LG} (DS_L \cdot AP_L \cdot BF_L) \right|$$

is defined as the absolute amount of the sum of the respective products of a complex rotary position factor $DS_L$ with an azimuth factor $AP_L$ and the birefringence factor $BF_L$ for each of the fluoride crystal lenses of the group, the angular position factor $DS_L = \exp(i \cdot SF_{DI\_L} \cdot \gamma_L)$ is defined as a phase factor which depends on a symmetry factor $SF_{DI\_L}$ and on an angle of rotation $\gamma_L$, for fluoride crystal lenses whose lens axis is oriented in the crystallographic (100)-direction, the symmetry factor $SF_{DI\_L}$ equals 4 and the azimuth factor $AP_L$ equals +1, for fluoride crystal lenses whose lens axis is oriented in the crystallographic (111)-direction, the symmetry factor $SF_{DI\_L}$ equals 3 and the azimuth factor $AP_L$ depends on a respective azimuth angle $\alpha_L$ of an outer aperture ray in the respective fluoride crystal lens, where $AP_L = +1$ for $0° \leq \alpha_L < 180°$, and $AP_L = -1$ for $180° \leq \alpha_L < 360°$, for fluoride crystal lenses whose lens axis is oriented in the crystallographic (110)-direction, the symmetry factor $SF_{DI\_L}$ equals 2 and the azimuth factor $AP_L$ equals +1, and the angle of rotation $\gamma_L$ is defined as the angle between a reference direction of the fluoride crystal lens which has been rotated about the lens axis and a reference direction of the group.

10. The method of claim 9, wherein the fluoride crystal lenses of a group are at the same time assigned to homogeneous groups, the fluoride crystal lenses within each homogeneous group have the same material factor $MA_L$ and the same orientation factor $DI_L$, the respective products $MA_L \cdot DI_L$ for fluoride crystal lenses from at least two different homogeneous groups have opposite signs, and the optimizing function is minimized by taking into account an optical retardation $OR_{LG}$ of the group and the respective asymmetries $ORAS_{HG}$ of the homogeneous groups, wherein the optical retardation $$OR_{LG} = \sum_{L \text{ in } LG} BF_L$$

is defined as the sum of the birefringence factors $BF_L$ of the fluoride crystal lenses of the group.

11. An objective for a microlithography projection system with lenses of fluoride crystal material with a cubic crystal structure, wherein each fluoride crystal lens has a lens axis that is oriented approximately parallel to one of the crystallographic (100)-direction, the crystallographic (111)-direction, and the crystallographic (110)-direction, if the objective includes no polarization-selective optical element (PSE), all of the fluoride crystal lenses that are arranged between an object plane (OB) and an image plane (IM) form a group of fluoride crystal lenses, if the objective includes a polarization-selective optical element (PSE), all of the fluoride crystal lenses that are arranged between the polarization-selective optical element (PSE) and the image plane (IM) form a group of fluoride crystal lenses, an optical retardation $OR_{LG}$ of the group of fluoride crystal lenses is smaller than 5% of a working wavelength $\lambda_0$, the optical retardation $OR_{LG}$ of a group of fluoride crystal lenses is defined as the sum of birefringence factors $BF_L$ of the fluoride crystal lenses of the group, the birefringence factor $BF_L$ of a fluoride crystal lens is defined as $BF_L = MA_L \cdot DI_L \cdot SP_L$, the material factor $MA_L$ indicates the intrinsic birefringence of the lens material for a ray that propagates in the crystallographic (110)-direction, the orientation factor $DI_L$ has a value of $-\frac{1}{2}$ for a fluoride crystal lens whose lens axis is oriented in the crystallographic (100)-direction, $+\frac{1}{3}$ for a fluoride crystal lens whose lens axis is oriented in the crystallographic (111)-direction, and $+\frac{1}{8}$ for a fluoride crystal lens whose lens axis is oriented in the crystallographic (110)-direction, the ray factor $SP_L$ is defined as
$SP_L = OP_L \cdot \sin^2 \theta_L \cdot (7 \cdot \cos^2 \theta_L - 1)$ and depends on a respective aperture angle $\theta_L$ and ray path length $OP_L$ of an outer aperture ray in each of the fluoride crystal lenses.

12. The objective of claim 11, wherein said optical retardation $OR_{LG}$ of the group of fluoride crystal lenses is smaller than 2% of the working wavelength $\lambda_0$.

13. The objective of claim 12, wherein said optical retardation $OR_{LG}$ of the group of fluoride crystal lenses is smaller than 1% of the working wavelength $\lambda_0$.

14. The objective of claim 11, wherein said optical retardation $OR_{LG}$ of the group of fluoride crystal lenses for an outer aperture ray with a relative ray aperture between 0.75 and 1.0 as well as for an outer aperture ray with a relative ray aperture between 0.5 and 0.75 is smaller than 10% of a working wavelength $\lambda_0$, said relative ray aperture being the ratio between a ray aperture and the numerical aperture in an image plane (IM).

15. The objective of claim 14, wherein said optical retardation $OR_{LG}$ of the group of fluoride crystal lenses for an outer aperture ray with a relative ray aperture between 0.75 and 1.0 as well as for an outer aperture ray with a relative ray aperture between 0.5 and 0.75 is smaller than 5% of a working wavelength $\lambda_0$.

16. An objective for a microlithography projection system with lenses of fluoride crystal material with a cubic crystal structure, wherein each fluoride crystal lens has a lens axis that is oriented approximately parallel to one of the crystallographic (100)-direction, the crystallographic (111)-direction, and the crystallographic (110)-direction, if the objective includes no polarization-selective optical element (PSE), all of the fluoride crystal lenses that are arranged between an object plane (OB) and an image plane (IM) form a group of fluoride crystal lenses, if the objective includes a polarization-selective optical element (PSE), all of the fluoride crystal lenses that are arranged between the polarization-selective optical element (PSE) and the image plane (IM) form a group of fluoride crystal lenses, an optical retardation asymmetry $ORAS_{LG}$ of the group of fluoride crystal lenses is smaller than 10% of a working wavelength $\lambda_0$, the optical retardation asymmetry $$ORAS_{LG} = \left| \sum_{L \text{ in } LG} (DS_L \cdot AP_L \cdot BF_L) \right|$$

is defined as the absolute amount of the sum of the respective products of a complex rotary position factor $DS_L$ with an azimuth factor $AP_L$ and the birefringence factor $BF_L$ for each of the fluoride crystal lenses of the group, the birefringence factor $BF_L$ of a fluoride crystal lens is defined as $BF_L = MA_L \cdot DI_L \cdot SP_L$, the material factor $MA_L$ indicates the intrinsic birefringence of the lens material for a ray that is oriented in the crystallographic (110)-direction, the orientation factor $DI_L$ has a value of $-\frac{1}{2}$ for a fluoride crystal lens whose lens axis is oriented in the crystallographic (100)-direction, $+\frac{1}{3}$ for a fluoride crystal lens whose lens axis is oriented in the crystallographic (111)-direction, and $+\frac{1}{8}$ for a fluoride crystal lens whose lens axis is oriented in the crystallographic (110)-direction, the ray factor $SP_L$ is defined as
$SP_L = OP_L \cdot \sin^2 \theta_L \cdot (7 \cdot \cos^2 \theta_L - 1)$ and depends on a respective aperture angle $\theta_L$ and ray path length $OP_L$ of an outer aperture ray in each of the fluoride crystal lenses, the angular position factor $DS_L = \exp(i \cdot SF_{DI\_L} \cdot \gamma_L)$ is defined as a phase factor which depends on a symmetry factor $SF_{DI\_L}$ and on an angle of rotation $\gamma_L$, for fluoride crystal lenses whose lens axis is oriented in the crystallographic (100)-direction, the symmetry factor $SF_{DI}\_L$ equals 4 and the azimuth factor $AP_L$ equals $+1$, for fluoride crystal lenses whose lens axis is oriented in the crystallographic (111)-direction, the symmetry factor $SF_{DI\_L}$ equals 3 and the azimuth factor $AP_L$ depends on a respective azimuth angle $\alpha_L$ of an outer aperture ray in the respective fluoride crystal lens, where $AP_L = +1$ for $0° \leq \alpha_L < 180°$, and $AP_L = -1$ for $180° \leq \alpha_L < 360°$, for fluoride crystal lenses whose lens axis is oriented in the crystallographic (110)-direction, the symmetry factor $SF_{DI\_L}$ equals 2 and the azimuth factor $AP_L$ equals $+1$, and the angle of rotation $\gamma_L$ is defined as the angle between a reference direction of the fluoride crystal lens which has been rotated about the lens axis and a reference direction of the group.

17. The objective of claim 16, wherein the optical retardation asymmetry $ORAS_{LG}$ of the group of fluoride crystal lenses is smaller than 5% of a working wavelength $\lambda_0$.

18. The objective of claim 16, wherein the absolute amount of the optical retardation asymmetry $ORAS_{LG}$ of the group of fluoride crystal lenses for an outer aperture ray with a relative ray aperture between 0.75 and 1.0 as well as for an outer aperture ray with a relative ray aperture between 0.5 and 0.75 is smaller than 15% of a working wavelength $\lambda_0$, said relative ray aperture being the ratio between a ray aperture and the numerical aperture in an image plane (IM).

19. The objective of claim 18, wherein the absolute amount of the optical retardation asymmetry $ORAS_{LG}$ of the group of fluoride crystal lenses for an outer aperture ray with a relative ray aperture between 0.75 and 1.0 as well as for an outer aperture ray with a relative ray aperture between 0.5 and 0.75 is smaller than 7% of a working wavelength $\lambda_0$.

* * * * *